United States Patent
Cauchy

(10) Patent No.: US 11,639,816 B2
(45) Date of Patent: *May 2, 2023

(54) HEATING AND COOLING TECHNOLOGIES INCLUDING TEMPERATURE REGULATING PAD WRAP AND TECHNOLOGIES WITH LIQUID SYSTEM

(71) Applicant: GENTHERM INCORPORATED, Northville, MI (US)

(72) Inventor: Charles J. Cauchy, Traverse City, MI (US)

(73) Assignee: GENTHERM INCORPORATED, Northville, MI (US)

( * ) Notice: Subject to any disclaimer, the term of this patent is extended or adjusted under 35 U.S.C. 154(b) by 766 days.

This patent is subject to a terminal disclaimer.

(21) Appl. No.: 16/495,792

(22) PCT Filed: Mar. 21, 2018

(86) PCT No.: PCT/US2018/023443
§ 371 (c)(1),
(2) Date: Sep. 19, 2019

(87) PCT Pub. No.: WO2018/175506
PCT Pub. Date: Sep. 27, 2018

(65) Prior Publication Data
US 2020/0025424 A1 Jan. 23, 2020
US 2021/0041147 A9 Feb. 11, 2021

Related U.S. Application Data

(63) Continuation-in-part of application No. 15/526,954, filed as application No. PCT/US2015/060955 on Nov. 16, 2015, now Pat. No. 11,033,058.
(Continued)

(51) Int. Cl.
F25B 21/02 (2006.01)
F25B 21/04 (2006.01)
(Continued)

(52) U.S. Cl.
CPC ........ *F25B 21/04* (2013.01); *A41D 13/0005* (2013.01); *A47C 7/74* (2013.01);
(Continued)

(58) Field of Classification Search
CPC ........ H01L 35/30; H01L 35/32; F25B 21/02; F25B 21/04
See application file for complete search history.

(56) References Cited

U.S. PATENT DOCUMENTS 1,839,156 A 12/1931 Lumpkin
2,235,620 A 3/1941 Nessell
(Continued)

FOREIGN PATENT DOCUMENTS

CA 979490 12/1975
CN 2079462 6/1991
(Continued)

OTHER PUBLICATIONS

JP-2003174203-A Translation.*
(Continued)

*Primary Examiner* — Brian M King
(74) *Attorney, Agent, or Firm* — Knobbe, Martens, Olson & Bear, LLP

(57) ABSTRACT

A heating and cooling device is disclosed comprising at least one integral low voltage heating and cooling source and an efficient flexible heat distribution means having a thermal conductivity of from 375 to 4000 W/mK for distributing the heat and cool across a surface. Further aspects include thermal interface compounds to provide full thermal contact as well as the use of a phase change material to provide a
(Continued)

long lasting heating and/or cooling effect without the use of external electrical input. Preferred applications include automotive and furniture seating heating and cooling, along with outdoor garments having distributed heating and cooling effects. Additional aspects include a thermal pad wrap and a thermally conductive liquid system for heat/cool distribution.

25 Claims, 26 Drawing Sheets

Related U.S. Application Data

(60) Provisional application No. 62/563,702, filed on Sep. 27, 2017, provisional application No. 62/473,966, provisional application No. 62/080,072, filed on Nov. 14, 2014.

(51) Int. Cl.
| | |
|---|---|
| *H01L 35/30* | (2006.01) |
| *B60N 2/56* | (2006.01) |
| *F04D 29/58* | (2006.01) |
| *A47C 7/74* | (2006.01) |
| *A41D 13/00* | (2006.01) |
| *H01L 35/28* | (2006.01) |
| *H01L 35/32* | (2006.01) |
| *B82Y 30/00* | (2011.01) |

(52) U.S. Cl.
CPC ....... *B60N 2/5692* (2013.01); *F04D 29/5826* (2013.01); *H01L 35/28* (2013.01); *H01L 35/30* (2013.01); *H01L 35/32* (2013.01); *B82Y 30/00* (2013.01); *F25B 2321/025* (2013.01)

(56) References Cited

U.S. PATENT DOCUMENTS

| | | |
|---|---|---|
| 2,362,259 A | 11/1944 | Findley |
| 2,363,168 A | 11/1944 | Findley |
| 2,461,432 A | 2/1949 | Mitchell |
| 2,462,984 A | 3/1949 | Maddison |
| 2,493,067 A | 1/1950 | Goldsmith |
| 2,512,559 A | 6/1950 | Williams |
| 2,519,241 A | 8/1950 | Findley |
| 2,782,834 A | 2/1957 | Vigo |
| 2,791,956 A | 5/1957 | Guest |
| 2,813,708 A | 11/1957 | Frey |
| 2,884,956 A | 5/1959 | Perlin |
| 2,931,286 A | 4/1960 | Fry, Sr. et al. |
| 2,959,017 A | 11/1960 | Gilman et al. |
| 2,976,700 A | 3/1961 | Jackson |
| 2,984,077 A | 5/1961 | Gaskill |
| 3,019,609 A | 2/1962 | Pietsch |
| 3,030,145 A | 4/1962 | Kottemann |
| 3,039,817 A | 6/1962 | Taylor |
| 3,077,079 A | 2/1963 | Pietsch |
| 3,085,405 A | 4/1963 | Frantti |
| 3,090,206 A | 5/1963 | Anders |
| 3,136,577 A | 6/1964 | Richard |
| 3,137,142 A | 6/1964 | Venema |
| 3,137,523 A | 6/1964 | Karner |
| 3,138,934 A | 6/1964 | Roane |
| 3,178,894 A | 4/1965 | Mole et al. |
| 3,186,240 A | 6/1965 | Daubert |
| 3,197,342 A | 7/1965 | Neild |
| 3,212,275 A | 10/1965 | Tillman |
| 3,240,628 A | 3/1966 | Sonntag, Jr. |
| 3,253,649 A | 5/1966 | Laing |
| 3,266,064 A | 8/1966 | Man |
| 3,282,267 A | 11/1966 | Eidus |
| 3,298,195 A | 1/1967 | Raskhodoff |
| 3,300,649 A | 1/1967 | Strawn |
| 3,325,312 A | 6/1967 | Sonntag, Jr. |
| 3,326,727 A | 6/1967 | Fritts |
| 3,351,498 A | 11/1967 | Shinn et al. |
| 3,366,164 A | 1/1968 | Newton |
| 3,392,535 A | 7/1968 | De Castelet |
| 3,486,177 A | 12/1969 | Marshack |
| 3,529,310 A | 9/1970 | Olmo |
| 3,550,523 A | 12/1970 | Segal |
| 3,599,437 A | 8/1971 | Panas |
| 3,615,870 A | 10/1971 | Crouthamel |
| 3,627,299 A | 12/1971 | Schwartze et al. |
| 3,632,451 A | 1/1972 | Abbott |
| 3,640,456 A | 2/1972 | Sturgis |
| 3,648,469 A | 3/1972 | Chapman |
| 3,681,797 A | 8/1972 | Messner |
| 3,703,141 A | 11/1972 | Pernoud |
| 3,767,470 A | 10/1973 | Hines |
| 3,786,230 A | 1/1974 | Brandenburg, Jr. |
| 3,818,522 A | 6/1974 | Schuster |
| 3,819,418 A | 6/1974 | Winkler et al. |
| 3,839,876 A | 10/1974 | Privas |
| 3,870,568 A | 3/1975 | Oesterhelt et al. |
| 3,876,860 A | 4/1975 | Nomura et al. |
| 3,894,213 A | 7/1975 | Agarwala |
| 3,899,054 A | 8/1975 | Huntress et al. |
| 3,902,923 A | 9/1975 | Evans et al. |
| 3,916,151 A | 10/1975 | Reix |
| 3,926,052 A | 12/1975 | Bechtel |
| 3,927,299 A | 12/1975 | Sturgis |
| 3,928,876 A | 12/1975 | Starr |
| 4,002,108 A | 1/1977 | Drori |
| 4,044,824 A | 8/1977 | Eskeli |
| 4,100,963 A | 7/1978 | Dillenbeck |
| 4,124,794 A | 11/1978 | Eder |
| 4,195,687 A | 4/1980 | Taziker |
| 4,223,205 A | 9/1980 | Sturgis |
| 4,224,565 A | 9/1980 | Sosniak et al. |
| 4,281,516 A | 8/1981 | Berthet et al. |
| 4,301,658 A | 11/1981 | Reed |
| 4,314,008 A | 2/1982 | Blake |
| 4,315,599 A | 2/1982 | Biancardi |
| 4,336,444 A | 6/1982 | Bice et al. |
| 4,338,944 A | 7/1982 | Arkans |
| 4,391,009 A | 7/1983 | Schild et al. |
| 4,413,857 A | 11/1983 | Hayashi |
| 4,423,308 A | 12/1983 | Callaway et al. |
| 4,437,702 A | 3/1984 | Agosta |
| 4,438,070 A | 3/1984 | Stephens et al. |
| 4,459,428 A | 7/1984 | Chou |
| 4,491,173 A | 1/1985 | Demand |
| 4,493,939 A | 1/1985 | Blaske et al. |
| 4,497,973 A | 2/1985 | Heath et al. |
| 4,506,510 A | 3/1985 | Tircot |
| 4,518,700 A | 5/1985 | Stephens |
| 4,518,847 A | 5/1985 | Horst, Sr. et al. |
| 4,549,134 A | 10/1985 | Weiss |
| 4,554,968 A | 11/1985 | Haas |
| 4,567,351 A | 1/1986 | Kitagawa et al. |
| 4,572,430 A | 2/1986 | Takagi et al. |
| 4,611,089 A | 9/1986 | Elsner et al. |
| 4,639,883 A | 1/1987 | Michaelis |
| 4,665,707 A | 5/1987 | Hamilton |
| 4,671,567 A | 6/1987 | Frobose |
| 4,677,416 A | 6/1987 | Nishimoto et al. |
| 4,685,727 A | 8/1987 | Cremer et al. |
| 4,686,724 A | 8/1987 | Bedford |
| 4,688,390 A | 8/1987 | Sawyer |
| 4,704,320 A | 11/1987 | Mizunoya et al. |
| 4,711,294 A | 12/1987 | Jacobs et al. |
| 4,712,832 A | 12/1987 | Antolini et al. |
| 4,777,802 A | 10/1988 | Feher |
| 4,782,664 A | 11/1988 | Sterna et al. |
| 4,791,274 A | 12/1988 | Horst |
| 4,793,651 A | 12/1988 | Inagaki et al. |
| 4,802,929 A | 2/1989 | Schock |
| 4,812,733 A | 3/1989 | Tobey |
| 4,823,554 A | 4/1989 | Trachtenberg et al. |
| 4,825,488 A | 5/1989 | Bedford |

(56) References Cited

U.S. PATENT DOCUMENTS

| | | |
|---|---|---|
| 4,828,627 A | 5/1989 | Connery |
| 4,847,933 A | 7/1989 | Bedford |
| 4,853,992 A | 8/1989 | Yu |
| 4,859,250 A | 8/1989 | Buist |
| 4,923,248 A | 5/1990 | Feher |
| 4,930,317 A | 6/1990 | Klein |
| 4,947,648 A | 8/1990 | Harwell et al. |
| 4,969,684 A | 11/1990 | Zarotti |
| 4,981,324 A | 1/1991 | Law |
| 4,988,847 A | 1/1991 | Argos et al. |
| 4,997,230 A | 3/1991 | Spitalnick |
| 5,002,336 A | 3/1991 | Feher |
| 5,012,325 A | 4/1991 | Mansuria et al. |
| 5,014,909 A | 5/1991 | Yasuo |
| 5,016,304 A | 5/1991 | Ryhiner |
| 5,022,462 A | 6/1991 | Flint et al. |
| 5,057,490 A | 10/1991 | Skertic |
| 5,070,937 A | 12/1991 | Mougin et al. |
| 5,077,709 A | 12/1991 | Feher |
| 5,088,790 A | 2/1992 | Wainwright et al. |
| 5,097,674 A | 3/1992 | Imaiida et al. |
| 5,102,189 A | 4/1992 | Saito et al. |
| 5,106,161 A | 4/1992 | Meiller |
| 5,111,025 A | 5/1992 | Barma et al. |
| 5,111,664 A | 5/1992 | Yang |
| 5,117,638 A | 6/1992 | Feher |
| 5,119,640 A | 6/1992 | Conrad |
| 5,125,238 A | 6/1992 | Ragan et al. |
| 5,148,977 A | 9/1992 | Hibino et al. |
| 5,166,777 A | 11/1992 | Kataoka |
| 5,187,349 A | 2/1993 | Curhan et al. |
| 5,188,286 A | 2/1993 | Pence, IV |
| 5,226,188 A | 7/1993 | Liou |
| 5,255,735 A | 10/1993 | Raghava et al. |
| 5,256,857 A | 10/1993 | Curhan et al. |
| 5,265,599 A | 11/1993 | Stephenson et al. |
| 5,278,936 A | 1/1994 | Shao |
| 5,279,128 A | 1/1994 | Tomatsu et al. |
| 5,335,381 A | 8/1994 | Chang |
| 5,367,728 A | 11/1994 | Chang |
| 5,372,402 A | 12/1994 | Kuo |
| 5,375,421 A | 12/1994 | Hsieh |
| 5,382,075 A | 1/1995 | Shih |
| 5,385,382 A | 1/1995 | Single, II et al. |
| 5,409,547 A | 4/1995 | Watanabe et al. |
| 5,413,166 A | 5/1995 | Kerner et al. |
| 5,416,935 A | 5/1995 | Nieh |
| 5,419,489 A | 5/1995 | Burd |
| 5,419,780 A | 5/1995 | Suski |
| 5,430,322 A | 7/1995 | Koyanagi et al. |
| 5,448,788 A | 9/1995 | Wu |
| 5,448,891 A | 9/1995 | Nakagiri et al. |
| 5,456,081 A | 10/1995 | Chrysler et al. |
| 5,473,783 A | 12/1995 | Allen |
| 5,493,742 A | 2/1996 | Klearman |
| 5,493,864 A | 2/1996 | Pomerene et al. |
| 5,497,632 A | 3/1996 | Robinson |
| 5,505,520 A | 4/1996 | Frusti et al. |
| 5,515,238 A | 5/1996 | Fritz et al. |
| 5,524,439 A | 6/1996 | Gallup et al. |
| 5,542,503 A | 8/1996 | Dunn et al. |
| 5,544,487 A | 8/1996 | Attey et al. |
| 5,544,488 A | 8/1996 | Reid |
| 5,555,732 A | 9/1996 | Whiticar |
| 5,561,981 A | 10/1996 | Quisenberry et al. |
| 5,576,512 A | 11/1996 | Doke |
| 5,584,084 A | 12/1996 | Klearman et al. |
| 5,584,183 A | 12/1996 | Wright et al. |
| 5,594,609 A | 1/1997 | Lin |
| 5,597,200 A | 1/1997 | Gregory et al. |
| 5,601,399 A | 2/1997 | Okpara et al. |
| 5,606,639 A | 2/1997 | Lehoe et al. |
| 5,613,729 A | 3/1997 | Summer, Jr. |
| 5,613,730 A | 3/1997 | Buie et al. |
| 5,623,828 A | 4/1997 | Harrington |
| 5,626,021 A | 5/1997 | Karunasiri et al. |
| 5,626,386 A | 5/1997 | Lush |
| 5,634,342 A | 6/1997 | Peeters et al. |
| 5,637,921 A | 6/1997 | Burward-Hoy |
| 5,640,728 A | 6/1997 | Graebe |
| 5,642,539 A | 7/1997 | Kuo |
| 5,645,314 A | 7/1997 | Liou |
| 5,650,904 A | 7/1997 | Gilley et al. |
| 5,653,741 A | 8/1997 | Grant |
| 5,660,310 A | 8/1997 | LeGrow |
| 5,667,622 A | 9/1997 | Hasegawa et al. |
| 5,675,852 A | 10/1997 | Watkins |
| 5,690,849 A | 11/1997 | DeVilbiss et al. |
| 5,692,952 A | 12/1997 | Chih-Hung |
| 5,704,213 A | 1/1998 | Smith et al. |
| 5,715,695 A | 2/1998 | Lord |
| 5,721,804 A | 2/1998 | Greene, III |
| 5,724,818 A | 3/1998 | Iwata et al. |
| 5,729,981 A | 3/1998 | Markus |
| 5,734,122 A | 3/1998 | Aspden |
| 5,761,908 A | 6/1998 | Oas et al. |
| 5,761,909 A | 6/1998 | Hughes et al. |
| 5,772,500 A | 6/1998 | Harvey et al. |
| 5,798,583 A | 8/1998 | Morita |
| 5,800,490 A | 9/1998 | Patz et al. |
| 5,802,855 A | 9/1998 | Yamaguchi et al. |
| 5,802,856 A | 9/1998 | Schaper et al. |
| 5,822,993 A | 10/1998 | Attey |
| 5,827,424 A | 10/1998 | Gillis et al. |
| 5,833,321 A | 11/1998 | Kim et al. |
| 5,850,741 A | 12/1998 | Feher |
| 5,865,031 A | 2/1999 | Itakura |
| 5,871,151 A | 2/1999 | Fiedrich |
| 5,884,485 A | 3/1999 | Yamaguchi et al. |
| 5,884,486 A | 3/1999 | Hughes et al. |
| 5,887,304 A | 3/1999 | Von der Heyde |
| 5,888,261 A | 3/1999 | Fortune |
| 5,895,964 A | 4/1999 | Nakayama |
| 5,902,014 A | 5/1999 | Dinkel et al. |
| 5,921,100 A | 7/1999 | Yoshinori et al. |
| 5,921,314 A | 7/1999 | Schuller et al. |
| 5,921,858 A | 7/1999 | Kawai et al. |
| 5,924,289 A | 7/1999 | Bishop, II |
| 5,924,766 A | 7/1999 | Esaki et al. |
| 5,924,767 A | 7/1999 | Pietryga |
| 5,927,599 A | 7/1999 | Kath |
| 5,927,817 A | 7/1999 | Ekman et al. |
| 5,934,748 A | 8/1999 | Faust et al. |
| 5,936,192 A | 8/1999 | Tauchi |
| 5,937,908 A | 8/1999 | Inoshiri et al. |
| 5,948,303 A | 9/1999 | Larson |
| 5,950,067 A | 9/1999 | Maegawa et al. |
| 5,952,728 A | 9/1999 | Imanishi et al. |
| 5,987,893 A | 11/1999 | Schultz-Harder et al. |
| 5,988,568 A | 11/1999 | Drews |
| 5,992,154 A | 11/1999 | Kawada et al. |
| 5,994,637 A | 11/1999 | Imanushi et al. |
| 5,995,711 A | 11/1999 | Fukuoka et al. |
| 6,000,225 A | 12/1999 | Ghoshal |
| 6,003,950 A | 12/1999 | Larsson |
| 6,006,524 A | 12/1999 | Park |
| 6,019,420 A | 2/2000 | Faust et al. |
| 6,038,865 A | 3/2000 | Watanabe et al. |
| 6,048,024 A | 4/2000 | Wallman |
| 6,049,655 A | 4/2000 | Vazirani |
| 6,052,853 A | 4/2000 | Schmid |
| 6,053,163 A | 4/2000 | Bass |
| 6,059,018 A | 5/2000 | Yoshinori et al. |
| 6,062,641 A | 5/2000 | Suzuki et al. |
| 6,072,924 A | 6/2000 | Sato et al. |
| 6,072,938 A | 6/2000 | Peterson et al. |
| 6,073,998 A | 6/2000 | Siarkowski et al. |
| 6,079,485 A | 6/2000 | Esaki et al. |
| 6,084,172 A | 7/2000 | Kishi et al. |
| 6,085,369 A | 7/2000 | Feher |
| 6,086,831 A | 7/2000 | Harness et al. |
| 6,087,638 A | 7/2000 | Silverbrook |
| 6,094,919 A | 8/2000 | Bhatia |
| 6,097,088 A | 8/2000 | Sakuragi |

(56) References Cited

U.S. PATENT DOCUMENTS

| | | |
|---|---|---|
| 6,100,463 A | 8/2000 | Ladd et al. |
| 6,101,815 A | 8/2000 | Van Oort et al. |
| 6,103,967 A | 8/2000 | Cauchy et al. |
| 6,105,373 A | 8/2000 | Watanabe et al. |
| 6,109,688 A | 8/2000 | Wurz et al. |
| 6,112,525 A | 9/2000 | Yoshida et al. |
| 6,112,531 A | 9/2000 | Yamaguchi |
| 6,116,029 A | 9/2000 | Krawec |
| 6,119,463 A | 9/2000 | Bell |
| 6,120,370 A | 9/2000 | Asou et al. |
| 6,127,619 A | 10/2000 | Xi et al. |
| 6,141,969 A | 11/2000 | Launchbury et al. |
| 6,145,925 A | 11/2000 | Eksin et al. |
| 6,158,224 A | 12/2000 | Hu et al. |
| 6,161,241 A | 12/2000 | Zysman |
| 6,161,388 A | 12/2000 | Ghoshal |
| 6,164,076 A | 12/2000 | Chu et al. |
| 6,164,719 A | 12/2000 | Rauh |
| 6,171,333 B1 | 1/2001 | Nelson et al. |
| 6,178,292 B1 | 1/2001 | Fukuoka et al. |
| 6,179,706 B1 | 1/2001 | Yoshinori et al. |
| 6,186,592 B1 | 2/2001 | Orizakis et al. |
| 6,189,966 B1 | 2/2001 | Faust et al. |
| 6,189,967 B1 | 2/2001 | Short |
| 6,196,627 B1 | 3/2001 | Faust et al. |
| 6,196,839 B1 | 3/2001 | Ross |
| 6,206,465 B1 | 3/2001 | Faust et al. |
| 6,213,198 B1 | 4/2001 | Shikata et al. |
| 6,222,243 B1 | 4/2001 | Kishi et al. |
| 6,223,539 B1 | 5/2001 | Bell |
| 6,233,959 B1 | 5/2001 | Kang et al. |
| 6,250,083 B1 | 6/2001 | Chou |
| 6,256,996 B1 | 7/2001 | Ghoshal |
| 6,262,357 B1 | 7/2001 | Johnson et al. |
| 6,263,530 B1 | 7/2001 | Feher |
| 6,266,962 B1 | 7/2001 | Ghoshal |
| 6,282,907 B1 | 9/2001 | Ghoshal |
| 6,289,982 B1 | 9/2001 | Naji |
| 6,291,803 B1 | 9/2001 | Fourrey |
| 6,306,673 B1 | 10/2001 | Imanishi et al. |
| 6,326,610 B1 | 12/2001 | Muramatsu et al. |
| 6,336,237 B1 | 1/2002 | Schmid |
| 6,338,251 B1 | 1/2002 | Ghoshal |
| 6,341,395 B1 | 1/2002 | Chao |
| 6,345,507 B1 | 2/2002 | Gillen |
| 6,347,521 B1 | 2/2002 | Kadotani et al. |
| 6,378,311 B1 | 4/2002 | McCordic |
| 6,385,976 B1 | 5/2002 | Yamamura et al. |
| 6,391,676 B1 | 5/2002 | Tsuzaki et al. |
| 6,393,842 B2 | 5/2002 | Kim et al. |
| 6,400,013 B1 | 6/2002 | Tsuzaki et al. |
| 6,402,470 B1 | 6/2002 | Kvasnak et al. |
| 6,410,971 B1 | 6/2002 | Otey |
| 6,425,527 B1 | 7/2002 | Smole |
| 6,427,449 B1 | 8/2002 | Logan et al. |
| 6,434,328 B2 | 8/2002 | Rutherford |
| 6,438,964 B1 | 8/2002 | Giblin |
| 6,444,893 B1 | 9/2002 | Onoue et al. |
| 6,452,740 B1 | 9/2002 | Ghoshal |
| 6,470,696 B1 | 10/2002 | Palfy et al. |
| 6,474,072 B2 | 11/2002 | Needham |
| 6,474,073 B1 | 11/2002 | Uetsuji et al. |
| 6,481,801 B1 | 11/2002 | Schmale |
| 6,487,739 B1 | 12/2002 | Harker |
| 6,489,551 B2 | 12/2002 | Chu et al. |
| 6,490,879 B1 | 12/2002 | Lloyd et al. |
| 6,492,585 B1 | 12/2002 | Zamboni et al. |
| 6,493,888 B1 | 12/2002 | Salvatini et al. |
| 6,493,889 B2 | 12/2002 | Kocurek |
| 6,509,704 B1 | 1/2003 | Brown |
| 6,511,125 B1 | 1/2003 | Gendron |
| 6,519,949 B1 | 2/2003 | Wernlund et al. |
| 6,539,725 B2 | 4/2003 | Bell |
| 6,541,737 B1 | 4/2003 | Eksin et al. |
| 6,541,743 B2 | 4/2003 | Chen |
| 6,546,576 B1 | 4/2003 | Lin |
| 6,548,894 B2 | 4/2003 | Chu et al. |
| 6,552,256 B2 | 4/2003 | Shakouri et al. |
| 6,557,353 B1 | 5/2003 | Fusco et al. |
| RE38,128 E | 6/2003 | Gallup et al. |
| 6,571,564 B2 | 6/2003 | Upadhye et al. |
| 6,573,596 B2 | 6/2003 | Saika |
| 6,574,967 B1 | 6/2003 | Park et al. |
| 6,578,986 B2 | 6/2003 | Swaris et al. |
| 6,580,025 B2 | 6/2003 | Guy |
| 6,581,225 B1 | 6/2003 | Imai |
| 6,583,638 B2 | 6/2003 | Costello et al. |
| 6,598,251 B2 | 7/2003 | Habboub et al. |
| 6,598,405 B2 | 7/2003 | Bell |
| 6,604,576 B2 | 8/2003 | Noda et al. |
| 6,604,785 B2 | 8/2003 | Bargheer et al. |
| 6,605,955 B1 | 8/2003 | Costello et al. |
| 6,606,754 B1 | 8/2003 | Flick |
| 6,606,866 B2 | 8/2003 | Bell |
| 6,619,044 B2 | 9/2003 | Batchelor et al. |
| 6,619,736 B2 | 9/2003 | Stowe et al. |
| 6,619,737 B2 | 9/2003 | Kunkel et al. |
| 6,625,990 B2 | 9/2003 | Bell |
| 6,626,488 B2 | 9/2003 | Pfahler |
| 6,629,724 B2 | 10/2003 | Ekern et al. |
| 6,637,210 B2 | 10/2003 | Bell |
| 6,644,735 B2 | 11/2003 | Bargheer et al. |
| 6,672,076 B2 | 1/2004 | Bell |
| 6,676,207 B2 | 1/2004 | Rauh et al. |
| 6,684,437 B2 | 2/2004 | Koenig |
| 6,686,532 B1 | 2/2004 | Macris |
| 6,687,937 B2 | 2/2004 | Harker |
| 6,695,402 B2 | 2/2004 | Sloan, Jr. |
| 6,700,052 B2 | 3/2004 | Bell |
| 6,705,089 B2 | 3/2004 | Chu et al. |
| 6,708,352 B2 | 3/2004 | Salvatini et al. |
| 6,711,767 B2 | 3/2004 | Klamm |
| 6,711,904 B1 | 3/2004 | Law et al. |
| 6,719,039 B2 | 4/2004 | Calaman et al. |
| 6,725,669 B2 | 4/2004 | Melaragni |
| 6,727,422 B2 | 4/2004 | Macris |
| 6,730,115 B1 | 5/2004 | Heaton |
| 6,739,138 B2 | 5/2004 | Saunders et al. |
| 6,739,655 B2 | 5/2004 | Schwochert et al. |
| 6,743,972 B2 | 6/2004 | Macris |
| 6,761,399 B2 | 7/2004 | Bargheer et al. |
| 6,764,502 B2 | 7/2004 | Bieberich |
| 6,767,766 B2 | 7/2004 | Chu et al. |
| 6,772,829 B2 | 8/2004 | Lebrun |
| 6,774,346 B2 | 8/2004 | Clothier |
| 6,786,541 B2 | 9/2004 | Haupt et al. |
| 6,786,545 B2 | 9/2004 | Bargheer et al. |
| 6,790,481 B2 | 9/2004 | Bishop et al. |
| 6,793,016 B2 | 9/2004 | Aoki et al. |
| 6,804,966 B1 | 10/2004 | Chu et al. |
| 6,808,230 B2 | 10/2004 | Buss et al. |
| 6,812,395 B2 | 11/2004 | Bell |
| 6,815,814 B2 | 11/2004 | Chu et al. |
| 6,817,191 B2 | 11/2004 | Watanabe |
| 6,817,197 B1 | 11/2004 | Padfield |
| 6,817,675 B2 | 11/2004 | Buss et al. |
| 6,818,817 B2 | 11/2004 | Macris |
| 6,823,678 B1 | 11/2004 | Li |
| 6,828,528 B2 | 12/2004 | Stowe et al. |
| 6,832,732 B2 | 12/2004 | Burkett et al. |
| 6,834,509 B2 | 12/2004 | Palfy et al. |
| 6,840,305 B2 | 1/2005 | Zheng et al. |
| 6,840,576 B2 | 1/2005 | Ekern et al. |
| 6,841,957 B2 | 1/2005 | Brown |
| 6,845,622 B2 | 1/2005 | Sauciuc et al. |
| 6,855,158 B2 | 2/2005 | Stolpmann |
| 6,855,880 B2 | 2/2005 | Feher |
| 6,857,697 B2 | 2/2005 | Brennan et al. |
| 6,857,954 B2 | 2/2005 | Luedtke |
| 6,868,690 B2 | 3/2005 | Faqih |
| 6,871,365 B2 | 3/2005 | Flick et al. |
| 6,876,549 B2 | 4/2005 | Beitmal et al. |
| 6,886,351 B2 | 5/2005 | Palfy et al. |
| 6,892,807 B2 | 5/2005 | Fristedt et al. |

(56) References Cited

U.S. PATENT DOCUMENTS

| | | |
|---|---|---|
| 6,893,086 B2 | 5/2005 | Bajic et al. |
| 6,904,629 B2 | 6/2005 | Wu |
| 6,907,739 B2 | 6/2005 | Bell |
| 6,923,216 B2 | 8/2005 | Extrand et al. |
| 6,935,122 B2 | 8/2005 | Huang |
| 6,954,944 B2 | 10/2005 | Feher |
| 6,959,555 B2 | 11/2005 | Bell |
| 6,962,195 B2 | 11/2005 | Smith et al. |
| 6,963,053 B2 | 11/2005 | Lutz |
| 6,967,309 B2 | 11/2005 | Wyatt et al. |
| 6,976,734 B2 | 12/2005 | Stoewe |
| 6,977,360 B2 | 12/2005 | Weiss |
| 6,981,380 B2 | 1/2006 | Chrysler et al. |
| 6,990,701 B1 | 1/2006 | Litvak |
| 7,000,490 B1 | 2/2006 | Micheels |
| 7,036,163 B2 | 5/2006 | Schmid |
| 7,040,710 B2 | 5/2006 | White et al. |
| 7,052,091 B2 | 5/2006 | Bajic et al. |
| 7,063,163 B2 | 6/2006 | Steele et al. |
| 7,066,306 B2 | 6/2006 | Gavin |
| 7,070,231 B1 | 7/2006 | Wong |
| 7,070,232 B2 | 7/2006 | Minegishi et al. |
| 7,075,034 B2 | 7/2006 | Bargheer et al. |
| 7,082,772 B2 | 8/2006 | Welch |
| 7,084,502 B2 | 8/2006 | Bottner et al. |
| 7,100,978 B2 | 9/2006 | Ekern et al. |
| 7,108,319 B2 | 9/2006 | Hartwich et al. |
| 7,111,465 B2 | 9/2006 | Bell |
| 7,114,771 B2 | 10/2006 | Lofy et al. |
| 7,124,593 B2 | 10/2006 | Feher |
| 7,131,689 B2 | 11/2006 | Brennan et al. |
| 7,134,715 B1 | 11/2006 | Fristedt et al. |
| 7,141,763 B2 | 11/2006 | Moroz |
| 7,147,279 B2 | 12/2006 | Bevan et al. |
| 7,165,281 B2 | 1/2007 | Larssson et al. |
| 7,168,758 B2 | 1/2007 | Bevan et al. |
| 7,178,344 B2 | 2/2007 | Bell |
| 7,201,441 B2 | 4/2007 | Stoewe et al. |
| 7,213,876 B2 | 5/2007 | Stoewe |
| 7,220,048 B2 | 5/2007 | Kohlgrüber et al. |
| 7,224,059 B2 | 5/2007 | Shimada et al. |
| 7,231,772 B2 | 6/2007 | Bell |
| 7,244,887 B2 | 7/2007 | Miley |
| 7,246,496 B2 | 7/2007 | Goenka et al. |
| 7,272,936 B2 | 9/2007 | Feher |
| 7,273,981 B2 | 9/2007 | Bell |
| 7,299,639 B2 | 11/2007 | Leija et al. |
| 7,337,615 B2 | 3/2008 | Reidy |
| 7,338,117 B2 | 3/2008 | Iqbal et al. |
| 7,340,907 B2 | 3/2008 | Vogh et al. |
| 7,355,146 B2 | 4/2008 | Angelis et al. |
| 7,356,912 B2 | 4/2008 | Iqbal et al. |
| 7,360,365 B2 | 4/2008 | Codecasa et al. |
| 7,360,416 B2 | 4/2008 | Manaka et al. |
| 7,370,479 B2 | 5/2008 | Pfannenberg |
| 7,370,911 B2 | 5/2008 | Bajic et al. |
| 7,380,586 B2 | 6/2008 | Gawthrop |
| 7,425,034 B2 | 9/2008 | Bajic et al. |
| 7,426,835 B2 | 9/2008 | Bell et al. |
| 7,462,028 B2 | 12/2008 | Cherala et al. |
| 7,469,432 B2 | 12/2008 | Chambers |
| 7,475,464 B2 | 1/2009 | Lofy et al. |
| 7,475,938 B2 | 1/2009 | Stoewe et al. |
| 7,478,869 B2 | 1/2009 | Lazanja et al. |
| 7,480,950 B2 | 1/2009 | Feher |
| 7,506,924 B2 | 3/2009 | Bargheer et al. |
| 7,506,938 B2 | 3/2009 | Brennan et al. |
| 7,513,273 B2 | 4/2009 | Bivin |
| 7,581,785 B2 | 9/2009 | Heckmann et al. |
| 7,587,901 B2 | 9/2009 | Petrovski |
| 7,587,902 B2 | 9/2009 | Bell |
| 7,591,507 B2 | 9/2009 | Giffin et al. |
| 7,608,777 B2 | 10/2009 | Bell et al. |
| 7,621,594 B2 | 11/2009 | Hartmann et al. |
| 7,640,754 B2 | 1/2010 | Wolas |
| 7,665,803 B2 | 2/2010 | Wolas |
| 7,708,338 B2 | 5/2010 | Wolas |
| 7,731,279 B2 | 6/2010 | Asada et al. |
| RE41,765 E | 9/2010 | Gregory et al. |
| 7,827,620 B2 | 11/2010 | Feher |
| 7,827,805 B2 | 11/2010 | Comiskey et al. |
| 7,862,113 B2 | 1/2011 | Knoll |
| 7,866,017 B2 | 1/2011 | Knoll |
| 7,877,827 B2 | 2/2011 | Marquette et al. |
| 7,937,789 B2 | 5/2011 | Feher |
| 7,963,594 B2 | 6/2011 | Wolas |
| 7,966,835 B2 | 6/2011 | Petrovski |
| 7,969,738 B2 | 6/2011 | Koo |
| 7,996,936 B2 | 8/2011 | Marquette et al. |
| 8,062,797 B2 | 11/2011 | Fisher et al. |
| 8,065,763 B2 | 11/2011 | Brykalski et al. |
| 8,104,295 B2 | 1/2012 | Lofy |
| 8,143,554 B2 | 3/2012 | Lofy |
| 8,181,290 B2 | 5/2012 | Brykalski et al. |
| 8,191,187 B2 | 6/2012 | Brykalski et al. |
| 8,222,511 B2 | 7/2012 | Lofy |
| 8,256,236 B2 | 9/2012 | Lofy |
| 8,332,975 B2 | 12/2012 | Brykalski et al. |
| 8,397,518 B1 | 3/2013 | Vistakula |
| 8,402,579 B2 | 3/2013 | Marquette et al. |
| 8,418,286 B2 | 4/2013 | Brykalski et al. |
| 8,434,314 B2 | 5/2013 | Comiskey et al. |
| 8,438,863 B2 | 5/2013 | Lofy |
| RE44,272 E | 6/2013 | Bell |
| 8,505,320 B2 | 8/2013 | Lofy |
| 8,516,842 B2 | 8/2013 | Petrovski |
| 8,539,624 B2 | 9/2013 | Terech et al. |
| 8,575,518 B2 | 11/2013 | Walsh |
| 8,621,687 B2 | 1/2014 | Brykalski et al. |
| 8,732,874 B2 | 5/2014 | Brykalski et al. |
| 8,777,320 B2 | 7/2014 | Stoll et al. |
| 8,782,830 B2 | 7/2014 | Brykalski et al. |
| 8,869,596 B2 | 10/2014 | Hagl |
| 8,893,329 B2 | 11/2014 | Petrovksi |
| 8,893,513 B2 | 11/2014 | June et al. |
| 8,969,703 B2 | 3/2015 | Makansi et al. |
| 9,027,360 B2 * | 5/2015 | Chainer ............ H05K 7/20781 62/3.2 |
| 9,055,820 B2 | 6/2015 | Axakov et al. |
| 9,105,808 B2 | 8/2015 | Petrovksi |
| 9,105,809 B2 | 8/2015 | Lofy |
| 9,121,414 B2 | 9/2015 | Lofy et al. |
| 9,125,497 B2 | 9/2015 | Brykalski et al. |
| 9,310,112 B2 | 4/2016 | Bell et al. |
| 9,335,073 B2 | 5/2016 | Lofy |
| 9,445,524 B2 | 9/2016 | Lofy et al. |
| 9,451,723 B2 | 9/2016 | Lofy et al. |
| 9,603,459 B2 | 3/2017 | Brykalski et al. |
| 9,622,588 B2 | 4/2017 | Brykalski et al. |
| 9,651,279 B2 | 5/2017 | Lofy |
| 9,662,962 B2 | 5/2017 | Steinman et al. |
| 9,685,599 B2 | 6/2017 | Petrovski et al. |
| 9,719,701 B2 | 8/2017 | Bell et al. |
| 9,814,641 B2 | 11/2017 | Brykalski et al. |
| 9,857,107 B2 | 1/2018 | Inaba et al. |
| 9,989,267 B2 | 6/2018 | Brykalski et al. |
| 9,989,282 B2 | 6/2018 | Makansi et al. |
| 10,005,337 B2 | 6/2018 | Petrovski |
| 10,195,970 B2 | 2/2019 | Bauer |
| 10,208,990 B2 | 2/2019 | Petrovski et al. |
| 10,219,323 B2 | 2/2019 | Inaba et al. |
| 10,228,165 B2 | 3/2019 | Makansi et al. |
| 10,228,166 B2 | 3/2019 | Lofy |
| 10,266,031 B2 | 4/2019 | Steinman et al. |
| 10,288,084 B2 | 5/2019 | Lofy et al. |
| 10,290,796 B2 | 5/2019 | Boukai et al. |
| RE47,574 E | 8/2019 | Terech et al. |
| 10,405,667 B2 | 9/2019 | Marquette et al. |
| 10,457,173 B2 | 10/2019 | Lofy et al. |
| 10,495,322 B2 | 12/2019 | Brykalski et al. |
| 10,589,647 B2 | 3/2020 | Wolas et al. |
| 10,991,869 B2 | 4/2021 | Jovovic et al. |
| 11,033,058 B2 | 6/2021 | Cauchy |
| 11,075,331 B2 | 7/2021 | Bück |

(56) References Cited

U.S. PATENT DOCUMENTS

| | | |
|---|---|---|
| 11,152,557 B2 | 10/2021 | Jovovic et al. |
| 11,223,004 B2 | 1/2022 | Jovovic |
| 11,240,882 B2 | 2/2022 | Inaba et al. |
| 11,240,883 B2 | 2/2022 | Inaba et al. |
| 2001/0005990 A1 | 7/2001 | Kim et al. |
| 2001/0014212 A1 | 8/2001 | Rutherford |
| 2001/0028185 A1 | 10/2001 | Stowe et al. |
| 2002/0017102 A1 | 2/2002 | Bell |
| 2002/0026226 A1 | 2/2002 | Ein |
| 2002/0062854 A1 | 5/2002 | Sharp |
| 2002/0092308 A1 | 7/2002 | Bell |
| 2002/0100121 A1 | 8/2002 | Kocurek |
| 2002/0108380 A1 | 8/2002 | Nelsen et al. |
| 2002/0121094 A1 | 9/2002 | VanHoudt |
| 2002/0166659 A1 | 11/2002 | Wagner et al. |
| 2002/0171132 A1 | 11/2002 | Buchwalter et al. |
| 2002/0195844 A1 | 12/2002 | Hipwell |
| 2003/0039298 A1 | 2/2003 | Eriksson et al. |
| 2003/0041892 A1 | 3/2003 | Fleurial et al. |
| 2003/0070235 A1 | 4/2003 | Suzuki et al. |
| 2003/0084511 A1 | 5/2003 | Salvatini et al. |
| 2003/0110779 A1 | 6/2003 | Otey et al. |
| 2003/0133492 A1 | 7/2003 | Watanabe |
| 2003/0145380 A1 | 8/2003 | Schmid |
| 2003/0150060 A1 | 8/2003 | Huang |
| 2003/0160479 A1 | 8/2003 | Minuth et al. |
| 2003/0188382 A1 | 10/2003 | Klamm et al. |
| 2003/0234247 A1 | 12/2003 | Stern |
| 2004/0040327 A1 | 3/2004 | Iida et al. |
| 2004/0070236 A1 | 4/2004 | Brennan et al. |
| 2004/0090093 A1 | 5/2004 | Kamiya et al. |
| 2004/0098991 A1 | 5/2004 | Heyes |
| 2004/0113549 A1 | 6/2004 | Roberts et al. |
| 2004/0164594 A1 | 8/2004 | Stoewe et al. |
| 2004/0177622 A1 | 9/2004 | Harvie |
| 2004/0177876 A1 | 9/2004 | Hightower |
| 2004/0177877 A1 | 9/2004 | Hightower |
| 2004/0195870 A1 | 10/2004 | Bohlender |
| 2004/0238022 A1 | 12/2004 | Hiller et al. |
| 2004/0238516 A1 | 12/2004 | Bulgajewski |
| 2004/0255364 A1 | 12/2004 | Feher |
| 2004/0264009 A1 | 12/2004 | Hwang et al. |
| 2005/0000558 A1 | 1/2005 | Moriyama et al. |
| 2005/0011009 A1 | 1/2005 | Wu |
| 2005/0012204 A1 | 1/2005 | Strnad |
| 2005/0045702 A1 | 3/2005 | Freeman et al. |
| 2005/0056310 A1 | 3/2005 | Shikata et al. |
| 2005/0067862 A1 | 3/2005 | Iqbal et al. |
| 2005/0072165 A1 | 4/2005 | Bell |
| 2005/0076944 A1 | 4/2005 | Kanatzidis et al. |
| 2005/0078451 A1 | 4/2005 | Sauciuc et al. |
| 2005/0086739 A1 | 4/2005 | Wu |
| 2005/0121065 A1 | 6/2005 | Otey |
| 2005/0126184 A1 | 6/2005 | Cauchy |
| 2005/0140180 A1 | 6/2005 | Hesch |
| 2005/0143797 A1 | 6/2005 | Parish et al. |
| 2005/0145285 A1 | 7/2005 | Extrand |
| 2005/0161072 A1 | 7/2005 | Esser et al. |
| 2005/0173950 A1 | 8/2005 | Bajic et al. |
| 2005/0183763 A1 | 8/2005 | Christiansen |
| 2005/0193742 A1 | 9/2005 | Arnold |
| 2005/0200166 A1 | 9/2005 | Noh |
| 2005/0202774 A1 | 9/2005 | Lipke |
| 2005/0220167 A1 | 10/2005 | Kanai et al. |
| 2005/0251120 A1 | 11/2005 | Anderson et al. |
| 2005/0257532 A1 | 11/2005 | Ikeda et al. |
| 2005/0268956 A1 | 12/2005 | Take |
| 2005/0278863 A1 | 12/2005 | Bahash et al. |
| 2005/0285438 A1 | 12/2005 | Ishima et al. |
| 2005/0288749 A1 | 12/2005 | Lachenbruch |
| 2006/0005548 A1 | 1/2006 | Ruckstuhl |
| 2006/0005944 A1 | 1/2006 | Wang et al. |
| 2006/0053529 A1 | 3/2006 | Feher |
| 2006/0075760 A1 | 4/2006 | Im et al. |
| 2006/0078319 A1 | 4/2006 | Maran |
| 2006/0080778 A1 | 4/2006 | Chambers |
| 2006/0087160 A1 | 4/2006 | Dong et al. |
| 2006/0102224 A1 | 5/2006 | Chen et al. |
| 2006/0118158 A1 | 6/2006 | Zhang et al. |
| 2006/0123799 A1 | 6/2006 | Tateyama et al. |
| 2006/0137099 A1 | 6/2006 | Feher |
| 2006/0157102 A1 | 7/2006 | Nakajima et al. |
| 2006/0158011 A1 | 7/2006 | Marlovits et al. |
| 2006/0162074 A1 | 7/2006 | Bader |
| 2006/0162341 A1 | 7/2006 | Milazzo |
| 2006/0175877 A1 | 8/2006 | Alionte et al. |
| 2006/0197363 A1 | 9/2006 | Lofy et al. |
| 2006/0200398 A1 | 9/2006 | Botton et al. |
| 2006/0201161 A1 | 9/2006 | Hirai et al. |
| 2006/0201162 A1 | 9/2006 | Hsieh |
| 2006/0213682 A1 | 9/2006 | Moon et al. |
| 2006/0214480 A1 | 9/2006 | Terech |
| 2006/0219699 A1 | 10/2006 | Geisei et al. |
| 2006/0225441 A1 | 10/2006 | Goenka et al. |
| 2006/0225773 A1 | 10/2006 | Venkatasubramanian et al. |
| 2006/0237166 A1 | 10/2006 | Otey et al. |
| 2006/0243317 A1 | 11/2006 | Venkatasubramanian |
| 2006/0244289 A1 | 11/2006 | Bedro |
| 2006/0254284 A1 | 11/2006 | Ito et al. |
| 2006/0273646 A1 | 12/2006 | Comiskey et al. |
| 2006/0289051 A1 | 12/2006 | Niimi et al. |
| 2007/0017666 A1 | 1/2007 | Goenka et al. |
| 2007/0035162 A1 | 2/2007 | Bier et al. |
| 2007/0040421 A1 | 2/2007 | Zuzga et al. |
| 2007/0069554 A1 | 3/2007 | Comiskey et al. |
| 2007/0086757 A1 | 4/2007 | Feher |
| 2007/0089773 A1 | 4/2007 | Koester et al. |
| 2007/0095378 A1 | 5/2007 | Ito et al. |
| 2007/0095383 A1 | 5/2007 | Tajima |
| 2007/0101602 A1 | 5/2007 | Bae et al. |
| 2007/0107450 A1 | 5/2007 | Sasao et al. |
| 2007/0138844 A1 | 6/2007 | Kim |
| 2007/0142883 A1 | 6/2007 | Quincy, III |
| 2007/0145808 A1 | 6/2007 | Minuth et al. |
| 2007/0157630 A1 | 7/2007 | Kadle et al. |
| 2007/0157631 A1 | 7/2007 | Huang et al. |
| 2007/0158981 A1 | 7/2007 | Almasi et al. |
| 2007/0163269 A1 | 7/2007 | Chung et al. |
| 2007/0190712 A1 | 8/2007 | Lin et al. |
| 2007/0193279 A1 | 8/2007 | Yoneno et al. |
| 2007/0200398 A1 | 8/2007 | Wolas et al. |
| 2007/0214956 A1 | 9/2007 | Carlson et al. |
| 2007/0220907 A1 | 9/2007 | Ehlers |
| 2007/0227158 A1 | 10/2007 | Kuchimachi |
| 2007/0234742 A1 | 10/2007 | Aoki et al. |
| 2007/0241592 A1 | 10/2007 | Giffin et al. |
| 2007/0251016 A1 | 11/2007 | Feher |
| 2007/0256722 A1 | 11/2007 | Kondoh |
| 2007/0261412 A1 | 11/2007 | Heine |
| 2007/0261413 A1 | 11/2007 | Hatamian et al. |
| 2007/0261548 A1 | 11/2007 | Vrzalik et al. |
| 2007/0262621 A1 | 11/2007 | Dong et al. |
| 2007/0296251 A1 | 12/2007 | Krobok et al. |
| 2008/0000025 A1 | 1/2008 | Feher |
| 2008/0000511 A1 | 1/2008 | Kuroyanagi et al. |
| 2008/0022694 A1 | 1/2008 | Anderson et al. |
| 2008/0023056 A1 | 1/2008 | Kambe et al. |
| 2008/0028536 A1 | 2/2008 | Hadden-Cook |
| 2008/0028768 A1 | 2/2008 | Goenka |
| 2008/0028769 A1 | 2/2008 | Goenka |
| 2008/0053108 A1 | 3/2008 | Wen |
| 2008/0053509 A1 | 3/2008 | Flitsch et al. |
| 2008/0077211 A1 | 3/2008 | Levinson et al. |
| 2008/0078186 A1 | 4/2008 | Cao |
| 2008/0084095 A1 | 4/2008 | Wolas |
| 2008/0087316 A1 | 4/2008 | Inaba et al. |
| 2008/0154518 A1 | 6/2008 | Manaka et al. |
| 2008/0155990 A1 | 7/2008 | Gupta et al. |
| 2008/0163916 A1 | 7/2008 | Tsuneoka et al. |
| 2008/0164733 A1 | 7/2008 | Giffin et al. |
| 2008/0166224 A1 | 7/2008 | Giffin et al. |
| 2008/0245092 A1 | 10/2008 | Forsberg et al. |
| 2008/0263776 A1 | 10/2008 | O'Reagan |
| 2008/0289677 A1 | 11/2008 | Bell et al. |

(56) References Cited

U.S. PATENT DOCUMENTS

| | | |
|---|---|---|
| 2008/0307796 A1 | 12/2008 | Bell et al. |
| 2009/0000031 A1 | 1/2009 | Feher |
| 2009/0015042 A1 | 1/2009 | Bargheer et al. |
| 2009/0026813 A1 | 1/2009 | Lofy |
| 2009/0033130 A1 | 2/2009 | Marquette et al. |
| 2009/0064411 A1* | 3/2009 | Marquette ............ F24H 9/2071 62/3.5 |
| 2009/0106907 A1 | 4/2009 | Chambers |
| 2009/0108094 A1 | 4/2009 | Ivri |
| 2009/0126110 A1 | 5/2009 | Feher |
| 2009/0178700 A1 | 7/2009 | Heremans et al. |
| 2009/0211619 A1 | 8/2009 | Sharp et al. |
| 2009/0218855 A1 | 9/2009 | Wolas |
| 2009/0235969 A1 | 9/2009 | Heremans et al. |
| 2009/0269584 A1 | 10/2009 | Bell et al. |
| 2009/0277897 A1 | 11/2009 | Lashmore et al. |
| 2009/0293488 A1 | 12/2009 | Coughlan, III et al. |
| 2010/0031987 A1 | 2/2010 | Bell et al. |
| 2010/0132379 A1 | 6/2010 | Wu |
| 2010/0132380 A1 | 6/2010 | Robinson, II |
| 2010/0133883 A1 | 6/2010 | Walker |
| 2010/0153066 A1 | 6/2010 | Federer et al. |
| 2010/0154437 A1 | 6/2010 | Nepsha |
| 2010/0154911 A1 | 6/2010 | Yoskowitz |
| 2010/0198322 A1 | 8/2010 | Joseph et al. |
| 2010/0282910 A1 | 11/2010 | Stothers et al. |
| 2010/0294455 A1 | 11/2010 | Yang et al. |
| 2010/0307168 A1 | 12/2010 | Kohl et al. |
| 2011/0066217 A1 | 3/2011 | Diller et al. |
| 2011/0101741 A1 | 5/2011 | Kolich |
| 2011/0226751 A1 | 9/2011 | Lazanja et al. |
| 2011/0271994 A1 | 11/2011 | Gilley |
| 2011/0289684 A1 | 12/2011 | Parish et al. |
| 2012/0000901 A1 | 1/2012 | Bajic et al. |
| 2012/0003510 A1 | 1/2012 | Eisenhour |
| 2012/0017371 A1 | 1/2012 | Pollard |
| 2012/0049586 A1 | 3/2012 | Yoshimoto et al. |
| 2012/0080911 A1 | 4/2012 | Brykalski et al. |
| 2012/0129439 A1 | 5/2012 | Ota et al. |
| 2012/0132242 A1 | 5/2012 | Chu et al. |
| 2012/0145215 A1 | 6/2012 | Hwang et al. |
| 2012/0174956 A1 | 7/2012 | Smythe et al. |
| 2012/0198616 A1 | 8/2012 | Makansi et al. |
| 2012/0201008 A1 | 8/2012 | Hershberger et al. |
| 2012/0235444 A1 | 9/2012 | Dilley et al. |
| 2012/0239123 A1 | 9/2012 | Weber et al. |
| 2012/0261399 A1 | 10/2012 | Lofy |
| 2012/0289761 A1 | 11/2012 | Boyden et al. |
| 2012/0325281 A1 | 12/2012 | Akiyama |
| 2013/0008181 A1 | 1/2013 | Makansi et al. |
| 2013/0097777 A1 | 4/2013 | Marquette et al. |
| 2013/0125563 A1 | 5/2013 | Jun |
| 2013/0157271 A1 | 6/2013 | Coursey et al. |
| 2013/0200424 A1 | 8/2013 | An et al. |
| 2013/0232996 A1 | 9/2013 | Goenka et al. |
| 2013/0239592 A1 | 9/2013 | Lofy |
| 2014/0014871 A1 | 1/2014 | Haddon et al. |
| 2014/0026320 A1 | 1/2014 | Marquette et al. |
| 2014/0030082 A1 | 1/2014 | Helmenstein |
| 2014/0041396 A1 | 2/2014 | Makansi et al. |
| 2014/0090513 A1 | 4/2014 | Zhang et al. |
| 2014/0113536 A1 | 4/2014 | Goenka et al. |
| 2014/0131343 A1 | 5/2014 | Walsh |
| 2014/0137569 A1 | 5/2014 | Parish et al. |
| 2014/0159442 A1 | 6/2014 | Helmenstein |
| 2014/0165608 A1 | 6/2014 | Tseng |
| 2014/0180493 A1 | 6/2014 | Csonti et al. |
| 2014/0182646 A1* | 7/2014 | Choi ..................... H01L 35/02 977/948 |
| 2014/0187140 A1 | 7/2014 | Lazanja et al. |
| 2014/0194959 A1 | 7/2014 | Fries et al. |
| 2014/0230455 A1 | 8/2014 | Chandler et al. |
| 2014/0250918 A1 | 9/2014 | Lofy |
| 2014/0256244 A1 | 9/2014 | Sakurai et al. |
| 2014/0260331 A1* | 9/2014 | Lofy ...................... A61F 7/007 165/185 |
| 2014/0305625 A1 | 10/2014 | Petrovski |
| 2014/0338366 A1 | 11/2014 | Adldinger et al. |
| 2015/0116943 A1 | 4/2015 | Olsson et al. |
| 2015/0231636 A1 | 8/2015 | Lim et al. |
| 2015/0238020 A1 | 8/2015 | Petrovski et al. |
| 2015/0298524 A1 | 10/2015 | Goenka |
| 2016/0030234 A1 | 2/2016 | Lofy et al. |
| 2016/0035957 A1 | 2/2016 | Casey |
| 2016/0039321 A1 | 2/2016 | Dacosta-Mallet et al. |
| 2016/0133817 A1 | 5/2016 | Makansi et al. |
| 2016/0152167 A1 | 6/2016 | Kozlowski |
| 2017/0047500 A1 | 2/2017 | Shiraishi et al. |
| 2017/0066355 A1 | 3/2017 | Kozlowski |
| 2017/0071359 A1 | 3/2017 | Petrovski et al. |
| 2017/0164757 A1 | 6/2017 | Thomas |
| 2017/0261241 A1 | 9/2017 | Makansi et al. |
| 2017/0268803 A1 | 9/2017 | Cauchy |
| 2017/0282764 A1 | 10/2017 | Bauer et al. |
| 2017/0354190 A1 | 12/2017 | Cauchy |
| 2017/0365764 A1 | 12/2017 | Shingai et al. |
| 2018/0017334 A1 | 1/2018 | Davis et al. |
| 2018/0076375 A1 | 3/2018 | Makansi et al. |
| 2018/0111527 A1 | 4/2018 | Tait et al. |
| 2018/0123013 A1 | 5/2018 | Williams et al. |
| 2018/0170223 A1 | 6/2018 | Wolas |
| 2018/0172325 A1 | 6/2018 | Inaba et al. |
| 2018/0279416 A1 | 9/2018 | Sajic et al. |
| 2018/0281641 A1 | 10/2018 | Durkee et al. |
| 2018/0290574 A1 | 10/2018 | Kozlowski |
| 2019/0051807 A1 | 2/2019 | Okumura et al. |
| 2019/0230744 A1 | 7/2019 | Inaba et al. |
| 2019/0239289 A1 | 8/2019 | Inaba et al. |
| 2020/0035896 A1 | 1/2020 | Jovovic et al. |
| 2020/0035897 A1 | 1/2020 | Jovovic |
| 2020/0035898 A1 | 1/2020 | Jovovic et al. |
| 2020/0035899 A1 | 1/2020 | Bück |
| 2020/0266327 A1 | 8/2020 | Jovovic et al. |
| 2021/0370746 A1 | 12/2021 | Pacilli et al. |
| 2022/0000191 A1 | 1/2022 | Cauchy |
| 2022/0169158 A1 | 6/2022 | Cauchy |

FOREIGN PATENT DOCUMENTS

| | | |
|---|---|---|
| CN | 2128076 | 3/1993 |
| CN | 2155318 | 2/1994 |
| CN | 2155741 | 2/1994 |
| CN | 1121790 | 5/1996 |
| CN | 1299950 | 6/2001 |
| CN | 1320087 | 10/2001 |
| CN | 1535220 | 10/2004 |
| CN | 1813164 | 8/2006 |
| CN | 1839060 | 9/2006 |
| CN | 1929761 | 3/2007 |
| CN | 101 033 878 | 9/2007 |
| CN | 200 974 488 | 11/2007 |
| CN | 101 097 986 | 1/2008 |
| CN | 101 119 871 | 2/2008 |
| CN | 101 219 025 | 7/2008 |
| CN | 101 331 034 | 12/2008 |
| CN | 101 332 785 | 12/2008 |
| CN | 101 370 409 | 2/2009 |
| CN | 101 511 638 | 8/2009 |
| CN | 101 663 180 | 3/2010 |
| CN | 101 871 704 | 10/2010 |
| CN | 102 059 968 | 5/2011 |
| CN | 201 987 052 | 9/2011 |
| CN | 102 576 232 | 7/2012 |
| CN | 102 729 865 | 10/2012 |
| CN | 102 801 105 | 11/2012 |
| CN | 104 282 643 | 1/2015 |
| CN | 204 157 198 | 2/2015 |
| CN | 106 937 799 | 7/2017 |
| CN | 208 355 060 | 1/2019 |
| CN | 111 306 838 | 6/2020 |
| DE | 195 03 291 | 8/1996 |
| DE | 199 12 764 | 9/2000 |
| DE | 299 11 519 | 11/2000 |

(56) References Cited

FOREIGN PATENT DOCUMENTS

| | | |
|---|---|---|
| DE | 102 38 552 | 8/2001 |
| DE | 101 15 242 | 10/2002 |
| DE | 202 17 645 | 3/2003 |
| DE | 201 20 516 | 4/2003 |
| DE | 10 2009 036 332 | 2/2011 |
| DE | 10 2009 058 996 | 12/2012 |
| EP | 0 424 160 | 4/1991 |
| EP | 0 411 375 | 5/1994 |
| EP | 0 621 026 | 10/1994 |
| EP | 0 834 421 | 4/1998 |
| EP | 0 862 901 | 9/1998 |
| EP | 0 730 720 | 7/2000 |
| EP | 1 486 143 | 12/2004 |
| EP | 1 598 223 | 11/2005 |
| EP | 1 972 312 | 9/2008 |
| EP | 1 845 914 | 9/2009 |
| EP | 2 396 619 | 8/2015 |
| EP | 2 921 083 | 9/2015 |
| EP | 1 675 747 | 3/2017 |
| FR | 2 882 307 | 8/2006 |
| FR | 2 893 826 | 6/2007 |
| GB | 874660 | 8/1961 |
| GB | 978057 | 12/1964 |
| GB | 1 435 831 | 5/1976 |
| JP | 56-097416 | 8/1981 |
| JP | 58-185952 | 10/1983 |
| JP | 60-080044 | 5/1985 |
| JP | 60-085297 | 5/1985 |
| JP | 01-281344 | 11/1989 |
| JP | 04-052470 | 6/1990 |
| JP | 04-165234 | 6/1992 |
| JP | 04-107656 | 9/1992 |
| JP | 05-026762 | 2/1993 |
| JP | 05-277020 | 10/1993 |
| JP | 09-37894 | 2/1997 |
| JP | 09-276076 | 10/1997 |
| JP | 10-044756 | 2/1998 |
| JP | 10-503733 | 4/1998 |
| JP | 10-227508 | 8/1998 |
| JP | 10-297243 | 11/1998 |
| JP | 10-332883 | 12/1998 |
| JP | 2000-060681 | 2/2000 |
| JP | 2000-164945 | 6/2000 |
| JP | 2000-244024 | 9/2000 |
| JP | 2000-325384 | 11/2000 |
| JP | 2001-174028 | 6/2001 |
| JP | 2001-208405 | 8/2001 |
| JP | 2002-514735 | 5/2002 |
| JP | 2002-227798 | 8/2002 |
| JP | 2002-306276 | 10/2002 |
| JP | 2003-042594 | 2/2003 |
| JP | 2003-174203 | 6/2003 |
| JP | 2003174203 A * | 6/2003 |
| JP | 2003-204087 | 7/2003 |
| JP | 2003-254636 | 9/2003 |
| JP | 2004-055621 | 2/2004 |
| JP | 2004-079883 | 3/2004 |
| JP | 2004-174138 | 6/2004 |
| JP | 2005-079210 | 2/2005 |
| JP | 2005-251950 | 9/2005 |
| JP | 2005-303183 | 10/2005 |
| JP | 2005-333083 | 12/2005 |
| JP | 2006-001392 | 1/2006 |
| JP | 2006-021572 | 1/2006 |
| JP | 2006-076398 | 3/2006 |
| JP | 2006-122588 | 5/2006 |
| JP | 2006-137405 | 6/2006 |
| JP | 2012-111318 | 6/2012 |
| JP | 2014-135455 | 7/2014 |
| KR | 10-1998-0702159 | 7/1998 |
| KR | 10-2001-0060500 | 7/2001 |
| KR | 10-2005-0011494 | 1/2005 |
| KR | 10-2006-0048748 | 5/2006 |
| KR | 10-1254624 | 4/2013 |
| KR | 10-1524090 | 5/2015 |
| KR | 10-1873857 | 7/2018 |
| LU | 66619 | 2/1973 |
| RU | 2562507 | 9/2015 |
| WO | WO 94/20801 | 9/1994 |
| WO | WO 95/14899 | 6/1995 |
| WO | WO 95/31688 | 11/1995 |
| WO | WO 96/05475 | 2/1996 |
| WO | WO 98/07898 | 2/1998 |
| WO | WO 98/31311 | 7/1998 |
| WO | WO 99/23980 | 5/1999 |
| WO | WO 99/44552 | 9/1999 |
| WO | WO 99/58907 | 11/1999 |
| WO | WO 02/11968 | 2/2002 |
| WO | WO 02/053400 | 7/2002 |
| WO | WO 02/058165 | 7/2002 |
| WO | WO 03/014634 | 2/2003 |
| WO | WO 03/051666 | 6/2003 |
| WO | WO 03/063257 | 7/2003 |
| WO | WO 2004/011861 | 2/2004 |
| WO | WO 2005/105516 | 11/2005 |
| WO | WO 2005/115794 | 12/2005 |
| WO | WO 2006/037178 | 4/2006 |
| WO | WO 2006/041935 | 4/2006 |
| WO | WO 2006/078394 | 7/2006 |
| WO | WO 2006/102509 | 9/2006 |
| WO | WO 2007/060371 | 5/2007 |
| WO | WO 2007/089789 | 8/2007 |
| WO | WO 2007/142972 | 12/2007 |
| WO | WO 2008/023942 | 2/2008 |
| WO | WO 2008/045964 | 4/2008 |
| WO | WO 2008/046110 | 4/2008 |
| WO | WO 2008/057962 | 5/2008 |
| WO | WO 2008/076588 | 6/2008 |
| WO | WO 2008/086499 | 7/2008 |
| WO | WO 2008/115831 | 9/2008 |
| WO | WO 2009/015235 | 1/2009 |
| WO | WO 2009/036077 | 3/2009 |
| WO | WO 2009/097572 | 8/2009 |
| WO | WO 2010/009422 | 1/2010 |
| WO | WO 2010/088405 | 8/2010 |
| WO | WO 2010/129803 | 11/2010 |
| WO | WO 2010/137290 | 12/2010 |
| WO | WO 2011/026040 | 3/2011 |
| WO | WO 2011/156643 | 12/2011 |
| WO | WO 2012/061777 | 5/2012 |
| WO | WO 2013/052823 | 4/2013 |
| WO | WO 2014/052145 | 4/2014 |
| WO | WO 2014/145556 | 9/2014 |
| WO | WO 2014/164887 | 10/2014 |
| WO | WO 2015/085150 | 6/2015 |
| WO | WO 2015/123585 | 8/2015 |
| WO | WO 2016/077843 | 5/2016 |
| WO | WO 2016/130840 | 8/2016 |
| WO | WO 2017/059256 | 4/2017 |
| WO | WO 2017/066261 | 4/2017 |
| WO | WO 2017/086043 | 5/2017 |
| WO | WO 2017/100718 | 6/2017 |
| WO | WO 2017/106829 | 6/2017 |
| WO | WO 2017/136793 | 8/2017 |
| WO | WO 2017/201083 | 11/2017 |
| WO | WO 2018/071612 | 4/2018 |
| WO | WO 2018/148398 | 8/2018 |
| WO | WO 2018/175506 | 9/2018 |
| WO | WO 2019/173553 | 9/2019 |
| WO | WO 2020/112902 | 6/2020 |
| WO | WO 2020/172255 | 8/2020 |
| WO | WO 2020/180632 | 9/2020 |
| WO | WO 2021/025663 | 2/2021 |
| WO | WO 2022/198216 | 9/2022 |
| WO | WO 2022/198217 | 9/2022 |

OTHER PUBLICATIONS

U.S. Appl. No. 14/821,514, filed Aug. 7, 2015, Lofy.
U.S. Appl. No. 15/685,912, filed Aug. 24, 2017, Petrovski et al.
U.S. Appl. No. 16/277,765, filed Feb. 15, 2019, Petrovski et al.
U.S. Appl. No. 16/818,816, filed Mar. 13, 2020, Wolas et al.

(56) References Cited

OTHER PUBLICATIONS

Feher, S., "Thermoelectric Air Conditioned Variable Temperature Seat (VTS) & Effect Upon Vehicle Occupant Comfort, Vehicle Energy Efficiency, and Vehicle Environment Compatibility", SAE Technical Paper, Apr. 1993, pp. 341-349.
Lofy, J., et al., "Thermoelectrics for Environmental Control in Automobiles", Proceeding of Twenty-First International Conference on Thermoelectrics (ICT 2002), 2002, pp. 471-476.
Luo, Z., "A Simple Method to Estimate the Physical Characteristics of a Thermoelectric Cooler from Vendor Datasheets", Electronics Cooling, Aug. 2008, in 17 pages from https://www.electronics-cooling.com/2008/08/a-simple-method-to-estimate-the-physical-characteristics-of-a-thermoelectric-cooler-from-vendor-datasheets/.
Photographs and accompanying description of climate control seat assembly system components publicly disclosed as early as Jan. 1998.
Photographs and accompanying description of a component of a climate control seat assembly system sold prior to Nov. 1, 2005.
Photographs and accompanying description of a component of a climate control seat assembly system sold prior to Dec. 20, 2003.
International Search Report and Written Opinion received in PCT Application No. PCT/US2015/060955, dated Feb. 2, 2016.
International Preliminary Report on Patentability received in PCT Application No. PCT/US2015/060955, dated May 26, 2017.
International Search Report and Written Opinion received in PCT Application No. PCT/US2018/023443, dated Jul. 12, 2018.
International Preliminary Report on Patentability received in PCT Application No. PCT/US2018/023443, dated Oct. 3, 2019.
International Search Report and Written Opinion received in PCT Application No. PCT/US2019/044797, dated Dec. 11, 2019.
Geng, S. et al., *Modern Family Practical Encyclopedia*, Jilin Science and Technology Press, Sep. 1985, p. 679.
Zhou, Z. et al., "Design features of the air-conditioner used for elevators and a comparison between techniques for eliminating condensation water", Energy Research and Information, 2002, vol. 18, No. 3, pp. 156-161.
Chinese Office Action in Chinese Application No. 201811430679.2, dated Nov. 26, 2021.
International Preliminary Report on Patentability received in PCT Application No. PCT/US2019/044797, dated Feb. 17, 2022.

\* cited by examiner

HEATING AND COOLING TECHNOLOGIES INCLUDING TEMPERATURE REGULATING PAD WRAP AND TECHNOLOGIES WITH LIQUID SYSTEM

CROSS-REFERENCE TO RELATED APPLICATIONS

This application is a Continuation in Part (CIP) of International PCT Application No.: PCT/US2015/060955, filed Nov. 16, 2015 and claims priority with the benefit under 35 U.S.C. 119(e) of U.S. Provisional Application No. 62/080, 072 filed Nov. 14, 2014, International PCT Application No.: PCT/US2015/060955, filed Nov. 16, 2015, U.S. Provisional Patent Application Ser. No.: 62/080,072, filed Nov. 14, 2014, U.S. Provisional Patent Application Ser. No.: 62/353, 987, filed Jun. 23, 2016 and U.S. Provisional Patent Application Ser. No.: 62/473,966, filed Mar. 20, 2017 and Provisional Patent Application Ser. No.: 62/563,702, filed Sep. 27, 2017.

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS WEB)

Not Applicable

STATEMENT REGARDING PRIOR DISCLOSURES BY THE INVENTOR OR A JOINT INVENTOR

Not Applicable

BACKGROUND OF THE INVENTION

1. Field of the Invention

The present invention relates to heated and cooled assemblies for use in OEM and aftermarket heaters/coolers, methods of manufacturing same, and methods of using same. More particularly, the invention relates to conductive heat transfer systems for heating and cooling automotive seats, medical containers, office furniture of all types, food warmers, as well as articles of clothing.

The subject matter of co-pending U.S. patent application Ser. No. 15/526,954 is incorporated in its entirety herein by reference.

2. Description of the Prior Art

Conventional heating and cooling systems for vehicle seats, furniture seats, medical containers, food warmers and articles of clothing are well known in the art, including one of the most common types of forced air heating and cooling systems that includes a forced air heater and/or cooler within an automobile seat, seat assembly or articles of clothing. Conventional heated articles have included inefficient electric resistance heating mechanisms, among others. Other utilized methods of warming include chemical reaction type systems which may be efficient, but they require a new expenditure after each activation.

Practitioners of those forced air heating and cooling system inventions have become aware of certain issues which are presented by those prior art inventions. One particular problem that has plagued car manufacturers and consumers has been that those systems utilize a great deal of energy due to the inefficiency associated with heat transfer using air as the heat transfer medium. There are other complexities which give rise to interior space concerns along with these energy consumption issues.

Heated articles of clothing, predominantly for motorcycle enthusiasts and outdoorsmen, have utilized electrical resistance wires placed throughout the clothing, much like an old fashioned electric blanket. Typically, motorcycle jackets that used the electrical wires needed to be plugged into the motorcycle to continuously feed electricity to the device.

Practitioners of prior art inventions relating to electrically heated jackets that include a set of heating wires sewn into the garment to distribute heat have become aware of certain problems which are presented by those prior art inventions. Besides the fact that many of those prior art devices are not capable of both heating and cooling with a single device, one particular problem that has plagued users has been that the temperature cannot be digitally regulated, and the heat is generally not uniformly dispersed. Those devices that can both heat and cool use a circulating fluid from a heat exchanger flowing heated or cooled fluid through tubes, bladders or the like. There are complexities which give rise to hot and cold spots.

The present invention also relates to a temperature regulating pad wrap, methods of manufacturing same, and methods of using same. More particularly, the invention relates to a heating and cooling pad with distributed substantially uniform thermal transfer via a thermally dissipative sheeted material.

It would be desirable to the anyone outside in the elements, particularly military personnel, outdoorsmen, motorcycle enthusiasts, construction workers, those persons requiring heating and/or cooling for the purpose of aiding healing a body part such as a knee, elbow, back, shoulder or other body area in a medical or physical therapy setting, and those in the transportation industry, if there was provided a temperature regulating body wrap or garment that can evenly disperse heat and coolness in a simple design, and method of making those wraps, or a method of using them.

As anyone knows who has recently purchased a vehicle, heated seats are very popular. Although heated seats may be used in a multitude of applications, I will be focusing on the automobile, as that represents the largest sales volume of heated/cooled seats which are purchased by the public. Clearly, mechanisms for heating and cooling seats may be useful for many other applications, more fully described hereinbelow.

Heating and cooling of automobile seats are desirable features that are widely adopted by automobile buyers, although there are improvements to be made on the existing systems. Updating these technologies in order to utilize less electricity, new materials and technologies help to transfer heating and cooling, hopefully minimizing moisture build up, which is advantageous for any applications in the seating industry.

The seating industry has been looking for both a one-directional and a bi-directional heat transfer material that has a high rate of heating and/or cooling. Furthermore, consistent heating and cooling over an entire heating surface while consuming a low power amount will be welcomed by the industry.

The prior art usually includes a forced convection heating system with an air distribution model dependent on air flow. As an occupant on the seat increases in weight, the quality of air flow decreases. In these cases, there is a heat sink resistance that is undesirable. In the conventionally available heated seat technologies, including the microthermal module, a Peltier circuit was used in conjunction with a heat exchanger to provide heated or cooled air that exits to the seat cushion. Issues arise due to the air distribution method which may include a first top layer of perforated leather, then a distribution layer atop conventional scrim material, followed by an underlying cushioning by a channel molded in foam. Heating and cooling has been shown to be inefficient and requires a fair amount of "real estate" or spaces for airflow passages. Although this accepted conventional standard has a relatively low cost, it is ineffective when considering the amount of energy utilized. Further moisture build up is a concern with prior art methods.

During operation, of course, it is foreseeable that people driving those vehicles may experience spills of liquids, such as sodas and coffees, from fast food restaurants, being imbibed in the vehicle are bound to happen. These spilled fluids can penetrate the seat fabric and enter into the interior of the seat causing mold growth, foul odors and bacterial growth.

Another desire of the industry is to monitor the thermal status of the seat occupant without added sensors that add complexity and expense.

In addition, another common desire of seating manufacturers is to have a seat that would store or release thermal energy for use during periods when the vehicle is not running to improve comfort for the seat occupant upon entering a vehicle and being able to maintain the thermal storage capability for longer periods.

It would therefore be desirable to the vehicle seating industry if there was provided a new alternative technology with an improved conductive heat transfer that could heat and/or cool a seat or seat assembly, along with a method of making the seats, or a method of using them for heating and cooling seats. It would be advantageous for the industry to review such a new technology. Certain technical benefits can be realized by the utilization of a conductive heat transfer system utilizing thermoelectric devices.

SUMMARY OF THE INVENTION

In accordance with the above-noted desires of the industry, the present invention provides various aspects, including a conductive heat transfer model, a method of making same, a method of controlling same and various methods of using them for heating and cooling seats. This includes a heating and cooling device, preferably a new and improved thermoelectric module adhered to and in conjunction with at least one layer of a thermally conductive material for distributing the heat or coolness throughout more of the surface area. This overcomes many of the aforementioned problems with the prior art because energy consumption can be minimized, while heating and cooling distribution is maximized.

By using optional incorporation of phase change material schemes, the problems of an inability to be directly thermally charged in the seat assembly itself, along with issues arising from a lack of methods to extend their thermal capability over a longer time are alleviated.

Improvements on existing systems may also include sensing technologies that may provide an information feedback loop, along with new materials and new thermoelectric technologies to improve the seat cooling and heating, without generating moisture.

BRIEF DESCRIPTION OF THE DRAWINGS

For a further understanding of the nature and advantages of the expected scope and various aspects of the present invention, reference shall be made to the following detailed description, and when taken in conjunction with the accompanying drawings, in which like parts are given the same reference numerals, and wherein.

Figure 1:
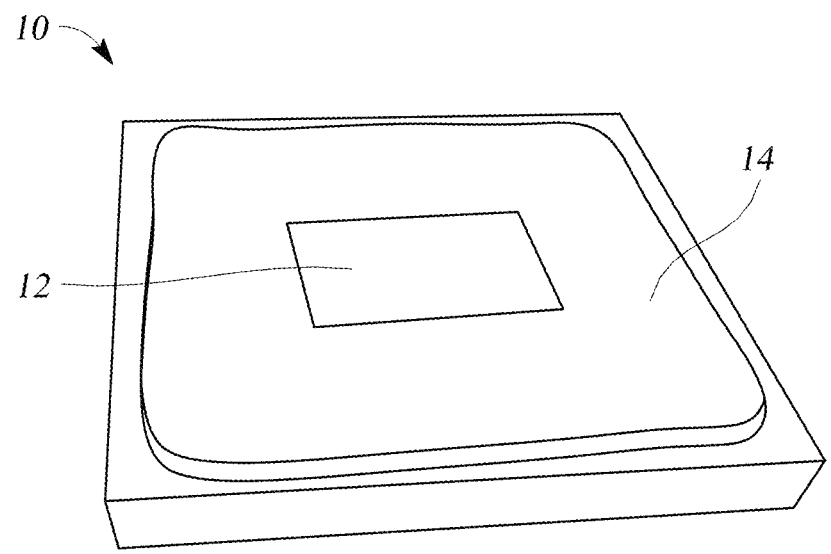
FIG. 1 shows the simplest aspect of the present invention with a thermoelectric module incorporated into a thermally conductive heat transfer pad to be incorporated into a seat, a seat assembly or as an aftermarket configuration.

Although the invention will be described by way of examples hereinbelow for specific aspects having certain features, it must also be realized that minor modifications that do not require undo experimentation on the part of the practitioner are covered within the scope and breadth of this invention. Additional advantages and other novel features of the present invention will be set forth in the description that follows and in particular will be apparent to those skilled in the art upon examination or may be learned within the practice of the invention. Therefore, the invention is capable of many other different aspects and its details are capable of modifications of various aspects which will be obvious to those of ordinary skill in the art all without departing from the spirit of the present invention. Accordingly, the rest of the description will be regarded as illustrative rather than restrictive.

DETAILED DESCRIPTION OF THE INVENTION

In order to provide the above referenced advantages to the industry, the present invention proposes a novel design using a unique combination of elements. In its simplest aspect of the present invention of a heated and/or cooled seat, garment or thermally controlled box, an integral heating and cooling device, preferably a thermoelectric device, shall be bonded to a flexible thermally conductive material for dissipating the temperature difference across an area. Basically, the thermoelectric module will act as a heat/cool source, while the thermally conductive material will distribute the heat/cool over a larger surface area.

As such, thermoelectric modules may be used as the integral source of heating and/or cooling, and when these thermoelectric modules come in thermal contact with the thermally conductive material, the heated or cooled temperature effect is spread out over a greater surface area due to thermal conduction. In order to accomplish a temperature gradient differential to heat or cool a seat, it may be preferable to utilize carbon-based materials such as graphite, for spreading the temperature difference out over a wider distribution area across the surface of the seat. New graphite included materials have a thermal conductivity from one to five times higher than copper, making conductive heat transfer an industrial possibility. This may be utilized for small area conductive heating and cooling, while still being strong and flexible as well as possessing high thermal conductivity. Of course, the material must be durable enough to withstand many years of people sliding in and out of the seat.

Such a superior heat transfer design system may use the recently improved thermoelectric materials, especially those made from bismuth telluride. These new materials have incremental improvements of about 2° C. These 2° C. changes of temperature can mean the difference between "almost cool" and "cool". This will provide a new avenue for the industry to provide cooling on seats. Materials improvements in the thermoelectric device can also be used in either improved forced air systems or for the entirely new concept in the present invention. Thermoelectric devices are solid state devices, and these solid state cooling devices can be attained with the new thermoelectric alloy and crystal growing processes.

Examples of the various aspects of the present invention are discussed in greater detail more fully hereinbelow, detailing various combinations of basic forms and optional components to enhance the heating and cooling aspects. These various aspects will be broken down into component-based options by paragraphs hereinbelow:

I. Combination Thermoelectric Module and Thermally Conductive Materials a. First, the Thermoelectric Module

In its most basic form, the present invention includes the use of an integral heating and cooling device, especially a thermoelectric heating and cooling device, in thermal communication with and attached to a flexible thermally conductive material in order to spread out the heat or coolness. This is especially useful underneath the seat of any seat assembly. The thermoelectric devices that are utilized may be any conventional thermoelectric device, but are preferably bismuth telluride based devices. These devices should operate efficiently from 10 to 16 VDC, as this range is compatible with automotive electrical requirements and other low-voltage applications. Preferably, the thermoelectric device utilized is a 127 couple bismuth telluride based device, some of which are commercially available from Tellurex Corporation of Traverse City, Mich.

Although it is possible that devices with a higher couple count could be used to increase efficiency, cost benefit analysis criteria are used to decide the design of the thermoelectric modules for each application and varied seat assemblies. Should the thermoelectric or other solid state devices of different chemical or mechanical makeup be developed that will improve performance or lower cost, clearly these would be able to be utilized in the present invention.

In certain aspects, the thermoelectric module could include P and N couples that are spaced further apart which would increase the size of the thermoelectric module and therefore increase the area of direct contact with the thermally conductive material described below. In this aspect, it may alleviate the need for a thermal transfer block, which also spreads the heat flow over a wider area to give a larger area of contact for the thermally conductive material. Another control for the thermoelectric module may be the use of pulse width modulation.

b. Next, the Thermally Conductive Material

The other part of the first aspect of the present invention will include a thermally conductive material that is suitable for distributing heat and cold generated by the thermoelectric module across a wider area than the surface of the thermoelectric device itself. Although there are many different thermally conductive heat transfer materials which are rugged enough to withstand seating and millions of entries and egresses in and out of a vehicle seat, the most common ones would include thermally conductive materials such as copper sheets or woven materials, thermally conductive polymers, carbon based conductive materials such as carbon fiber fabric or graphite fabrics, and including the recently available graphene nanoplatelets sheets. Since carbon based materials are strong and flexible in addition to being highly thermally conductive, they are especially suitable for the present invention.

Graphene in a single layer atomic thickness is extremely thermally conductive, i.e. from 2,000 to 4,000 Watts/meterKelvin in the X & Y axes. Practically, though, because of the lack of cross sectional area in the Z-direction, the actual heat that can be transferred is low. In other words, the thermal conductivity is very high per cross sectional area, but if the cross-sectional area approaches zero, the actual heat transfer is minimal.

Therefore, usable graphene for practical applications preferably employs many layers of graphene, often in the form of platelets, nanoplatelets, nanotubes and/or nanoparticles. Though using the graphene platelets in this form reduces the thermal conductivity per cross sectional area, the overall heat transfer can be very high because the cross sectional area is relatively large due to thickness in the Z-direction. In addition, these thicker graphene materials can be easily handled especially if bonded to a thin polymer film. As the development of this material advances, the thermal conductivity will also increase, upward of the 2,000-4,000 W/mK mark, though it is not known how close it will get to the "theoretical" limit.

The examples disclosed below utilize thermally conductive materials, some with 400-600 W/mK in thermal conductivity and some with 2000-4000 W/mK. Using multi-layers of thinner 400-600 W/mK material may increase the thermal conductivity to 1,500 W/mK. Of course, thinner multi-layer approaches increase the cost, are less available and are more difficult to work with, though this is certainly a possibility. Higher thermal conductivity graphene in low cost form is becoming available for materials in the 400-2,000 W/mK or similar range.

Further, a pyrolytic graphite sheet material tested with a higher thermal conductivity of 700-800 W/mK, including material of 1,500 W/mK. Pyrolytic graphite sheet material is a suitable thermally conductive material. Pyrolytic graphite fiber cloth of a pitch-based carbon fiber fabric, commercially available from Mitsubishi Plastics of Japan had a thermal conductivity of 800 W/mK. Because it was a fabric, it was great for flexibility. However, initial tests showed that the fabric weave, was not active in carrying heat in the cross-weave material. For example, in this trial, the pyrolytic graphite fiber cloth was bonded to a 3"×3" conduction plate. The strands that were linear with the heat conduction path carried heat and the crossweave material fibers, once it left the area of the conduction plate, were perpendicular to the heat flow and only communicated with the preferred heat transfer strands at circular points where the strands met. Therefore, thermal adhesives may be used to thermally connect all the fibers.

Although any thermally conductive material may be utilized with varying degrees of effectiveness, the preferred thermally conductive materials for the present invention include graphene nanoplatelet material with a thermal conductivity of from 375 W/mK to 2000-4000 W/mK depending on thickness and configuration, while commercially available pyrolytic graphite sheets with thermal conductivity of 650-1550 W/mK and pyrolytic woven graphite fibers, with a thermal conductivity of 800 W/mK is also suitable.

Preferably, the best carbon-based thermal conductivity material is sheeted materials of graphene nanoplatelets adhered to a thin plastic sheet in order to add strength. As the thermal conductivity of graphene is more than double that of copper, it is a suitable material for this application. Such graphene nanoplatelet sheets are preferably from 5 micrometers to 500 micrometers thick, and may be optionally bonded to a thin plastic sheet made of polyethylene, or any other suitable substrate in order to exhibit greater strength and resistance to ongoing stress and strain due to persons getting in and out of seats.

By utilizing carbon-based materials, heat may be transferred and distributed directly throughout the entire surface area of the conductive material, alleviating the need for air ducting and distribution, further simplifying seat construction and standardizing the design while still providing individualized climate control, thereby increasing design flexibility. In short, the present invention uses a heat transfer pad to distribute heat and cool, rather than using forced air. Standardization becomes possible because there will be minor differences whether or not a low weight passenger is sitting on the seat or someone of more substantial weight, such as happens when a substantially weighted person may crush the air ducts in conventional seats with heating and cooling capabilities.

In that regard, suitable graphene nanoplatelet materials are commercially available from many sources, including XG Sciences, of Lansing, Mich., USA, among other international distributors. Graphene nanoplatelets are suitable for the present application because this relatively new class of carbon nanoparticles exhibits multifunctional properties. The graphene nanoplatelets have a "platelet" morphology, as they have a very thin but wide aspect ratio. This unique size, shape and morphology tends to the make the particles especially effective at providing barrier properties while their pure graphitic composition gives them good electrical and thermal conductivity properties. They also can exhibit stiffness, high strength and surface hardness. Such materials may be used in a single layer, or any number of multiple layers in order to achieve the desired effect. For automotive seating, it is preferable that a single sheet is utilized, as it has a thermal conductivity of 400-500+ W/mK. As many of the grades of graphene materials are made of either nanoplatelets, nanoparticles, nanotubes or combinations thereof that are commercially available, typical surface areas which are able to dissipate heat may include from 5 to over 750 $m^2$/g., wherein the average particle diameters can range from 5 microns to over 100 microns. These sheeted graphene nanoplatelet or graphene nanotube materials are especially useful for dissipating heat once it is placed in direct mechanical and thermal contact with the thermoelectric device described hereinabove.

Further aspects of the invention may include the use of a thermally conductive plastic sheeted material with an inclusion of intermittent bits of highly thermally conductive components, such as carbon or graphene nanoparticles, graphene nanotubes, or graphene nanoplatelets in order to improve the thermal conductivity of the thermally conductive plastic sheeted material.

II. Combination Thermoelectric Module, Thermally Conductive Material and Perforated Top a. The Perforated Material

In addition to the above-mentioned basic thermoelectric module and thermally conductive combination, other optional aspects of the present invention may include further elements to be added to that combination. In this second aspect of the invention, the basic thermoelectric and thermally conductive combination further includes the use of a perforated material that will contact the person in the seat. The perforated material may include perforated leather, or any other suitable perforated seating material to allow air flow to the seat occupant and prevent moisture from building up due to condensation. Suitable perforated materials will allow air flow which will therefore improve seat heating and also provide improved moisture transfer.

III. Combination Thermoelectric Module, Thermally Conductive Material, and Phase Change Material Yet another element that may be utilized with the base thermoelectric and thermally conductive combination may include phase change materials capable of storing or releasing heat during a phase transition. This may provide additional capacity in the present application. The materials that are preferably associated with this aspect of the invention include hydrated potassium bicarbonate or other phase change materials could be used that are applicable to the phase change temperature that is desired for the application. Bear in mind that a phase change material has a high heat of fusion which is capable of storing and releasing large amounts of energy. In this instance, the heat is either absorbed or released when the material changes from solid to liquid and vice versa, which makes the phase change material a latent heat storage material. For example, a sodium acetate heating pad becomes warm when it crystallizes.

Certain organic phase change materials such as paraffin and fatty acids have very high heats of fusion and are safe and non-reactive, besides being recyclable and compatible with pretty much every conventional material of construction. Although they have traditionally been flammable, certain containment processes allow use in various applications.

Of preferred interest in this application may include inorganic salt hydrates, as they are non-flammable while still exhibiting a high heat of fusion. As described above, the preferred phase change material is a hydrated potassium bicarbonate. Of course, other phase change materials may be adapted for this application, and may include the eutectics or hydroscopic materials as they can absorb heat when their water condenses or they can release water when the water evaporates. Although not an inclusive listing, suitable the phase change materials include hydrated potassium bicarbonate, sodium acetate, paraffin, fatty acids, inorganic salt hydrates, eutectics, hydroscopics, hygroscopics, and combinations thereof. This may or may not be useful in terms of controlling the moisture content in a seat when certain dew point situations are realized.

In various aspects of the present invention, this combination of the thermoelectric module, thermally conductive material, perforated seats, and/or phase change material pads within the seat, or any combination thereof may make the seat usable to provide a more efficient system than the conventional air chamber type heating and cooling seats.

Of special interest in the present invention is that in certain aspects, there is essentially no movement of air necessary, unlike the conventional systems produced with split air chamber designs and utilizing significant amount of "real estate" underneath the seat. From a packaging and manufacturing standpoint, the thermoelectric module and thermally conductive material of the present invention is much easier for packaging, shipping and for placement in a seat during manufacturing. There are very few air chamber components that need to be manufactured and installed.

Further, the various weights of the human beings sitting on the seats hamper the design of prior art seat heaters and coolers, because the air chambers become compressed when an obese person sits on the seat versus a child sitting on the seat. As one can imagine, an obese person will compress the air chambers to the point where the air can no longer even distribute. The fact that the present invention does not rely upon air movement, gives much greater leeway to seat designers as well as the operation of the seat heater and cooler.

My design alleviates much of the moisture that is involved in seats during heating and cooling, and therefore does not even need to be addressed for moisture retention or vaporization. If no air flow exists, such as when there are no perforations to allow air flow, moisture can condense when it is cold. Using my invention, with even a 2° C. differential, and especially with perforations, the moisture problem is alleviated.

IV. Combination Thermoelectric Module, Thermally Conductive Material, and Phase Change Material with Perforated Materials Further comprising the present invention is the optional use of all these aspects including perforated top layer materials with phase change material utilized in combination with the first aspect of the present invention including thermally conductive material in order to store or release heat during a phase transition. Such a phase change material may be any substance with a high heat of fusion which, melting and solidifying at a certain temperature, is capable of storing and releasing large amounts of energy. As one may recall sodium acetate heating pads, it is realized when the sodium acetate solution crystallizes, it becomes warm. Such phase change materials' latent heat storage capabilities can be achieved through solid-solid, solid-liquid, solid-gas, and liquid-gas phase change. The preferable phase change for use in the present application is the solid-liquid change as it is most practical for use as thermal storage due to the small volume required to store the heat. Although conventional phase change materials may be organic, such as paraffin and/or fatty acids, inorganic phase change materials, such as salt hydrates, eutectic materials, which may be organic-organic, organic-inorganic, or inorganic-inorganic compounds, along with hygroscopic materials which may be advantageous due to their water absorption and release properties.

Preferably, as mentioned above, in this aspect the phase change material which can optionally be used in the present invention is hydrated potassium bicarbonate or any other phase change material which is applicable to the phase change temperature that is desired in the automotive or other seat assembly applications.

In addition, optionally, with any or all of the above-mentioned aspects, yet another element may be helpful in order to optimize the heat transfer. This element includes a thermally conductive interface which may be utilized to great advantage. Such a thermally conductive interface may be thermal grease, silver filled gels, filled waxes, or silicones. This interface will help to make full thermal contact between the components, increasing the efficiencies of each thermal communication.

Methods for making each of the above aspects include assembling each component as shown in the appended drawings, and applying a coating of thermally conductive interface between the thermoelectric module and the thermally conductive material, or the thermoelectric thermally conductive materials and the phase change material.

These benefits include, but are not limited to, the fact that all the power used in the fan can be used for ambient heat transfer via the heat sink which will improve overall performance. An ambient heat sink can be optimized for its purpose instead of fitting into the form factor required and using a portion of the air flow also for the cooling/heating of the seat occupant. This provides more freedom for thermoelectric module design, wherein the seat packaging can also be improved. Various shapes and sizes of the heating and cooling area are easily accomplished by utilizing various sizes of heat transfer materials and the thermoelectric devices. This also means that there is a reduction in designing for occupants with different weights because the thermal feedback loop can provide better control of temperature with the occupant being directly thermally coupled to the heated and cooled surface.

Looking now to the drawings, we look at FIG. 1, wherein the seat heater and cooler is generally denoted by numeral 10, and includes a rubber pad 12 and immediately thereunder and surrounding is a thermally conductive material heat transfer pad 14 which is then in turn in thermal communication with a thermal transfer block under the thermally conductive material heat transfer pad 14 and includes a thermoelectric device under and in thermal communication with a thermal transfer block, which in turn is in thermal communication with a heat sink with a fan below the heat sink. Heat transfer pad 14 may be made of any of the thermally conductive materials described hereinabove, such as graphene nanoplatelets, graphene nanotubes or the like.

Figure 2:
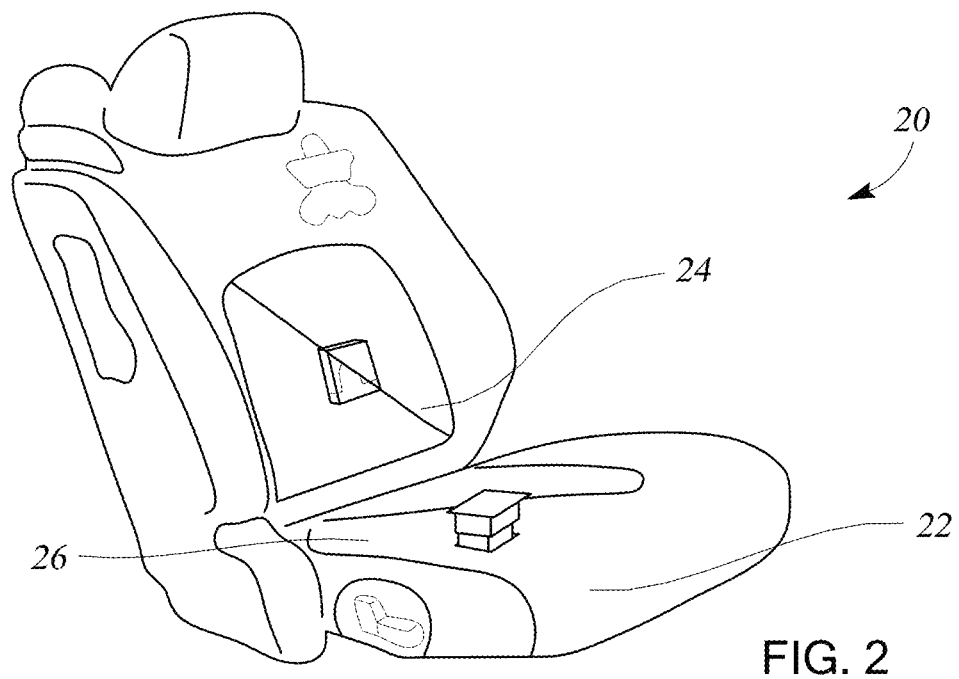
FIG. 2 illustrates a perspective environmental view of the present invention.

FIG. 2 shows the seat heater and cooler of FIG. 1 in its environment in an automotive vehicle seat assembly, and further illustrates the seat assembly generally denoted by numeral 20, with the seat heater and cooler 24 in place in the seat as well as in the back of the seat assembly 20. A thermoelectric device 22 is shown in a cutaway portion of the seat while the thermoelectric device 24 is shown within the heat transfer pad 26 on the back of seat 20.

Figure 3:
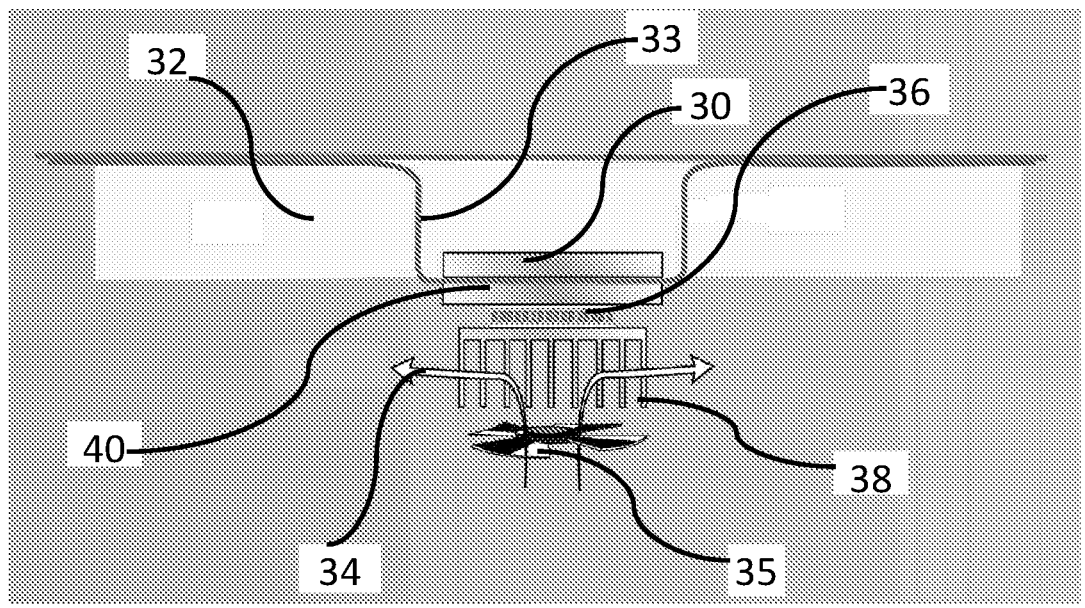
FIG. 3 is a side elevational view of a second aspect made in accordance with the present invention.

FIG. 3 shows in detail the thermoelectric device in combination with the various components comprised the entire heat transfer pad and seat heater and cooler. An upper thermal transfer block 30 is located on top of heat transfer pad substrate 33 which is then placed in thermal communication with a lower heat transfer block 40. Seat foam 32 acts as a support for the passenger, and holds the upper thermal transfer block 30 in place. The thermoelectric module 36 is in thermal communication with heat sink 38 for receiving air flow from a fan 35 through air flow 34 that is heated or cooled by the heat sink 38. In operation, fan 35 creates an air flow 34 from below to bring the air up into contact with the thermal sink 38 which is then in contact with thermoelectric device 36 and then to lower heat transfer block 40. Substrate 33 made of a thermally conducting material helps to dissipate the heat or coolness across its surface and also is helped by thermal interface 30. Advantageously, an optional thermal interface, such as thermal grease, silver filled gels, filled waxes, silicones or pads to name a few suitable interface materials. What was used successfully in the prototypes is Arctic Silver from AI Technology Inc. of Princeton Junction, N.J., may be used between the thermal transfer blocks and the thermally conductive material to provide a void free contact for best heat transfer.

Figure 4:
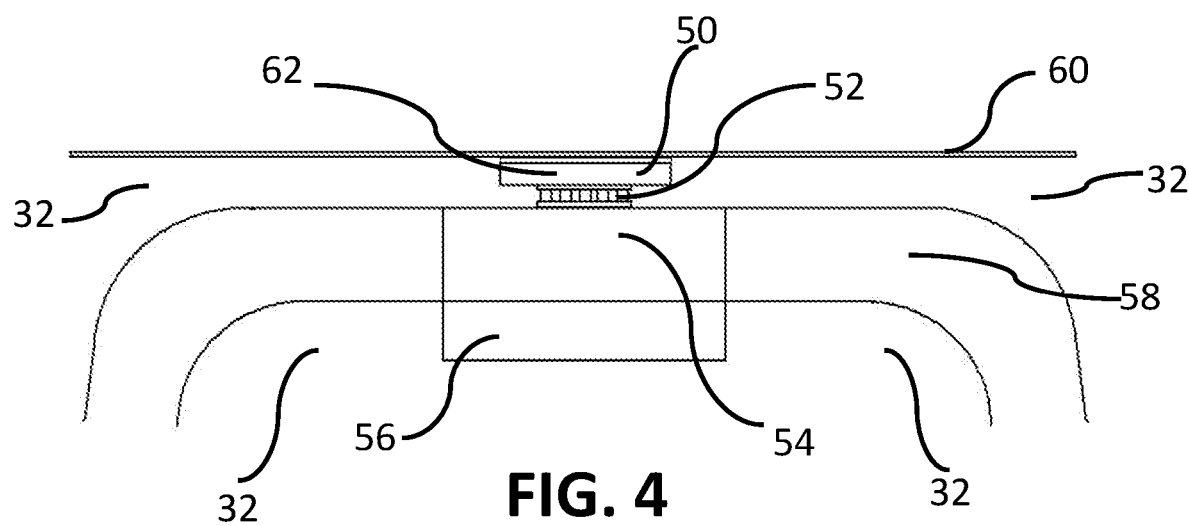
FIG. 4 is a side elevational view of another aspect of the present invention.

Looking next to FIG. 4, another view of the aspect shown in FIG. 3 is shown with a further cushioning aspect of seat foam 32, topped by and defined by a thermally conductive material layer 60 which is in thermal communication with heat transfer block 62 which is sitting on top of thermoelectric module 52. Seat foam 32 surrounds air chamber exit duct 58. Heat sink 54 is shown directly below and in thermal communication with thermoelectric module 52. Fan 56 is shown in its box configuration bringing air up into the heat sink area 54 for heat exchange and also exhausting any air through air chamber exit duct 58. Seat foam 32 is located between air chamber 58 and thermally conductive material 60. All of this is meant to heat up or cool down the conductive heat transfer material 60, which is preferably made of a highly dissipative carbon-based material, such as the graphene nanoplatelet material described in detail hereinabove.

Figure 5:
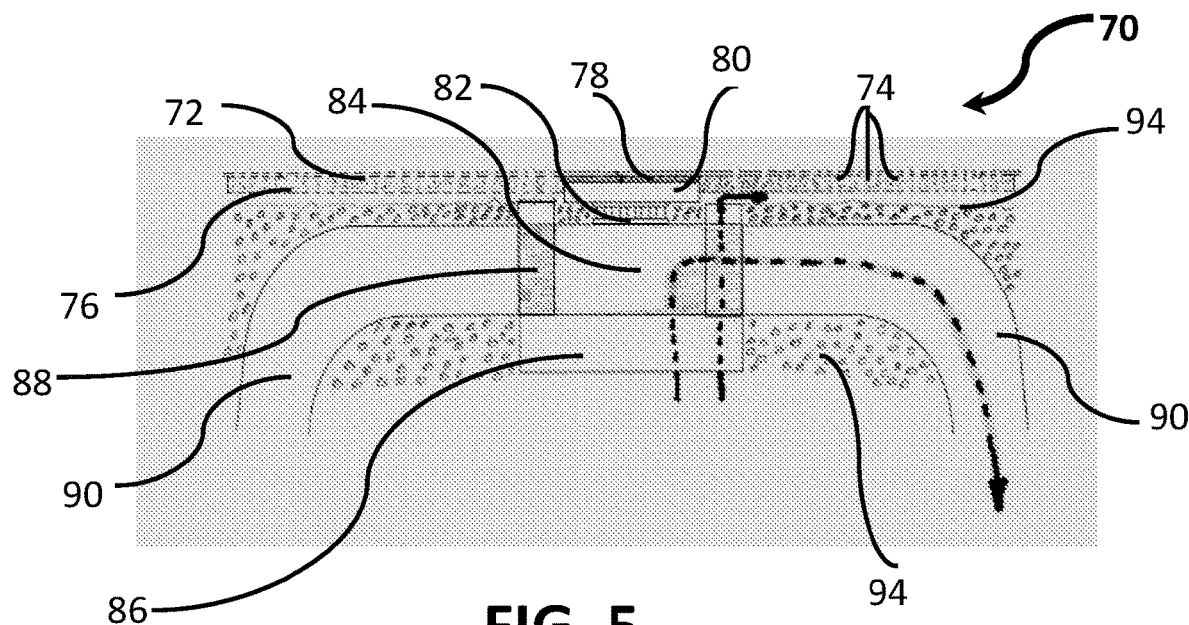
FIG. 5 is a side elevational view of yet another aspect of the present invention.

FIG. 5 shows yet another aspect of the present invention utilizing a fan, air chambers, and the combination of a thermoelectric module, thermally conductive material, a perforated seat cover, and a phase change material as described above. The seat heater and cooler is generally denoted by the numeral 70, and includes the flexible thermally conductive material 72 having perforations 74 therein. The perforations allow air flow to help to minimize the trapping of moisture, which alleviates the clammy feeling if the dew point is too low. Underneath the flexible thermally conductive material 72, a phase change material 76 is used to provide storage of heat and cool. The phase change material 76 is in contact with the thermally conductive material 72 which is in thermal communication with thermal interface 78 which is in direct thermal communication with the heat transfer block 80, which in turn is in thermal communication with the thermoelectric module 82 underneath. As in the other aspects, the thermoelectric module 82 is located in thermal communication with heat sink 84 which is heated and cooled by air coming through fan 86. Fan 86 moves the air through air passages 88 in order to put moving air in contact with the seat occupant primarily to reduce the chance of moisture formation on the seat surface and will exchange some heat with the phase change material and the thermally conductive material pad as it moves through the perforations though the main heat transfer mechanism to the occupant is via the thermally conductive material and then via the seat covering material (leather or other) that is in direct contact with the occupant. Fan 86 distributes the air through the heat sink 84, transferring heat to or from the heat sink 84, depending on the direction of the electrical DC current flow direction in the thermoelectric device and whether the seat occupant is to be heated or cooled, which is then exhausted into the ambient environment through air flow chamber 90, acting as an exit duct.

Phase change materials store or release heat during a phase transition. The materials presently associated with this invention include hydrated potassium bicarbonate. Other suitable phase change materials may be applicable to the phase change temperature that is desired. Phase change materials are used only in certain aspects of this invention. They provide short-term cooling or heating to a seat occupant, for example when the stops to shop for an hour and they would want to come out to a hot car that has a pre-cooled seat. Its performance can be engineered such that a thin insulating layer of material can be placed between the thermally conductive material to allow most of the heating or cooling provided by the thermoelectric device to act upon the leather or cloth seat covering and the seat occupant, while allowing a level of thermal leakage that either heats or cools the phase change material. When the car is in the rest position, such as in the case of someone shopping or at a doctor's appointment, the phase change material can release or absorb heat slowly as the thin insulating layer retards a high level of heat transfer. How this layer, or if there is a layer at all, is engineered is dependent upon the desired thermal requirements.

Figure 6:
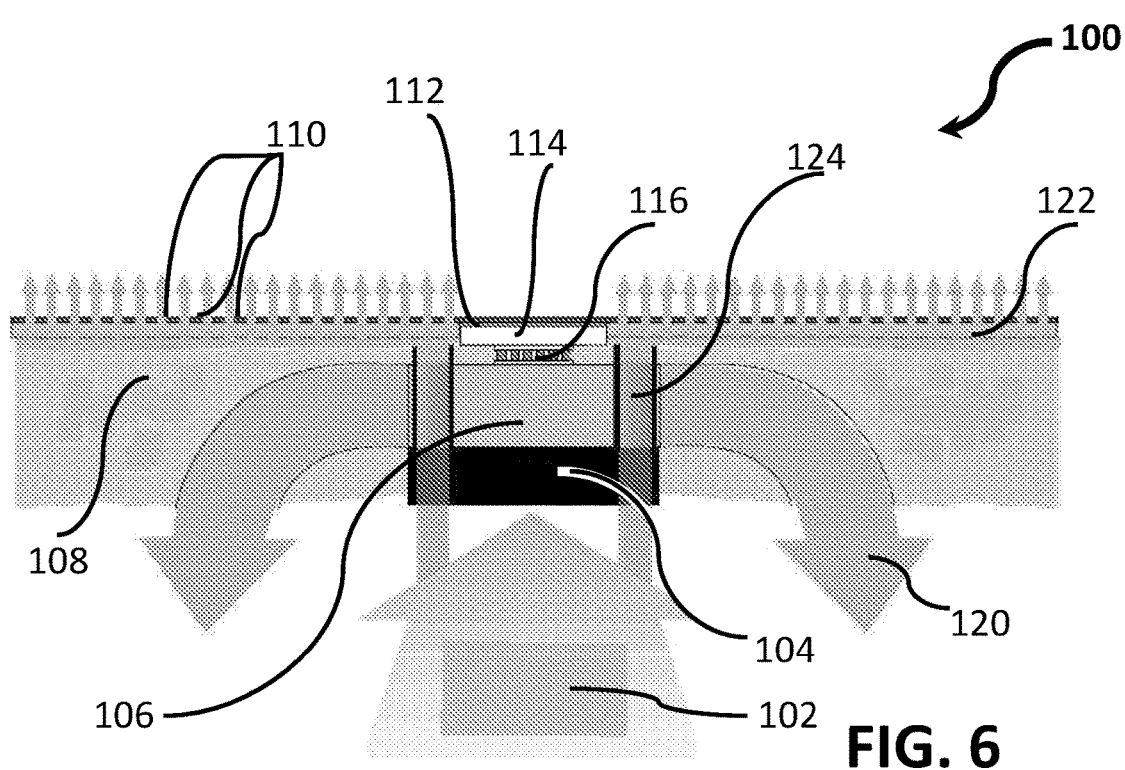
FIG. 6 is yet another aspect of the side elevational view.

FIG. 6 is yet another aspect of the present invention utilizing the perforated seat in conjunction with the thermoelectric module and the thermally conductive material pad for distributing heat or cool to the passenger of the seat. This aspect is generally denoted by numeral 100, and includes an air flow 102 coming into the fan 104. Fan 104 distributes the air through the heat sink 106, transferring heat to or from the heat sink 106, depending on the direction of the electrical DC current flow direction in the thermoelectric module and whether the seat occupant is to be heated or cooled, which is then exhausted into the ambient environment through air passage 120. Thermal interface 112 is in communication with heat transfer block 114 and thermoelectric module 116. The fan 104 also moves air through air passages 124 and up through perforated material 110 to provide air movement to the passenger on top of the seat assembly 100. Seat foam 108 surrounds air chamber 120 for circulating air.

Figure 7:
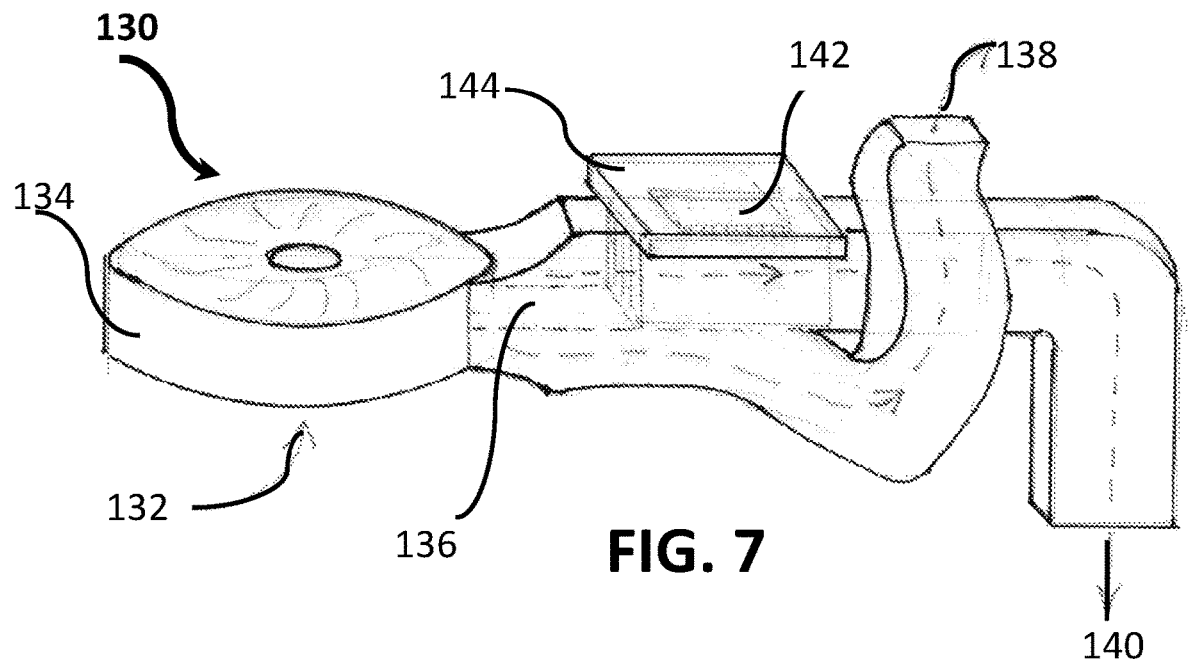
FIG. 7 is a perspective view of the fan aspect of the present invention.

FIG. 7 shows another aspect of the present invention and is generally denoted by numeral 130 in which air flow 132 enters into fan 134 which distributes air through an air splitting chamber 136. This low aspect ratio air moving design 130 also includes a thermoelectric module 142 which is in thermal communication with the heat transfer block 144. As the air transfers through air splitting chamber 136, it is directed through the seat 138 by ventilation there through, while exhaust air from the heat sink is exited through passage 140.

Figure 8:
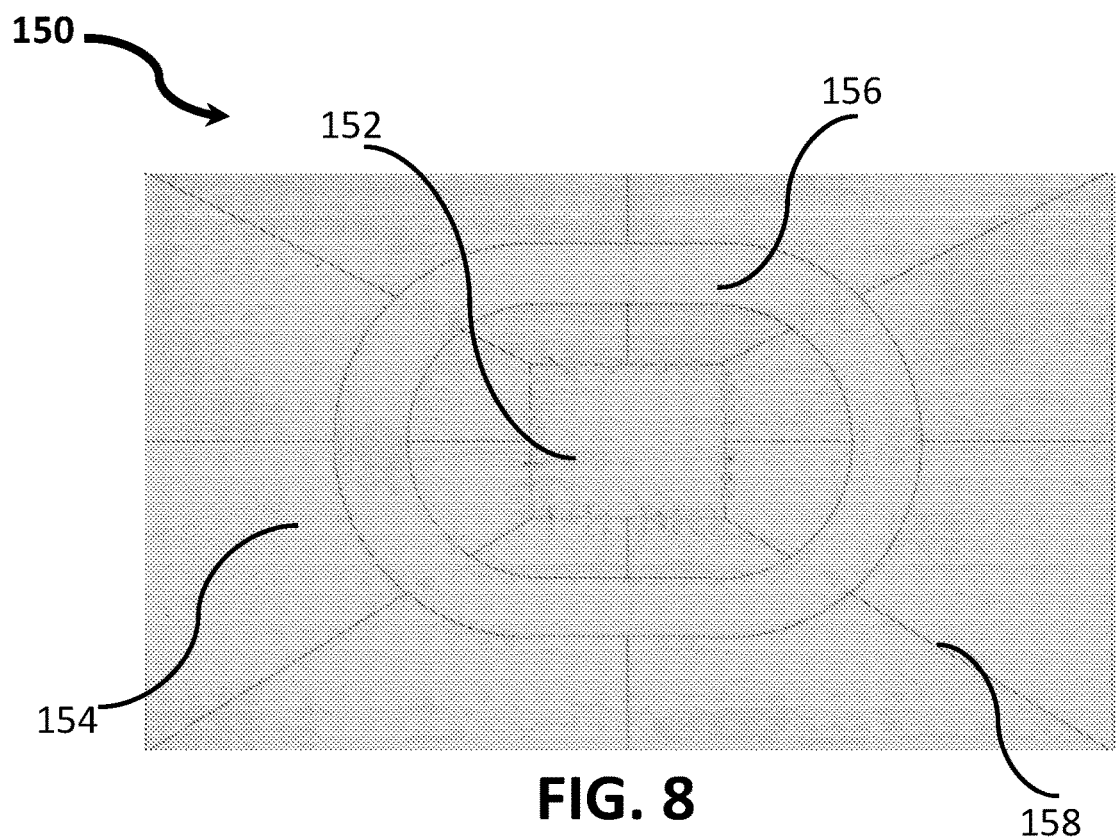
FIG. 8 is a top plan view of the multi-layer aspect.

Looking next to FIG. 8, there is shown a two layer carbon based thermally conductive material pad generally denoted by numeral 150 and including a thermally conductive plate 152 that is in thermal communication with the underside of the thermally conductive base material 154. Slits 158 in the bottom layer of thermally conductive material 154 remains in thermal communication with each of the various panels created by the slits by a top thermally conductive ring 156 so that the break caused by the splits in the thermally conductive base material remain in thermal communication with one another. This configuration of thermally conductive materials to fabricate the thermally conductive pad allows for extra flexibility and robustness for application where large downward deflections in the seat are common while maintaining overall high thermal performance. For example, if a bony kneed occupant kneels on the seat, exerting a great deal of downward force, their knee will not create any problems with the material.

Figure 9:
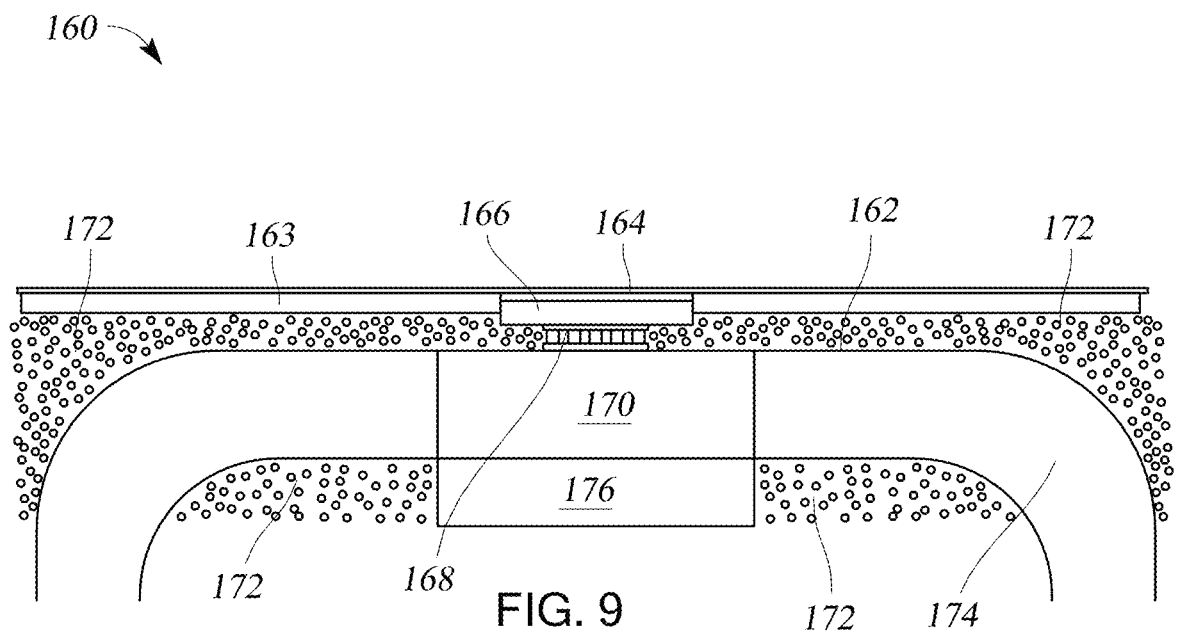
FIG. 9 is a cutaway view of still another aspect of the seat assembly utilizing the present invention.

FIG. 9 shows a cutaway view of yet another aspect of the present invention of a seat heater and cooler with an extended thermal lifetime, which is generally denoted by numeral 160, including the base elements of a thermoelectric module 168 in thermal communication with a thermally conductive material 162 in combination with a phase change material 163 to extend the life of the heating and/or cooling aspect of the phase change material 163. Preferably, an optional layer of thermal interface 164, such as a thermal grease or any other suitable interface material as described hereinabove, may be used to create a better connection for thermal communication. A heat transfer block 166 may also be utilized in a similar fashion as the aspects described above, in order to distribute the heat or coolness across a broader area. Thermoelectric module 168 would preferably be a similar thermoelectric module as the ones described above, which would be the heat or coolness source that is dissipated by heat transfer block 166. As shown in FIG. 9, a heat sink 170 collects the proper heat or coolness as it passes through from fan 176. Not shown are heat or coolness collecting fins in heat sink 170, as this angle shows the side of the last fin. An exit duct 174 is used for egress of air moving through the seat heater and cooling assembly 160. Seat foam 172 surrounds the exit ducts 174, fan 176, and heat sink 170. Fan 176 is shown in a side elevational view, so it appears as a fan underneath heat sink 170, which urges an air flow through exit duct 174.

Looking back at FIG. 9, it should be noted that FIG. 9 shows a seat heater and cooler assembly that incorporates a phase change material, without any air flow directly to the occupant, such as with the aspects above that included a perforated air flow seat design. Phase change materials can extend the life of a heated and cooled device without the need for electricity, because phase change materials utilize chemical reactions that are either exothermic reactions, which give off heat, or they may utilize an endothermic reaction, which absorbs energy, thereby cooling. Upon activation, the phase change material, preferably potassium bicarbonate in this aspect, will heat up or cool down, whichever is desired, and will keep that temperature for an extended period of time. Since phase change material is perfectly reversible, without any hysteresis, it can be used and reused many times over to provide the desired effect. Further, it can be used in combination with the thermoelectric device and the effect of the phase change material can be distributed over a larger area by the use of the thermally conductive material.

Figure 10:
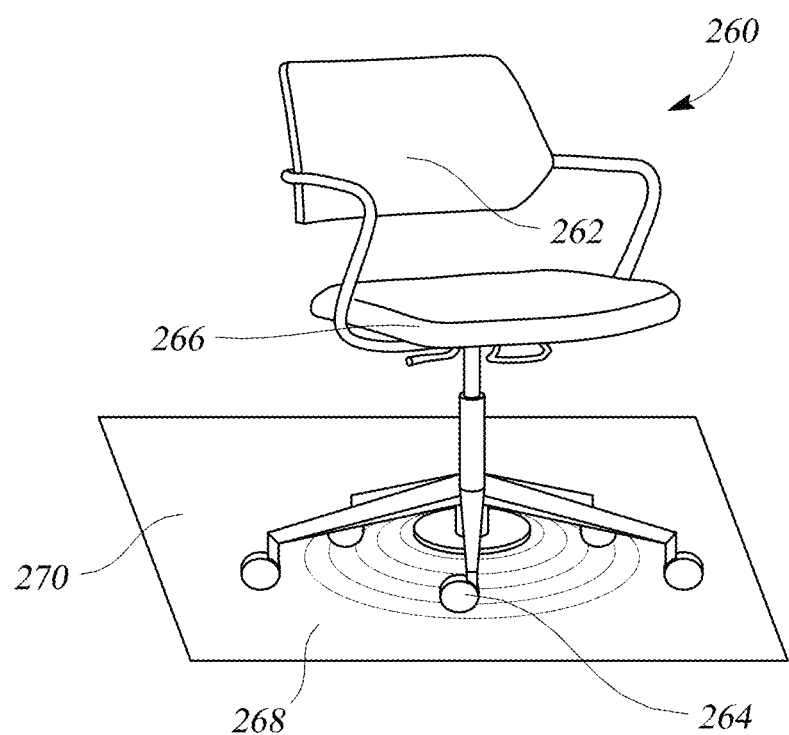
FIG. 10 is an environmental view of a vehicle aspect of the invention, including use in a chair with a recharger.

FIG. 10 shows yet a further aspect of the present invention, for use in, for example, an office chair or any other non-automotive application or in an automotive application where running electrical wiring is not desirable, a rechargeable system is disclosed and is generally denoted by numeral 260, including an office chair 262 having a heated and cooled seat 266. At the bottom of the office chair is a magnetic resonance receiver 264 which can be moved in close proximity to the embedded magnetic resonance transmitter 268 within floor mat 270. In operation, the magnetic resonance receiver 264 is placed over the embedded magnetic resonance transmitter 268, such that wireless recharging or powering of the heated and cooled seat 266 can be achieved. Power from the floor mat is transmitted by embedded magnetic resonance transmitter 268 wirelessly to the magnetic resonance receiver 264 when it is in proper location, thereby providing power to the heated and cooled seat 266 in the office chair.

In yet one more aspect, the present invention can include a superhydrophobic aspect for addressing moisture issues. The superhydrophobic material is envisioned on the top surface of the seat top material which would optionally be the uppermost layer in any of the above aspects. In that regard, and for some of the aspects hereinabove, a possibility exists for water to condense onto the cool surface of the heated and cooled seat surface. Air flow through a perforated seat and/or air chambers or ducts will move air, thereby effecting a remedy by evaporating the condensed moisture. This circulating air aspect was also noted above, in the aspect with air moving through perforations in the thermally conductive material. In this aspect, the use of a superhydrophobic surface is incorporated in the seat covering, whether it be leather or cloth. The super-hydrophobic surface propels water droplets from the surface of the seat by self-propelled jumping condensate powered by surface energy upon coalescence of the condensed water phase. This aspect can keep the seat surface dry when water condensate begins to form on the seat surface. Such a superhydrophobic material may be commercially available as "Never Wet", from Rust- Oleum of Vernon Hills, Ill., or a superhydrophobic material available from Lotus Leaf Coatings, Inc., of Albuquerque, N. Mex.

Furthermore, in certain aspects, the thermally conductive layer can act as an active thermal gate for heat transfer to and from the phase change material layer. For example, if during previous vehicle operation, the phase change material layer was cooled, and now the vehicle is parked on a hot sunny day and, under normal circumstances, the phase change material would then begin warming up due to heat transfer from the car seat outer covering, whether it be leather or cloth. In this example, heat would move from the leather or cloth outer car seat covering to the thermally conductive material layer to either directly to the phase change material, or in an alternate aspect, an intermediate variable insulating layer through to the phase change material layer. This variable insulating layer may be a layer of insulating or partially insulating material that separates the phase change material from the thermally conductive material. Determining the insulating value of such a variable insulating material will be dependent upon the expected conditions of use. If the heat pumping product is to be slowly imparted upon the phase change material, a more insulating layer would be chosen. In this instance this would mean that the phase change material would either take-in or give-off heat also at a slow rate, depending on whether the seat is in heating mode or cooling mode. This means that the seat surface temperature thermal response to the heat pumping of the thermoelectric system would be little affected. If one desired a more rapid thermal response of the seat surface temperature by the heat pumping portion of the system, a higher insulating layer would be more suitable and appropriate. Consequently, if an application requires quicker charging or discharging of the phase change material, a less insulating layer would be used.

On the other hand, if the thermally conductive material layer is to be activated in the cooling mode, via the thermoelectric device, during the period of time the vehicle is parked, thermal energy from the seat covering would be transferred to the thermally conductive material layer and pumped out of the immediate area, blocking heat transfer to the phase change material layer further extends the thermal storage time of the phase change material during times when the vehicle is non-operational times. As in the cooling mode noted above, the same type of operation can be affected in the heating mode during cold weather by using the thermoelectric device to pump heat into the thermally conductive material, thereby blocking heat from escaping the phase change material. The level of heat pumping acting as a thermal block to reduce heat transfer to the phase change material layer may be regulated to meet the requirements desired by the vehicle occupant in accordance with the vehicle manufacturer's specifications.

As one can imagine, a higher heat pumping level will require more electrical energy from the vehicle. Consequently, a higher amount of electrical energy is needed in the long haul, thereby negatively affecting the reserve power in the vehicle's battery. Time-temperature algorithms that properly match intended use with electrical energy consumption are anticipated by this invention. For example, by inputting commonly experienced vehicle cabin temperatures with preselected times or learned occupant usage patterns along with vehicle battery conditions, the amount of heat pumping and heat blocking may be easily optimized. Furthermore, it is envisioned that this control system can also simply be used as a timer, in its simplest form.

In addition, during certain aspects' operation of the seat cooling and heating method which only uses the thermally conductive material option without the phase change material layer, or the method that uses the thermally conductive material with air flow, one can use these same thermal controlling methods, materials and concepts for the parked or vehicle at rest scenario described hereinabove.

Figure 11A:
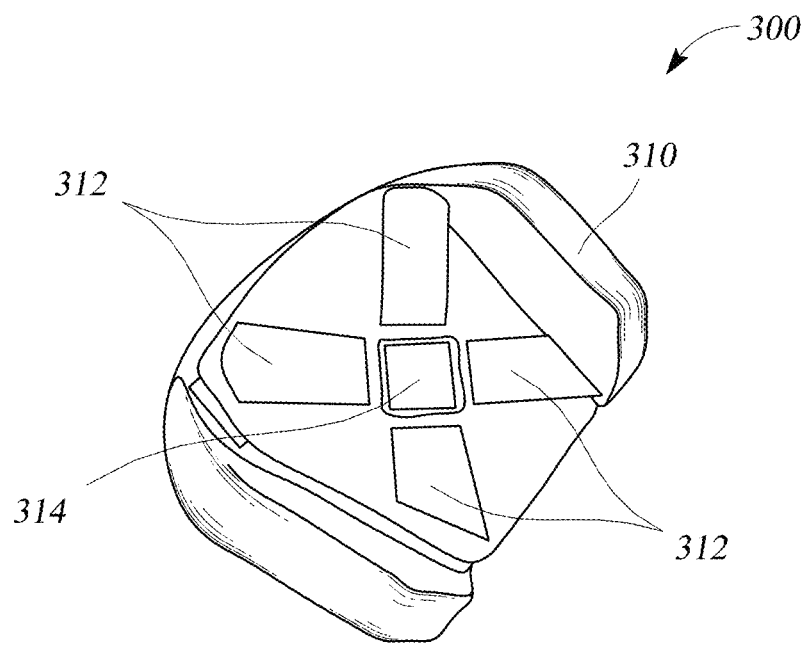
FIGS. 11A and 11B are top plan views of a seat assembly with graphene strips.
Figure 11B:
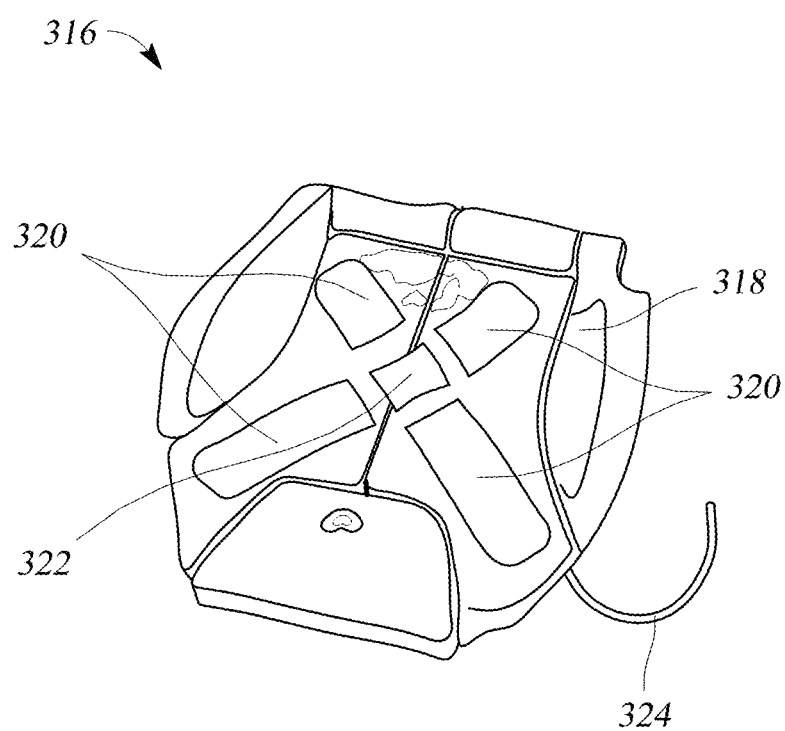

Looking next to FIG. 11A and FIG. 11B, there can be seen yet another aspect of the present invention utilizing strips of the thermally conductive material, rather than an entire sheet of material, like the one shown in FIG. 1. It appears that the less mass of the thermally conductive material used, the faster that the heat/cool is able to be disbursed. This translates into a faster response time to the passenger of the seat. Sensory response to this arrangement can vary with the individual seat occupant but what has been observed is that because smaller areas are heated and cooled, their temperature can be changed at a somewhat faster rate than when using full sheet, full seat coverage. This allows for a more dramatic response to the seat occupant and a sensory response that can seem faster. However, as one can note, a smaller area of the seat is heated or cooled. Optimization of the net covered area versus heating or cooling across the entire surface has been determined to be about 20% net covered area with strips covering up to about 50% net covered area. The thermally conductive material is in thermal communication with a thermoelectric device and acts to distribute heat and coolness across the seat.

Looking still at FIGS. 11A and 11B, seat assemblies generally denoted by numerals 300 and 316 respectively are shown attached to seat supports 310, and 318, and including thermally conductive material strips 312 and 320 in thermal communication with thermoelectric devices 314 and 322. Device 314 is shown covered with a foam block, while device 322 is shown without the foam block. FIG. 11A illustrates a foam piece that allows for near the same level of foam thickness across the seat for comfort. The graphene strips are in thermal communication with a heat transfer plate, much like the other aspects. The graphene strips emerge through the foam, just like that shown in FIG. 3. In FIG. 11B, this shows a heat transfer plate, which is in thermal communication with the graphene strips prior to the foam being put into place that will make it a more monolithic foam surface for comfort.

FIG. 11B shows an electrical wire 324 for electrical communication to a power source. Automotive seat assemblies generally use foam for comfort and support. Generally, polyurethane foam is preferred, and is well known in the art. In all automotive cooled/heated seat applications, while foam is still used for occupant comfort, it also acts as a thermal insulator to block the movement of heat from the thermally conductive material, which supplies the cooling and heating to the seat occupant, from being dissipated, un-doing its intended function. Whether the foam is common polyurethane, specially formulated polyurethane, or other polymeric material or whether it is made of another material such as cotton, synthetic fabric material, fiberglass, polyisocyanate foam, or natural batting material, the function is the same. Seating foam is commercially available through many automotive supply companies such as Johnson Controls Inc. of Michigan, Faurecia of Europe, or chemical suppliers such Dow Chemical Corporation of Midland, Mich.

Figure 12:
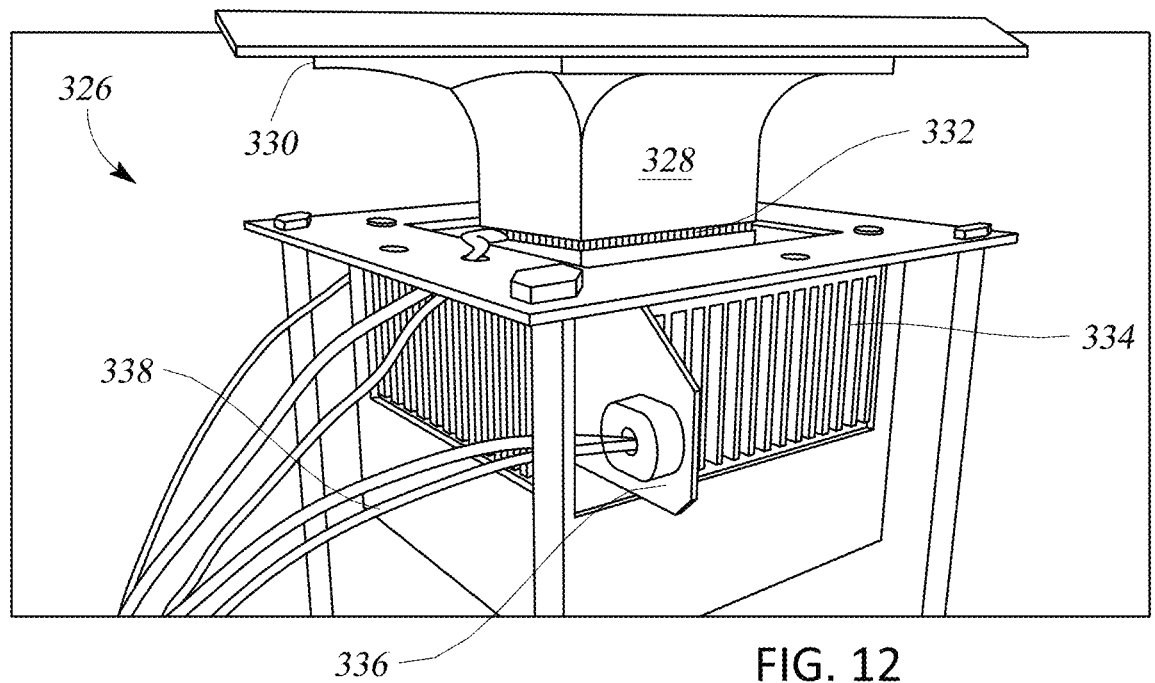
FIG. 12 is a perspective view of a heat transfer block and heat sink assembly.

FIG. 12 illustrates a perspective elevational view of an aluminum block heat transfer member generally denoted by numeral 326. An aluminum block 328 is in thermal communication with a sheet or strips of thermally conductive material 330, preferably graphene material. Aluminum block 328 sits atop thermoelectric device 332 for efficient heat transfer. A heat sink assembly 334 lies underneath the thermoelectric device 332, showing the vertically oriented heat sink fins. A fan 336 blows air across the heat sink fins and receives electrical power by electrical wire 338. Alternatively, aluminum block 328 may be replaced with a multi-layer assembly of thermally conductive strips adhered to one another as more fully described with reference to FIG. 13 below.

In this and all other aspects, preferred suitable thermally conductive flexible materials may include graphene nanoplatelet or nanotube sheets or strips, although any other suitable thermally conductive flexible material may be used. A particularly suitable thermal conductivity material used thus far in development of this concept includes the use of a graphene nanoplatelet sheet of 180 μm thick sheeted material made from a sheet of graphene nanoplatelet material bonded to a suitable substrate material, such as a thin plastic sheet, for added strength. In this aspect, the thin plastic sheet substrate may be any suitable sheeted plastic, but is preferably polyester or polyethylene, as these materials exhibit a bit of thermal impedance. A 220 μm thick sheet was also tested and found to be suitable. The thickness of the material shall be based on the area that requires cooling and heating. This determined thickness can range from 120 μm to 220 μm but other thicknesses may be used for certain applications. This material preferably has a thermal conductivity of 400-500+ W/mK. Such a suitable graphene nanoplatelet material is commercially available from XG Sciences, Inc. of Lansing Mich. Other materials have also been used include carbon fiber fabric and graphite fabric, such as some of the industrial materials purchased from several companies such as Mitsubishi Plastics of Japan.

Many possible thin sheeted substrate materials may be used onto which multiple graphene strips are glued to act as a low mass and lower weight support. Especially thin strong materials, such as carbon fiber material, a mesh of plastic or metal, or even a thin layer of fiberglass may be useful as a substrate onto which the multiple strips are adhered, forming a strong yet flexible structure.. This thin sheeted substrate material being adhered to the graphene strips or sheet may have many configurations, including a solid sheet, or a partial sheet, such as one with perforations, expanded foraminous slits, or any other configuration which would expose a net free area of contact from between 4% and about 50% to provide a more direct contact with the heat transfer materials without the thermal impedance of a covering layer. Using this multi-layer strip "paper mache" configuration may be most advantageous because it will heat up faster than a solid aluminum block, such as the one disclosed above in FIG. 12, because the system would not have to push all the heat or cool out of the aluminum block first before heat or coolness would be transferred to the surface of the seat. This configuration has a much smaller mass and better heat conductivity than a solid metal block.

In this and other aspects of the present invention, the use of a heat transfer block may be desirable. A heat transfer block allows the heat transfer area of the thermoelectric device to be increased, thereby increasing the thermal contact area of the thermally conductive material used to spread the heat to the seat occupant or to capture the heat from the seat occupant. This increased area reduces the thermal resistance of the heat pumping system. A heat transfer block can be of any thermally conductive material and is commonly aluminum and can be sourced from any commercial metal supplier. Alternatively, the multiple strip configuration described above may be advantageous. In some instances, the heat transfer block may not be required with the thermoelectric device being bonded directly to the heat transfer material.

Furthermore, in these various aspects, the inclusion of a heat sink may be desirable. The heat sink may be in the form of a common finned heat sink, which allows heat to be either taken away during the cooling mode from the sink or transferred to the sink during the heating mode by the passage of air. This type of heat exchanger can also be constructed of other metals such as copper or other thermally conductive materials such as carbon, graphite, or thermally conductive plastics. Other suitable air type heat exchangers may include folded fins, micro-channel configurations, liquid, and heat pipes. Another method is to use the same or similar type of thermally conductive material that is used in the seat for thermal transfer of cooling and heating and use it for the heat sink. This uses a conductive method to transfer heat to or from a source to the heat pumping device. As an example, a thermally conductive member can be attached to the metal floor of a vehicle. Heat sinks can be purchased from many suppliers worldwide such as Aavid Thermalloy LLC distributors throughout the world.

In addition, to increase the efficiency of this heating and cooling system, a fan may be desirable. The preferred fans include both axial and radial fans. These fans are used to pass air through a heat sink and in some applications of the present invention, also pass air through the seat cover to the occupant. Depending upon the size of the seat and the cooling and heating requirements, these fans can have capacities ranging from 5 cfm to 35 cfm of airflow and are preferred to be of a brushless design and electronically commutated. For large bench seating applications in open air environments, such as in golf cars, the fan flow rate may be higher. Other air moving means may also be employed such as piezoelectric fans, diaphragm air pumps, air flow multipliers or electrostatic air movers. An axial fan desirable in some of the aspects shown in the drawings are uniquely suitable because it provides for both passing air through the heat sink and also supplies flowing air to the seat occupant via the use of pass-through cavities in the heat sink. A rotary fan will split the flow of air so that some goes through the heat sink and some goes to the seat occupant.

Figure 13:
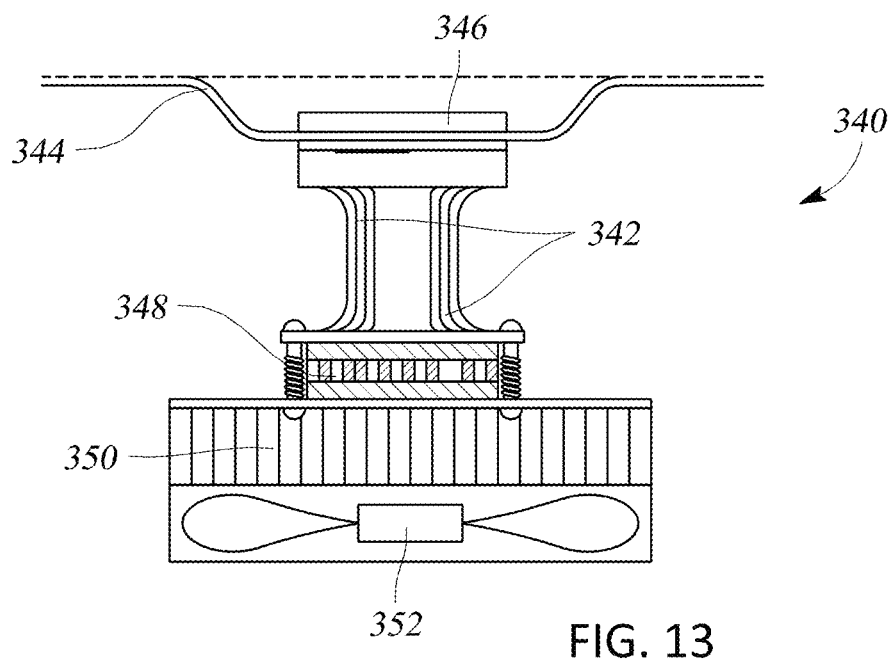
FIG. 13 is a side cutaway view of the assemblies of FIG. 12.

FIG. 13 illustrates an alternative aspect 340 to the aluminum block heat transfer block of FIG. 12, and indicates the use of multiple adhered layers 342 of the thermally conductive flexible material for the heat transfer block. This aspect is much like a "paper mache" build up of material to construct a heat transfer block member that thermally connects the thermoelectric device 348 to the graphene strips 342 distributing heat and coolness through the seat assembly, as shown above in FIGS. 11A and 11B. Preferably, in this aspect of the invention, multiple adhered layers 342 of nanoplatelet graphene sheets or strips are adhered together to form a somewhat flexible multi-layer thermal transfer block replacement for the previously described solid aluminum heat transfer block. By substituting this "paper mache" version of the graphene strips, a lower mass heat transfer member is achieved, while retaining strength and flexibility. This aspect was designed to provide more robustness and flexibility of the material in the event that more weight is pressed down onto the seat, such as when an obese person sits down or especially if he puts all his weight on his knee, thereby compounding the downward force at a pin point. The flexibility afforded by this structure was helpful. This multi-layer concept was tested and showed an improvement in the overall robustness of the conductive member of the invention, while maintaining good heat transfer properties.

Referring again to FIG. 13, it can be seen that the multi-layer strips could either be butt jointed to the top of the thermoelectric device 348 or the C-shaped configuration shown in FIG. 13 may be employed to increase the surface area contacting the thermoelectric device, or in another aspect, a thermal transfer plate 346 on top of the thermoelectric device 348 may be utilized. Heat sink 350 receives air from fan 352 and moves the air across the surface of the thermoelectric device 348. Graphene sheet 344 is secured atop the heat transfer plat 346 which transfer temperature to graphene sheet 344 to distribute heat and/or coolness. Although not shown explicitly, the base layer of the bottom of the C-shaped thermally conductive material was tested in two different configurations, i.e. in direct bonded contact with the heat transfer block or being directly bonded to the thermoelectric module itself, depending on the design. The bottom of the C-shaped configuration is a multi-layer structure bonded with a flexible adhesive heat transfer material. Suitable adhesives for any of the aspects of the present invention may include any thermally conductive interface, including thermal greases, silver filled gels, filled waxes, silicones, pads or any combination thereof.

Preferably the thermally conductive adhesive is a reworkable, aluminum nitride filled, electrically insulating and thermally conductive paste type adhesive, although any suitable adhesive may be used. In this example, such a suitable flexible epoxy adhesive may include Prima-Bond® or Arctic Silver®, adhesives, both commercially available from AI Technology, Inc. of Princeton, N.J.

In the preferred aspect, the base layer was slit to allow for more deformation during use. Greater deformation is needed in instances such as when an obese person puts his knee on a car seat and puts a significant portion of his body weight on top of a relatively small area of the seat, without crinkling the multi-layer. The second layer elastically and physically holds the slit sections in place and provides for heat transfer between the slit sections so as to maximize heat transfer between the sections and prevent any hot or cool sections relative to the other sections (temperature uniformity).

For all aspects of the present invention, suitable thermoelectric cooling/heating devices may include any commercially available thermoelectric device. The preferred thermoelectric devices are 127 couple bismuth telluride based devices, as they operate effectively at 10-16 VDC, which is compatible with automotive electrical requirements and other low voltage applications. It is also possible that devices with higher couple counts will be used to increase efficiency. Such suitable thermoelectric devices can be purchased from several manufacturers such as Marlow Industries of Dallas, Tex.

Yet another aspect of my invention includes apparatus and methods for the vehicle operator to have the capability to communicate to the vehicle that they would like the car seat to be pre-cooled or pre-heated before they enter the vehicle. The thermal seat portion of the invention can be activated by wireless communication from the operator via a mobile communication device or key fob.

Furthermore, in still another aspect of the present invention, the thermoelectric module that is a part of this invention can act as a sensor. In prior art air-only based seat heating and cooling systems, the thermoelectric module is thermally separated from the seat surface and the seat occupant. However, in my invention, the occupant is in thermal contact with the seat cover, which is in contact with the thermally conductive material which is in contact with the thermoelectric device. Thermoelectric devices, while being able to provide heat pumping bi-directionally, can also produce electrical energy via the Seebeck effect when there is a temperature difference between the two planar sides of the device. Therefore, utilizing this electrical generation aspect of this invention, heat from the occupant can be used to generate electrical energy that can be directly related to the temperature of the occupant and become a temperature sensor. The temperature information can be used to help control the temperature of the seat occupant and automatically aid in turning on or off or modulating the heat supplied to the seat occupant or the heat removed from the seat occupant providing optimal comfort.

Figure 14:
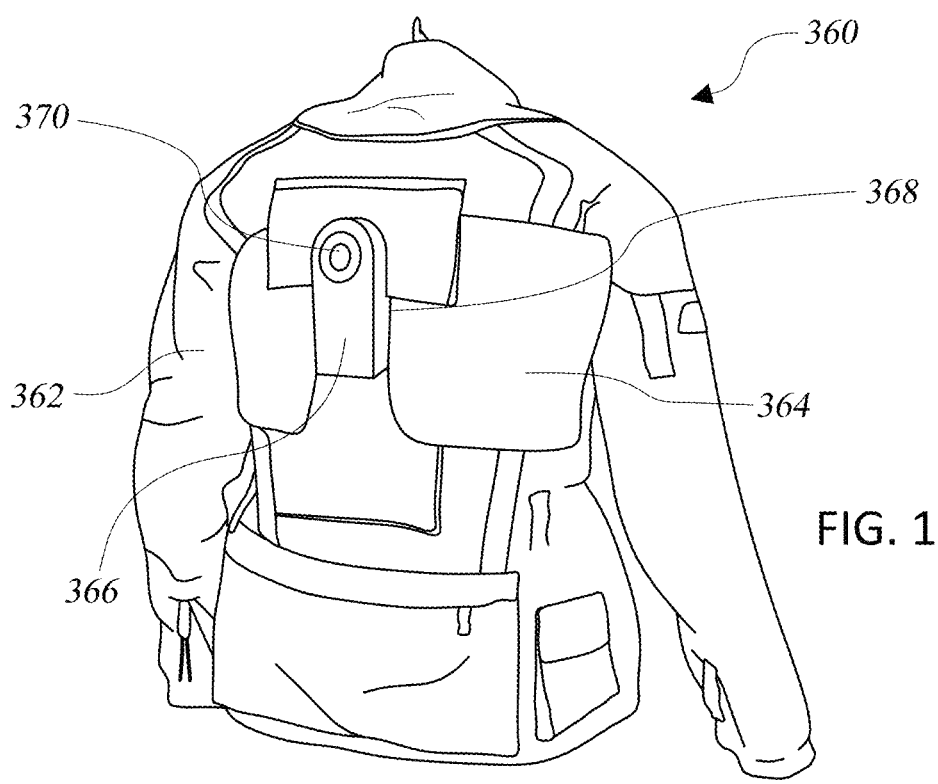
FIG. 14 is a back view of a heated garment.

FIG. 14 illustrates yet another aspect of the present invention with a thermally controlled garment generally denoted by the numeral 360. Jacket 362 includes thermal controls on its back to keep the occupant warm and/or cool in accordance with the present invention. Heat distribution sheets 364 surround at least a portion of the inner layer of jacket 362, and these heat distribution sheets are in thermal communication with thermoelectric device 370 and heat sink 366 through heat transfer plate 368. As with other aspects of the present invention, the thermoelectric device and the heat distribution sheets are in accordance with the descriptions hereinabove. Thermoelectric device 370 may be used to either heat or cool the garment, providing comfort and temperature controls for the wearer of the garment. Thermoelectric device 370 can be powered either by a battery or can be plugged into any outlet, such as one on a motorcycle, a snowmobile, or a boat.

Looking again at FIG. 14, It must be noted that such a jacket 362, or any other garment incorporating the heating and cooling technologies of the present invention, can be utilized for firemen, Coast Guard boats men, military applications and the like. In these instances, since they would be out-of-doors applications, and the garment would not be anywhere near an electrical outlet, a battery power pack would also be an advantage.

Garment 360 can exhibit gradient heating and cooling zones by insulating portions of the path for the thermal distribution, thereby intensifying the hot/cold at a particular location distant from the thermoelectric device. This is an attribute that is unachievable with electrical wiring systems.

Figure 15:
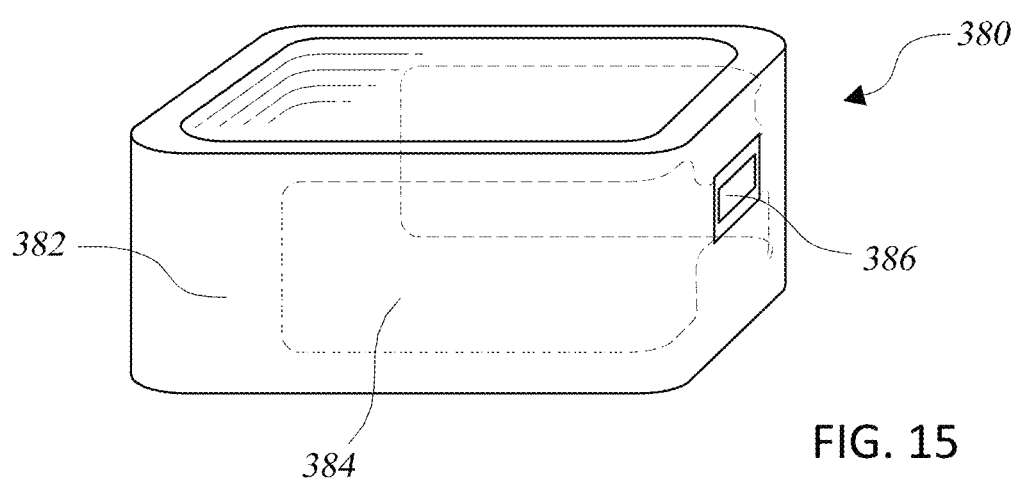
FIG. 15 is a perspective view of thermal box.

Looking next to FIG. 15, a refrigerator or heater box generally denoted by numeral 380 includes a box container 382 with a heat distribution sheet 384 surrounding the cavity inside the box 382. Thermoelectric device 386 is in thermal communication with heat distribution sheets 384, providing heat and or coolness to the contents of the box. This is a great advantage over the prior art because previously uncontained liquids, such as melted ice, could not be included in the cooling boxes as they might harm the fan. In the present aspect of this invention, water in the box does not matter. Again, this box can either be activated electrically through an electrical output through a wire or through a battery pack. In addition, the exterior of the box can be constructed such that the outer skin is of graphene material and provides the heat sinking that may be normally supplied by a heat sink and fan.

In all aspects, if the device is only to be used in the cooling mode, the heat sink could be comprised of a heat pipe to reject the heat from the hot side of the thermoelectric device, providing a greater cooling efficiency. Likewise, a thermally conductive material, like graphene, could be use on both sides of the thermoelectric device. The thermally conductive material on the hot side could be conductively attached to a heat dissipation member, such as the auto body cockpit floor of an automobile, to dissipate heat without the use of a fan or other mechanical heat dissipation device.

Figure 16:
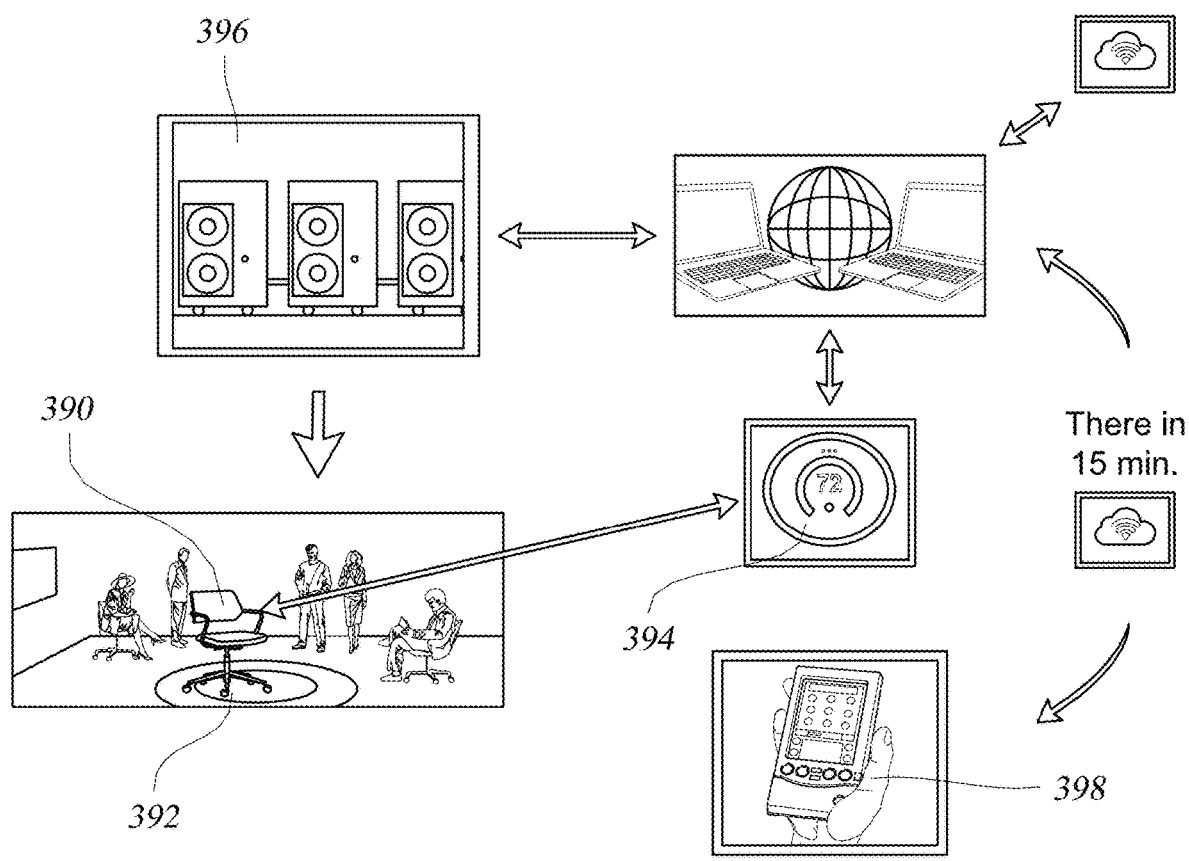
FIG. 16 is a flow chart of the Internet of Things application for heating.

Referring next to FIG. 16, a new thermal control technology via the Internet of Things (IoT) is made possible with the present invention. Office chair 390 is in electrical communication with a magnetic resonance or inductive recharging pad 392. Especially in the office chair application, as previously disclosed in the description of FIG. 10, controlling operation of the cooling and heating functions as they relate to the temperature in a building and providing information on the seat occupant and use of the chair is accomplished by integrating the seat cooling and heating system with control technology. As already noted above, the cooled and heated seat system can act as a sensor, providing a wireless signal to a smart thermostat 394, which is in communication with a computer that controls the temperature settings of HVAC system 396.

When a person sits in seat 390, the thermal energy from the person is transmitted via the heat distributing graphene to the thermoelectric device. The transmitted thermal energy creates a temperature differential between the two sides of the thermoelectric device and electrical energy is then produced. This electrical energy can power a transmitter that can indicate that there is someone sitting in seat 390. When connected wirelessly to a smart room thermostat 394, thermostat 394 and building HVAC system 396 can know that a person is sitting in their seat and, sensing the temperature of the building space and the normal desired seat temperature of the seat occupant, transmits to the seat the proper set temperature desired by the occupant, initiating either cooling or heating of the seat via the seat cooling/heating system.

The thermal control technology can also function in such a way that the seat transmits a signal to smart room thermostat 394 that the seat is being occupied and is cooling or heating to a certain temperature and smart room thermostat 394 communicates with the building's HVAC system 396 and provides less cooling or less heating to the space because the individual in the seat is comfortable in their personal space and does not require the building to fully provide for the occupants thermal comfort.

By providing individualized comfort for the seat occupant in their seat due to operation of the cooling or heating process provided by the seat, the temperature of the conditioned space can be allowed to be either warmer or cooler than would normally be provided, reducing the energy required to maintain the conditioned space's temperature. For example, in a building where summer heat requires the cooling of the building, a person in a thermally controlled chair can maintain their personal comfort even if the building is allowed to drift up in temperature by several degrees. Not having to provide as much air conditioning saves energy.

Another aspect of the heated and cooled seat technology that is communicating with other devices by the Internet of Things (IoT) is that the building operator can know which seats are being occupied and where they are occupied and adjust the thermal control for the space accordingly. Other aspects of the building's systems can also be optimized such as lighting and security systems. In addition, via the cloud, the system can communicate seat use parameters to the seat manufacturer or building owner so as to gather information on how the seating system is being used and use this information to improve the seat user's experience.

Mobile phones can communicate to the chair with information as that the office worker will be arriving to sit in the chair soon, so the chair can be thermally preconditioned upon the seat user's arrival or to set the preferred temperature for the chair. Via a mobile device, a seat occupant can control chairs in different portions of the building if they are moving to another seat for a meeting.

In a like fashion, extensions of the technology can be utilized with the above-mentioned thermally controlled garments. By using the same thermal engine used in the seating application, the heating and cooling system can be used to control body temperature. In this application, the graphene material is positioned to wrap around the garment wearer and provide thermal control in both heating and cooling modes. Though the drawing shows a jacket as the garment, other garments can also be thermally controlled in a similar manner. Phase change material, as noted above for seating applications, can also be employed in this application.

The present invention can be used to thermally control the thermal box from above. Using the same thermal engine, the system can be used to heat and cooled insulated spaces such as a 'cooler box.' Present thermoelectrically heated and cooled cooler boxes, like those made by Igloo Products Corporation or Coleman International of Kansas, use air that is heated or cooled by passing box interior air through a heat sink. Therefore, liquid levels in the box must be maintained below a certain level or damage to the system can result. Ice, for example, should not be used in these coolers. When the ice melts, water can easily penetrate the fan/heatsink/thermoelectric module/wiring and cause failure. The present system wraps the thermally distributing graphene around the inside wall of the cooler box, or molded into the interior box liner, and is thermally connected to the thermoelectric system in the same way as the seat cooler/heater.

The following applications for my heating and cooling technology are envisioned for the present invention. First, there are heated and cooled seating applications for vehicles of all types, such as automobiles, farm equipment, as well as other seating applications for office furniture and the like. Although this invention is not limited to the following, some of the applications will include automotive seating, truck seating, motorcycle seating, off-road vehicle seating, golf car seating, heavy equipment seating, farm equipment seating, office chair seating, military vehicle seating, airplane seating, wheel chair seating, therapeutic blankets, therapeutic bedding, therapeutic wraps, hyperthermic cancer and other treatment beds, cooled and heated surfaces in automobiles, cooled and heated surfaces—general, cold-chain medical, food, chemical thermal storage boxes, heated and cooled garments, industrial process temperature controlled surfaces, biological incubation apparatus, digital display temperature control, thermal chromic signage and displays, thermal control of batteries, heated & cooled automotive steering wheels, led cooling plain, electronic circuit board thermal maintenance, cooled/heated large format food display and serving surfaces.

Figure 17A:
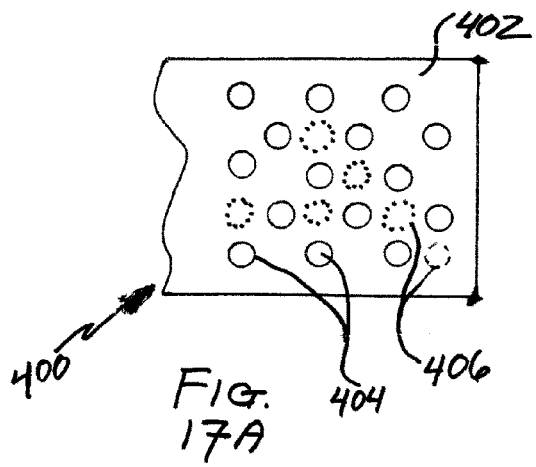
FIGS. 17A-17E show variations of a sheeted thermal conductive material.

FIGS. 17A through 17E illustrate variations of devices and methods for improving thermal conductivity in the Z-axis in specific areas, especially in the area where the heat is transferred from the thermoelectric device, usually by a thermally conductive member or thermal block. It can also be directly attached to the thermoelectric device. In describing these variations on how to accomplish this, a perforated plastic or other film layer such as those described in FIGS. 17A-17E. FIG. 17A illustrates a top or bottom view of a sheet of film layer, preferably a plastic or polyurethane layer, wherein perforations can exist on either one side or both sides, depending upon the application. If it is on both sides, as is shown in FIG. 17 see, the holes are preferably offset so as to maximize strength of the substrate film layer. However, any suitable substrate may be used besides a plastic film.

Figure 17B:
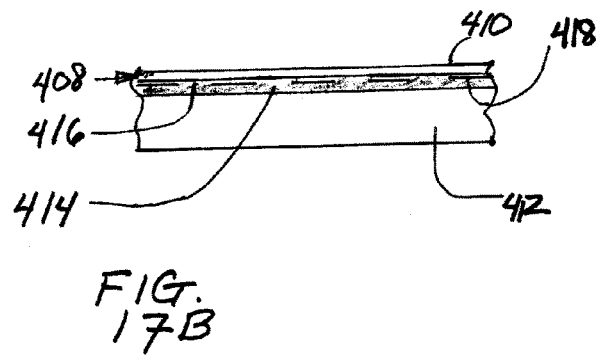

FIG. 17A generally denotes a film layer by the numeral 400, and includes a sheeted film 402 having perforations on the top 404 and shown in phantom are underneath perforations 406. FIG. 17B is a side view of the film of FIG. 17A, illustrating the relative placement of a heat transfer block 412 in contact with a thermal interface compound 414, having extruded through perforations 416. Once the thermally interfacing compound squeezes into perforations, it makes intimate thermal contact directly with the graphene 408 resulting in a higher thermal conductivity contact.

FIG. 17 C illustrates a perforated film with perforations on both the top and the bottom. Plastic film 420 has perforations 422 formed therein with a sheet of graphene 424 lying there between for strength. Thermal interface compound 426 oozes between the planar surfaces and provides a complete thermal communication contact between the elements and the heat transfer block 428. Under high pressure, graphene platelets will extrude into the void areas left by the perforations in the film layer which is used for support. This results in a planar surface where the graphene material is filling the voids and the thermal interface compound just provides the interface between the planar surface and the heat transfer block.

In yet another aspect, FIG. 17 D illustrates a thermal contact area by the voids in the film. In this aspect, the heat transfer compound 436 squeezes into the void areas in the film layer, showing where graphene layer 432 is intermediate between the film layer 430 on top of heat transfer block 434.

In yet another variation of the film layer, FIG. 17 E shows another aspect of the present invention wherein a needle plate is disclosed to make better thermal contact. In FIG. 17 E, film 440 surrounds a sheet of graphene 448. Atop thermoelectric device 444 is heat transfer block 442 which includes thermally conductive needle-like members which extend up through thermal transfer compound 446 to make contact with graphene layer 448. By the inclusion of needles on the heat transfer plate 442, greater surface area is incorporated and therefore better heat transfer can be obtained. The heat transfer needles may penetrate the film layer into the thermally conductive material. The heat transfer block with its needles are preferably made of a highly thermally conductive material such as copper, aluminum, magnesium, pyrolytic graphite, or combinations thereof.

In this aspect, the needles penetrating the graphene take advantage of the extremely conductive X and Y axis thermal conductivity of the graphene and transfer heat into or out of the graphene in the Z axis.

Thermal Pad Wrap

An additional aspect of the present invention is a heated and/or cooled garment including a therapy wrap or pad that heats and cools a body part or a larger portion of the body. The graphene material allows for flexible heat transfer of thermal energy when combined with the thermoelectric device. The system has been tested and is quite effective. Depending on whether heating or cooling and what battery pack is used, the continuous operating time is approximately 2-7 hours. With improvements in battery technology, this will be extended.

Currently, the inventor is unaware of any system that can both heat and cool, as prior art systems either heat or cool, but not both, with one device that is also small and light-weight enough to be wearable. Liquid cooling and heating systems exist that pump a liquid from a large central heat exchanger through a tube or liquid bladder that is placed on the body. Electrical systems exist that are battery powered, using resistance heating. For thermal therapy, cooling is done generally with a bag of ice with a towel or some other fabric to reduce the heat transfer from the body so as not to overcool or freeze the flesh. Phase change materials are also sometimes used. To both heat and cool, two different means must be presently used or one means with liquid tubes connecting the body contact pad with the stationary heat exchanger.

This system heats and cools and can be temperature controlled to provide the desired thermal therapy. A heating cycle can be immediately followed by a cooling cycle or vice versa. One of the benefits of the system is that it can be tetherless, allowing the wearer to have freedom of movement while using the device.

When wirelessly connected the device can be operated by the user via a mobile device. The heating and cooling regimen prescribed by a healthcare provider can be downloaded and the unit can also use present "favorites" of heating and/or cooling.

Graphene in this application must be able to flex and conform to the body. To accomplish this, the graphene is preferably a woven material, which is then conformally coated with a silicone based material, such as Dow Corning 3-1953, commercially available from Dow Corning Corporation of Midland, Mich. For some body parts like the back or chest, where multi-dimensional body conformance is not as important, graphene in sheet form can be used.

Within the heat sink/fan and control shroud assembly, a power cord is the means of attachment of the system to a battery or other DC power source. A switch in the shroud allows for switching polarity to the TE device and a multi-colored LED indicates whether the unit is heating or cooling. Multiple LED's, or LED bar graph lighting indicating different levels of heating or cooling can also be used.

The control system shown is a simple polarity switch and LED indicator. However, the controls can also include pulse width modulation to allow for a variable amount of electrical energy to reach the TE device, allowing varying of levels of heating and cooling. A simple attenuator circuit can also be used to vary the power to the TE device.

The controls can also be connected to the Internet of Things directly from a mobile communication device or computer. This allows for settings to be downloaded from a health practitioner or set by the user as a "favorite." This may entail the alternation between heating and cooling cycles.

This particular therapy wrap is for the elbow, but any body part can be accommodated by varying the wrap design and changing the shape of the graphene. The graphene is between two layers of neoprene material, though other materials could be used. A battery is shown connected to the system. The battery used can vary. The batteries tested and used were Tenergy lithium polymer and Sanyo lithium ion with different batteries varying from about 7 VDC to 11.1 VDC. Also, not shown is a thermistor that can monitor the temperature of the graphene to insure safe use in heating mode. A simple bimetallic thermal overheat switch can also be used.

Figure 18:
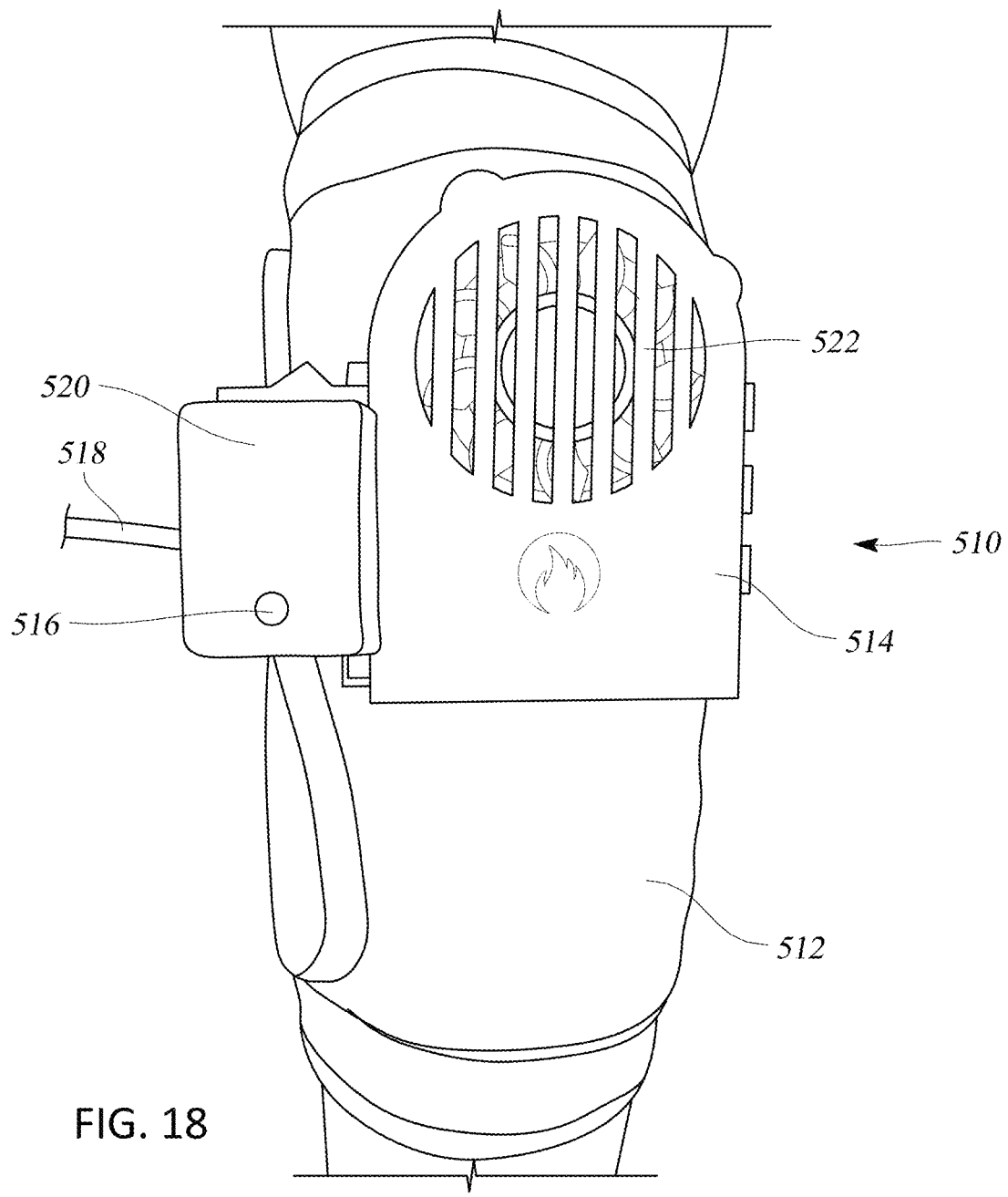
FIG. 18 is a front view of a temperature regulating pad wrap made in accordance with the present invention.

Referring now to the drawings of the thermal pad wrap in detail, FIG. 18 is a front elevational view of a temperature regulated pad wrap in use for an elbow, generally indicated by the numeral 510, a power cord for connecting the battery pack cover 520 and a fan cover 522. This particular aspect fits over an elbow and may be therapeutically for medical purposes as well as for warmth or cooling.

Figure 19:
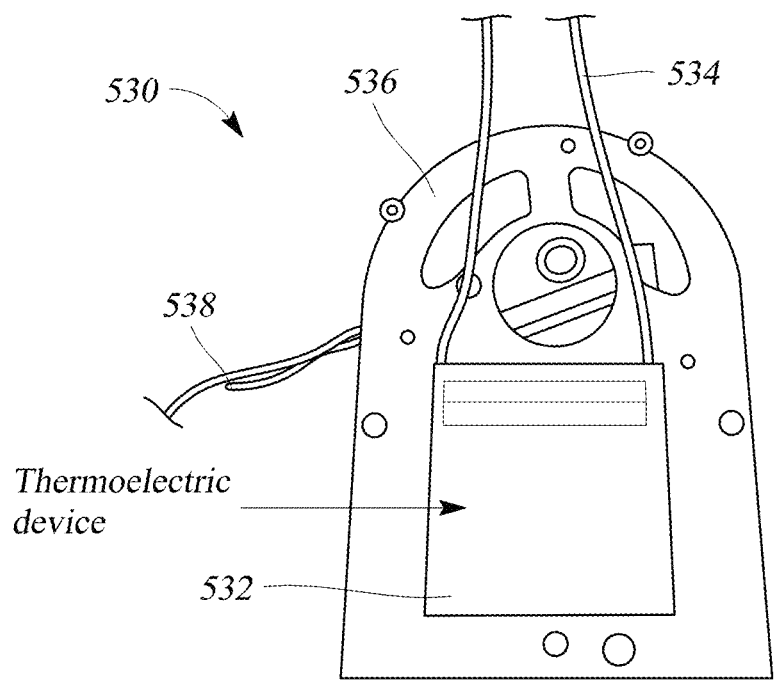
FIG. 19 illustrates a rear view of a heat sink, fan and thermoelectric device assembly.

FIG. 19 is a backside view of a heat sink, fan and thermoelectric device assembly made in accordance with the present invention. It is generally denoted by 530, and includes a thermoelectric device 532, thermoelectric device wires 534 attached to a fan assembly 536. A fan power cord 538 extends outwardly therefrom. A thermoelectric device 532 is attached to the fan assembly 536, helping the operation of the thermoelectric device 532.

Figure 20:
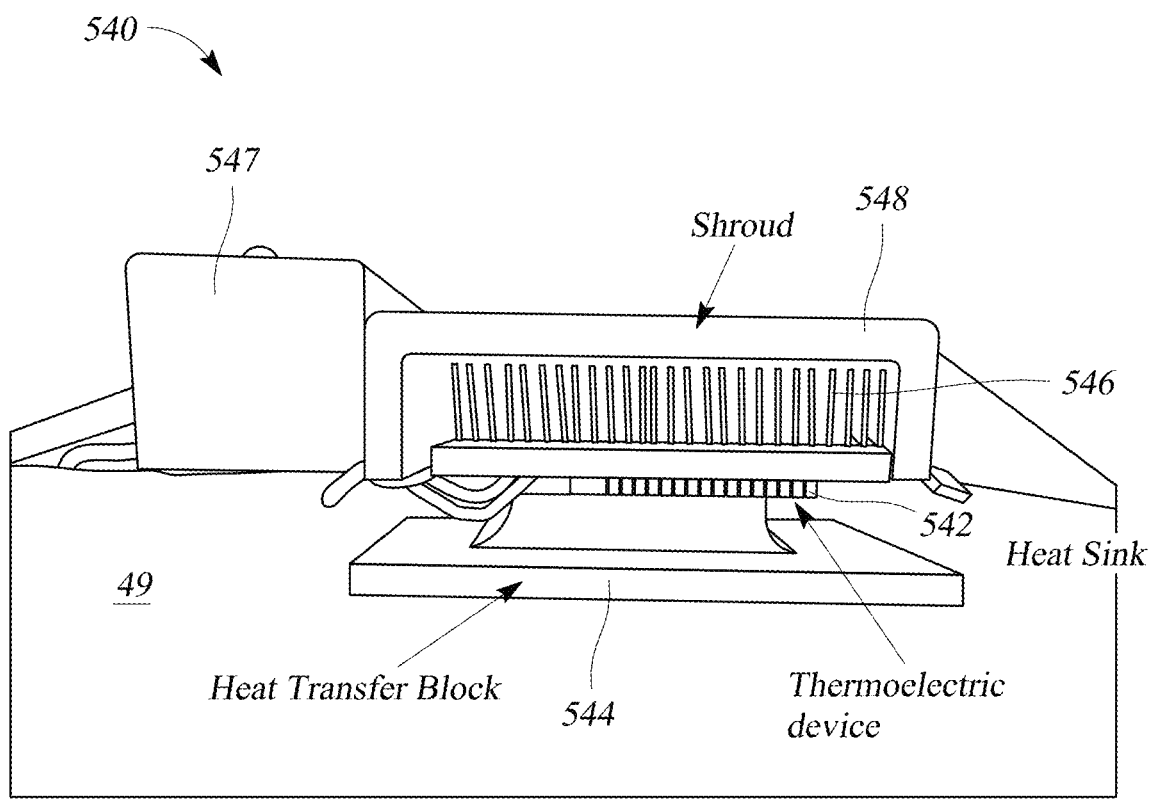
FIG. 20 is a side elevational view of the present invention.

FIG. 20 is a side elevational view of a heat sink, fan and thermoelectric device assembly generally denoted by 540, including a thermoelectric device 542, a heat transfer block 544, a heat sink 546, a battery pack 547, a shroud 548 and a heat dissipative sheeted material 549.

Figure 21:
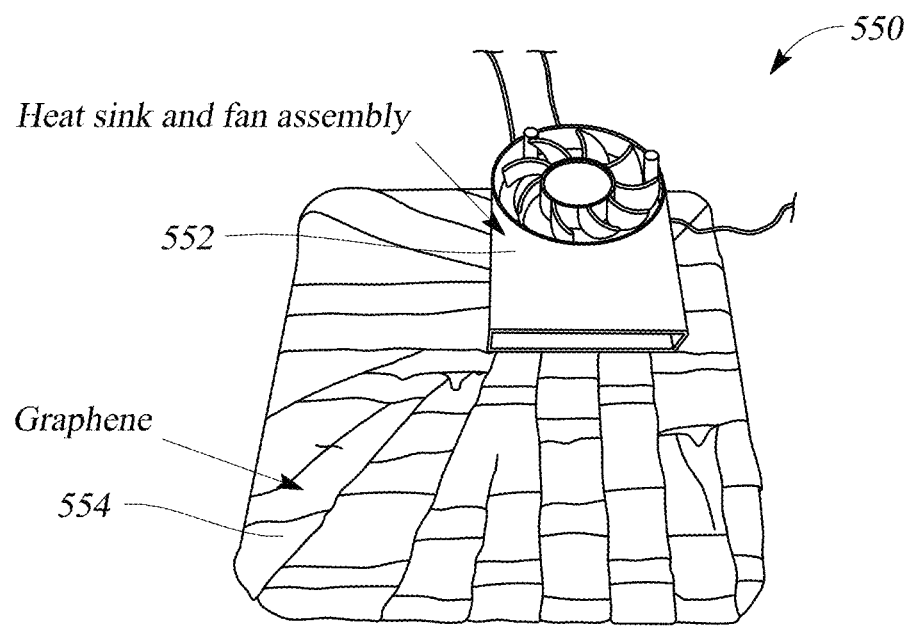
FIG. 21 is a front view of a graphene fabric, heat sink and fan assembly.

FIG. 21 is at illustration of a heat sink, fan and thermoelectric device assembly generally denoted by 550, including a heat sink and fan 552 attached thermally in communication with a sheet of heat dissipative material, such as graphene.

Figure 22:
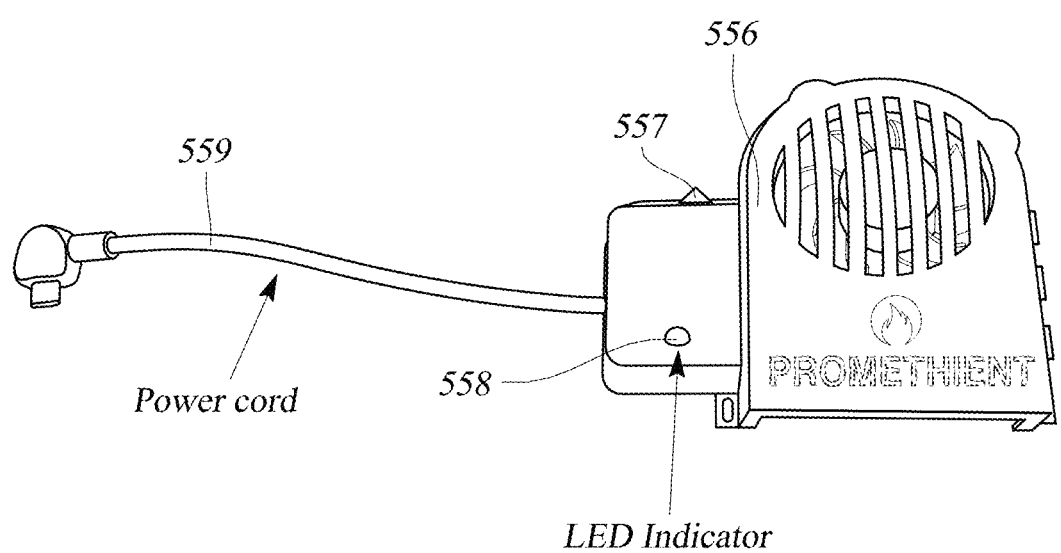
FIG. 22 is a top elevational view of a heat sink, fan and thermoelectric device assembly.

FIG. 22 is at illustration of a heat sink, fan and thermoelectric device assembly 556, including a shroud 556, a polarity switch 557, an LED indicator 558 and a power cord 559.

Figure 23:
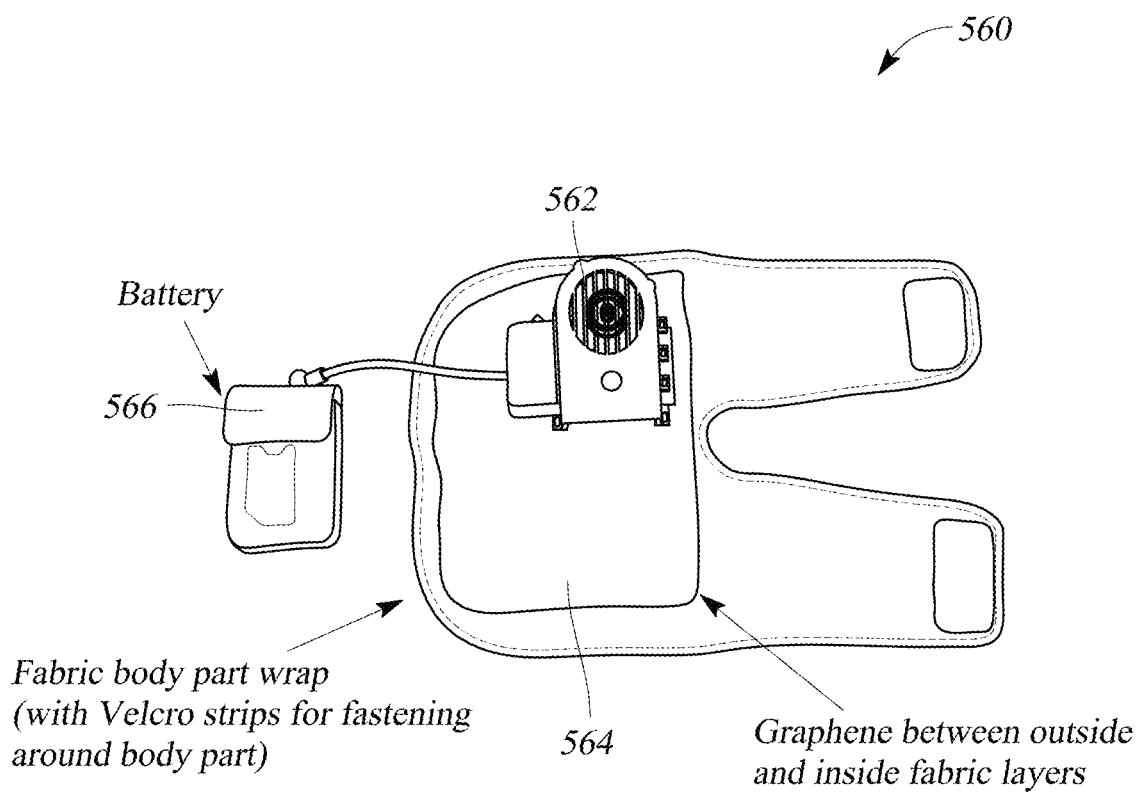
FIG. 23 is a top elevational view of a fabric body part wrap, heat sink, fan and thermoelectric device assembly and battery.

FIG. 23 is a thermal temperature regulated pad and wrap generally denoted by numeral 560 for an elbow and includes a heat sink, fan and thermoelectric device assembly 562 attached to a fabric body part wrap 564 powered by a battery 566.

Figure 24A:
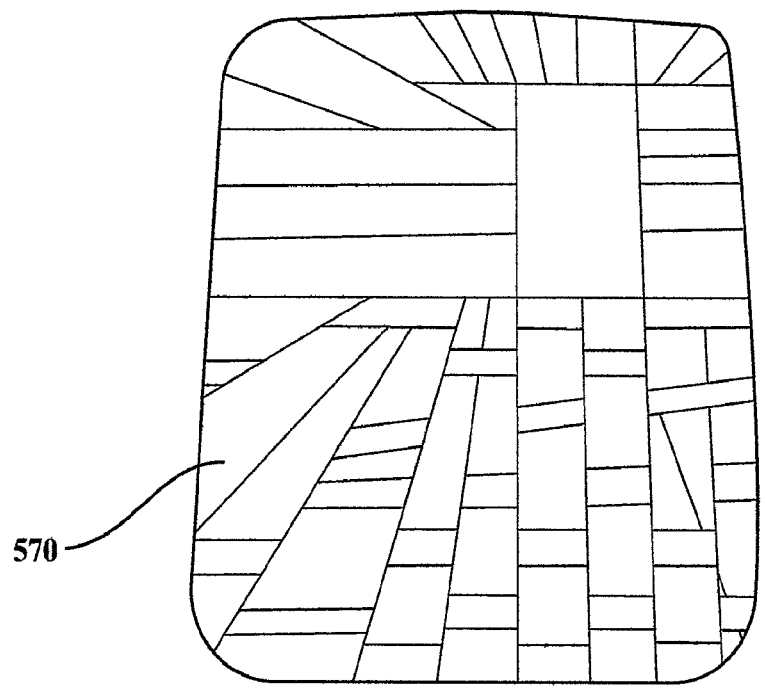
FIGS. 24A and 24B are a top elevational view of a fabric woven of graphene.
Figure 24B:
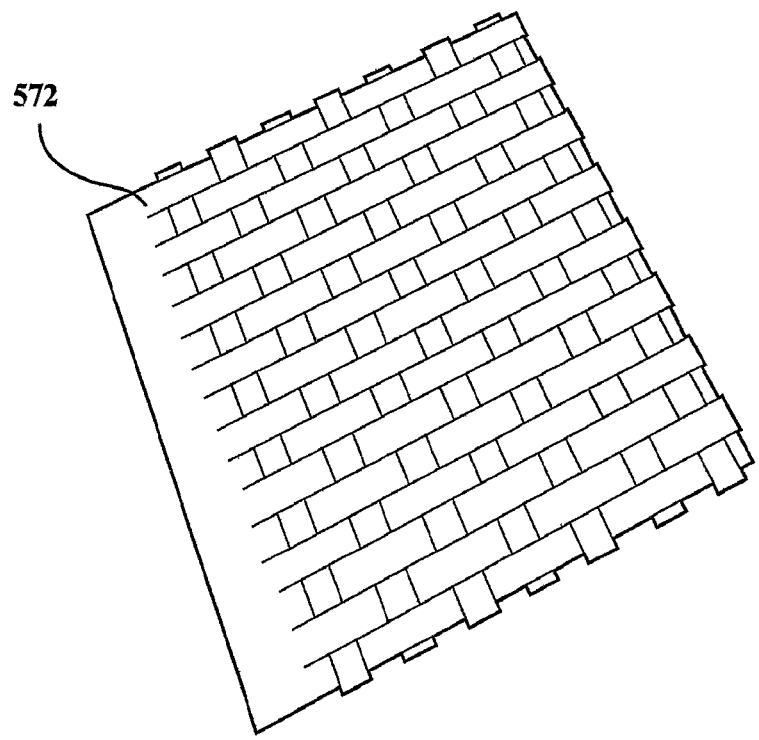

FIGS. 24A and 24B shows a woven graphene pad having strips 570 of graphene sheeted material interwoven in a configuration that is suitable for use to conform around a body part.

FIG. 24B shows yet another aspect of the woven graphene sheet 572.

Figure 25:
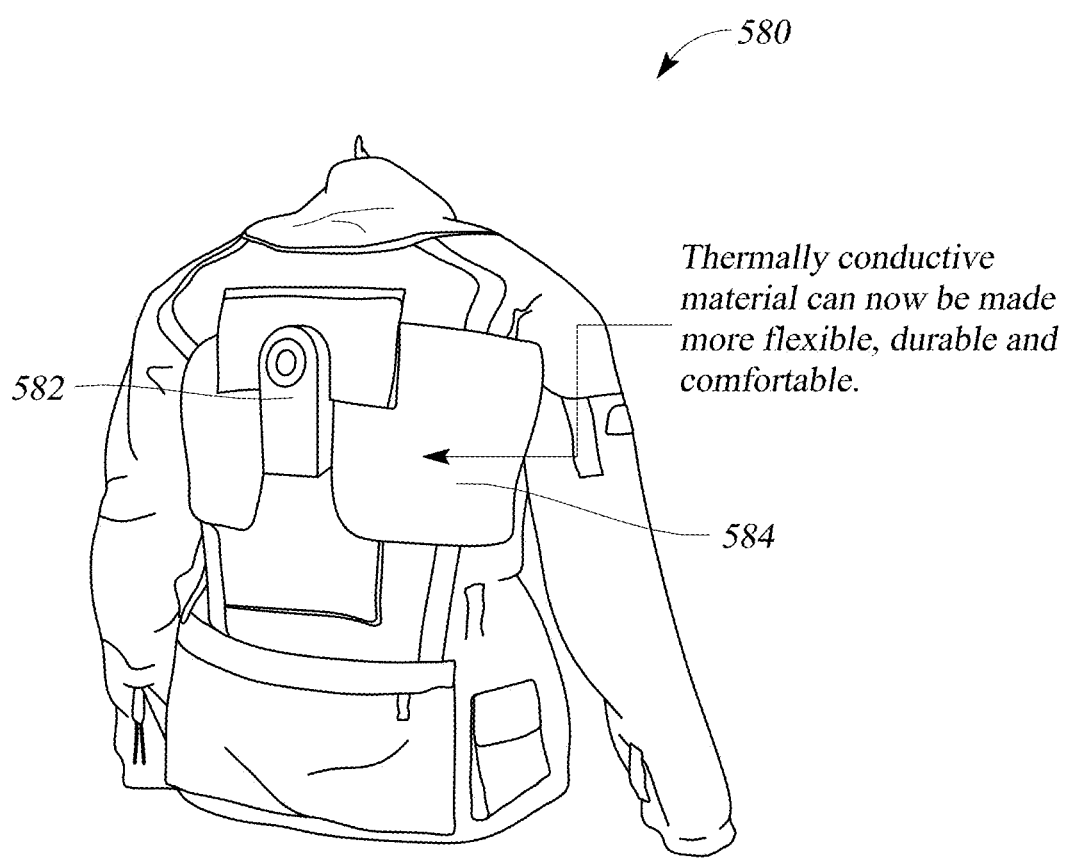
FIG. 25 is a view of a garment incorporation the present invention.

FIG. 25 shows the heated garment generally denoted by 580 including the heat sink and fan assembly 582 attached to graphene sheeted material 584.

Other aspects of the present invention include the use of varying heating and cooling sources, such as sodium acetate trihydrate or sometimes commonly called simply sodium acetate, which when activated, exothermically crystallizes from a supersaturated state which gives off heat at a reaction temperature of 54° C. Instead of requiring the exothermic material to cover the body part to transfer heat, a small contained amount of this or another such phase change material is thermally in contact with the graphene material, flexibly transferring heat to a body part allowing the heat to be transferred more comfortably and conformally than the solidifying sodium acetate trihydrate.

Any other suitable source of heat and /or coolness can be in thermal communication with the heat dissipative sheeted material of the present invention to provide comfort to a person wearing this device.

An additional aspect of this invention is a phase change material in thermal communication with a graphene heat spreading sheet. In a thermal wrap, the concept of a phase change material that is endothermic, such as hydrated potassium bicarbonate in a plastic pouch or other like phase change materials can be thermally attached to graphene material. When changing phase, this material takes in heat and cools. Therefore, this material when thermally attached to graphene, allows for flexible and comformal heat transfer to the body in a therapy wrap or garment.

Method of Making and Using

Making Graphene Flexible

Graphene sheet material can be made considerably more flexible by cutting the graphene into strips and creating a woven format. To bind the matrix together, for this prototype, a very low viscosity silicone conformal coating was used (Dow Corning 3-1953, commercially available from Dow Corning Corporation of Midland Mich. USA). This binds the individual strips together and provides a bonded thermal interface at the contact points of the overlapping strips. In addition, it provides a waterproof seal for the entire mat. This woven material can be made in almost any shape. This work was carried out to help make the heated and cooled garments noted in the patent application more flexible, durable and comfortable. It can also be used in seating applications and many of the applications presented in the patent application.

Liquid Heat Transfer Aspect

In the course of working on cooled/heated garments using the technology that is described hereinabove with reference to the medical therapy pad/garment, new technology was developed. In essence, the final heat sinking is separated from the thermoelectric module by using a liquid system to move heat from (or to) one side of the thermoelectric module and exiting (or entering) heat via a liquid heat transfer block that is attached to an air fan & heatsink unit. The use of graphene, either in sheet form, woven or reinforced is similar to what was taught in the seating and therapy pad/garment aspects above.

Figure 26:
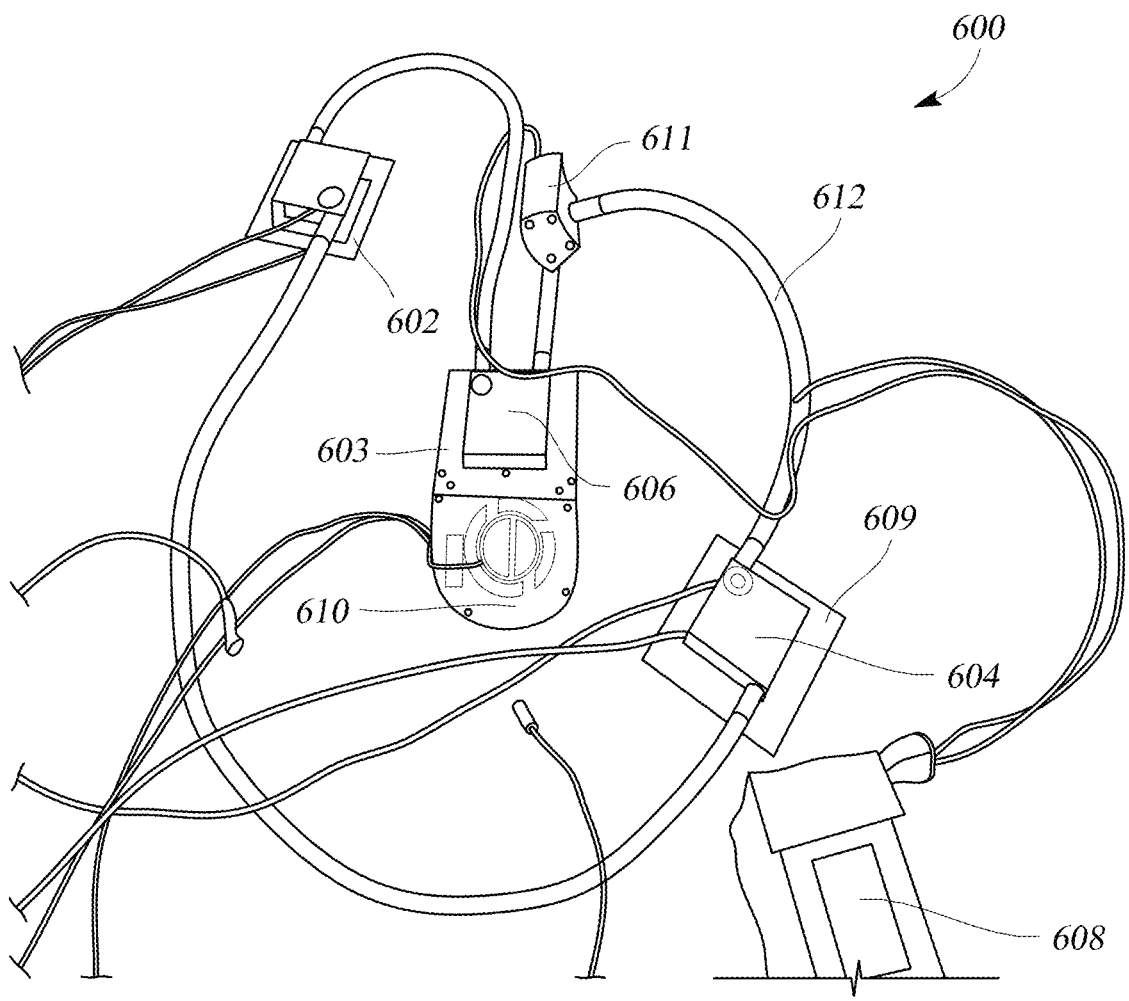
FIG. 26 is a view of some of the components for a heat/cool system with liquids on a bench top for testing made in accordance with the present invention.

Referring now to the drawings in detail, although any number of thermoelectric modules may be used, FIG. 26 shows a thermoelectric device system, generally denoted by the numeral 600, including a first and second two (2) thermoelectric module, respectively 602 and 604, system, with a single heat sink 606. DC power is provided to the thermoelectric devices by power pack 6608, as shown in subsequent assemblies.

In cooling mode, heat is pumped out of a heat transfer plate 610 by the thermoelectric devices 602 and 604 of the thermoelectric module. In turn, heat is pumped out of the graphene (not shown in this image), which in turn, pumps heat out of whatever is in contact with it, such as a person. The heat that is pumped is transferred to the liquid heat sink. Liquid 612, preferably a stable heat transfer fluid such as a water/glycol solution, is circulated through the liquid heat sink via the pump. This heated fluid passes through the liquid heat sink that is thermally bonded to the heat sink/fan assembly where the heat is exhausted to the environment.

In heating mode, the thermoelectric device module 600 operates with the polarity of the DC power reversed. The pump and heat transfer works in the same manner as in the cooling mode, except that the thermoelectric device pumps heat out of the fluid and into the object being heated. The cooled fluid, where the heat was taken out of it by the thermoelectric module, flows from the liquid heat sink attached to the thermoelectric module to the liquid heat sink that is attached to the fan/heat sink assembly, where heat is put back into the system via heat extracted from the fan forced air by the air heat sink.

A different methodology successfully tested was to not run the pump+fan/heat sink assembly and allow the thermoelectric module to pump heat out of the fluid in the fluid heat sink and create heat also via resistance heating. In that in the heating mode, the thermoelectric module also creates heat via resistance heating which is a factor of the resistance of the thermoelectric module.

It should be noted that the thermoelectric modules are employed in different ways to achieve different goals. For example, in the two thermoelectric module arrangement shown in FIG. 26, the thermoelectric modules can be arranged to promote benefits that effect the heat pumping capability of the system. In this arrangement, the maximum temperatures attained come from the amount of power required to run the system. When the thermoelectric modules in FIG. 26 are wired in parallel, which in this case, supplies approximately 12 VDC per thermoelectric module, each thermoelectric module takes approximately 3 Amps of current.

When the same modules are wired in series, each thermoelectric module sees approximately 6 VDC and takes approximately 1 Amp of current. If there is ample electrical energy available and a properly sized fan/heat sink assembly to expel the heat from the system, and a high level of cooling or heating is required, then running the system in parallel is chosen.

If however, such as in a garment based system that may employ a small battery or have other such power limitations, and where one desires to limit the size of the fan/heat sink to minimize size for ease of packaging into a garment or seat or whatever, wiring the thermoelectric modules is the choice.

The coefficient of performance (COP) of thermoelectric modules improves significantly as voltage that the thermoelectric module sees falls below the voltage maximum of the thermoelectric module. With the maximum voltage (Vmax) at approximately 16 VDC for a nominal 12 VDC thermoelectric module, when reducing the voltage to 6 VDC, the coefficient of performance (COP) is significantly improved. We employ a strategy that greatly improves the coefficient of performance (COP) in low power requirement applications. When the coefficient of performance (COP) of the system improves, this means that more heat can be pumped more efficiently. In garments as in other applications where package size is desired to be minimized, because the heat pumping is more efficient, the fan/heat sink system can be much smaller.

Figure 27:
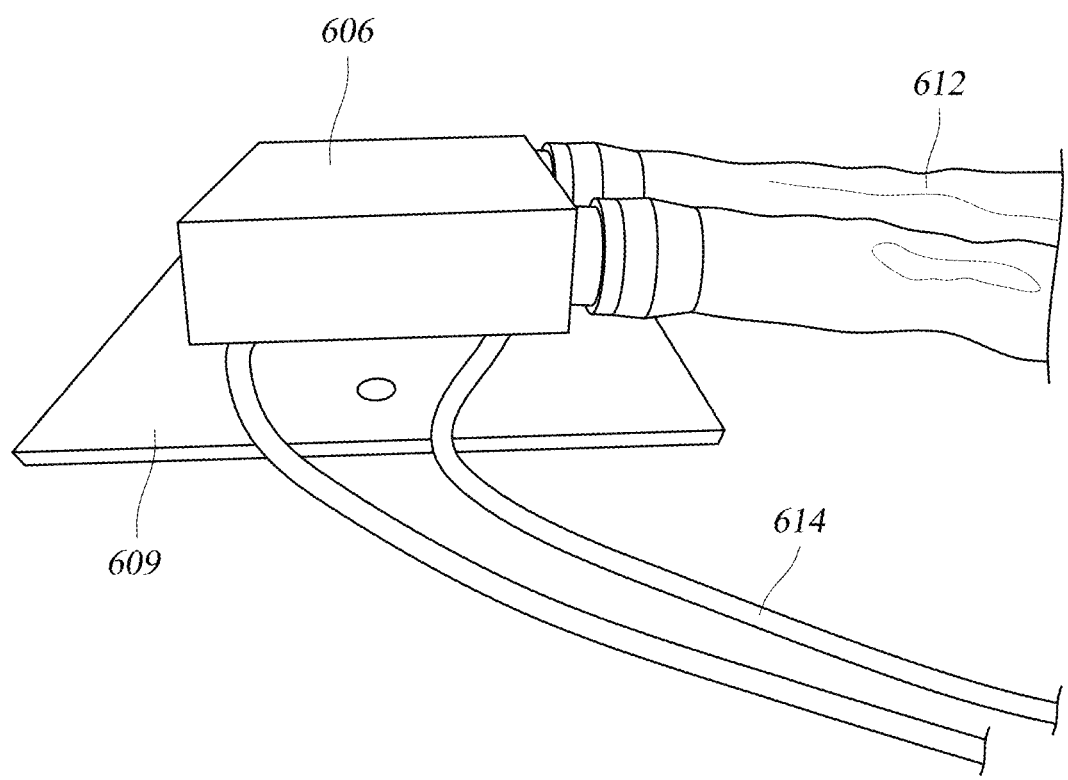
FIG. 27 illustrates/shows/diagrammatically details a liquid pump.

FIG. 27 shows more detail regarding component assembly as described above with reference to FIG. 26, showing the liquid-containing tubing 612 being connected to a pump 608. Power is brought to the pump by wires 614.

Figure 28:
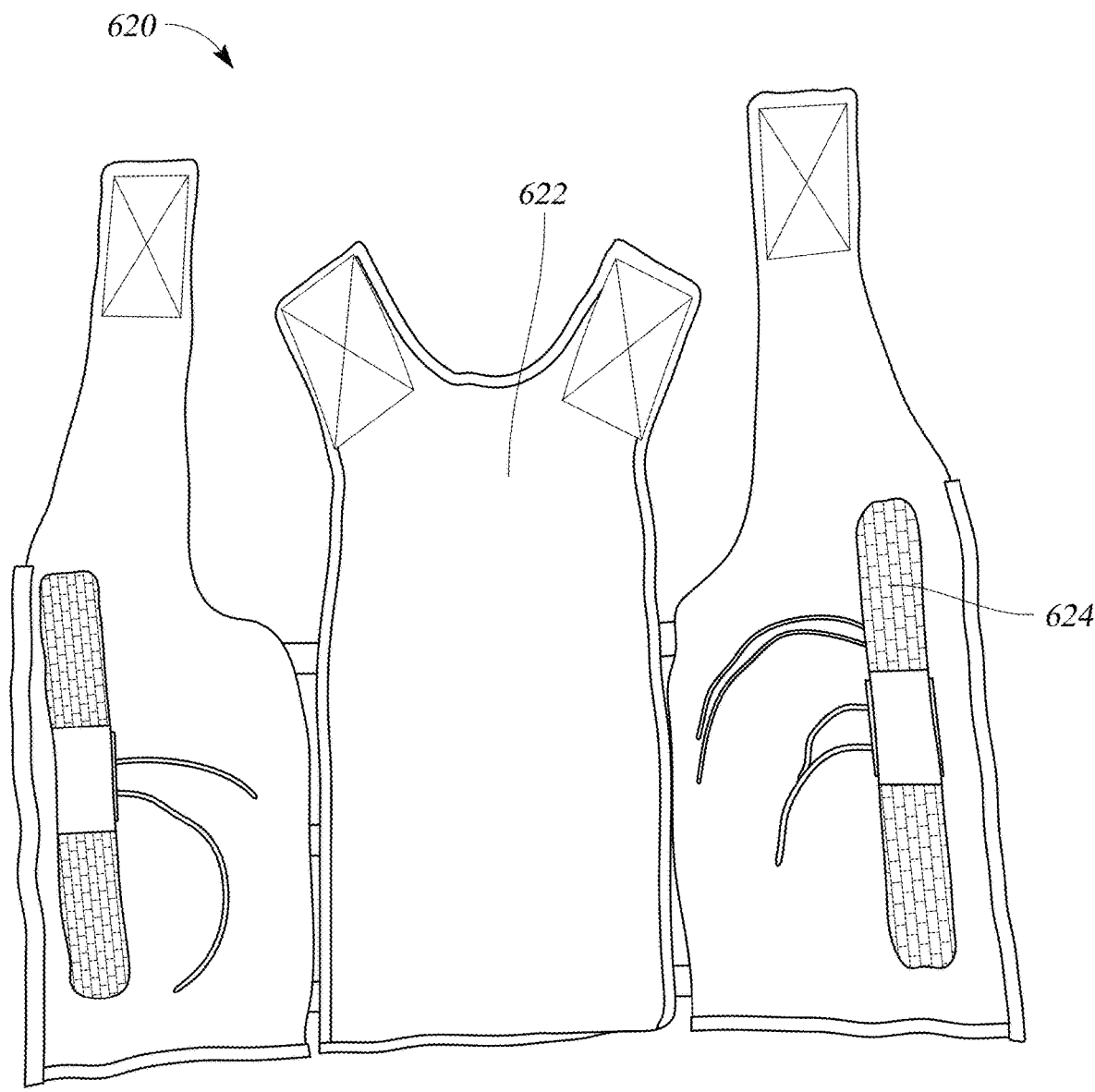
FIG. 28 is a perspective view of a vest aspect of the present invention.

FIG. 28 shows the assembly of FIG. 27 prior to insertion into the cooled/heated garment. The assembly is placed in the garment, generally denoted by the numeral 620, with graphene material strips 624 under an inner liner fabric 622, which in turn, is in contact with the body when worn. It has also been prototyped with an air bladder (not shown) that can be inflated. The air bladder is placed within the garment fabric layers behind the graphene 624 so that pressure is exerted on the graphene strips, forcing the graphene backed fabric in intimate contact with the body. This aids in heat transfer to and from the body. In some medical applications, an added benefit is compression of the body by the garment.

Figure 29:
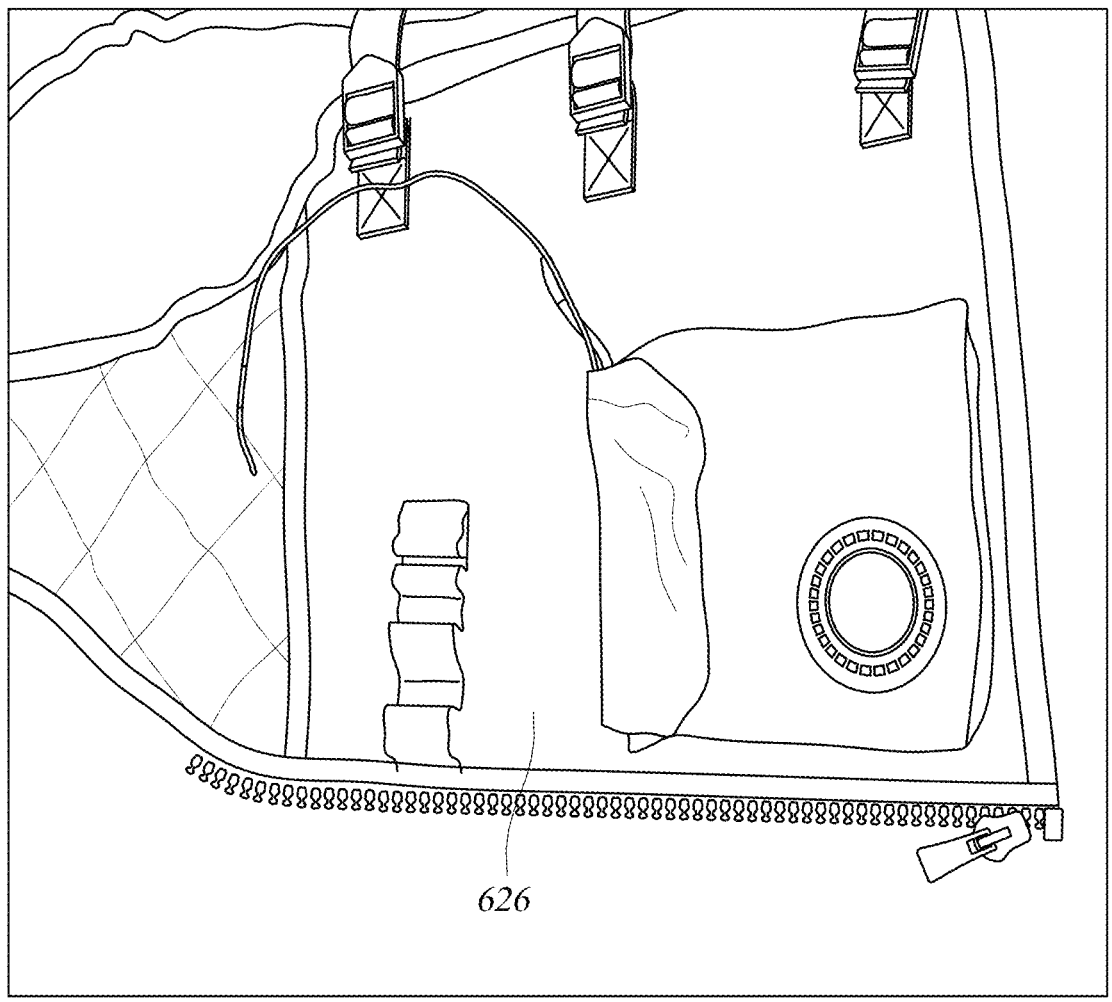
FIG. 29 shows details of installed thermoelectric device.

FIG. 29 shows the assembly of FIG. 26 installed into a cooled/heated garment 626. The same type of system can also be used in many other applications. One example would be in seating.

Figure 30:
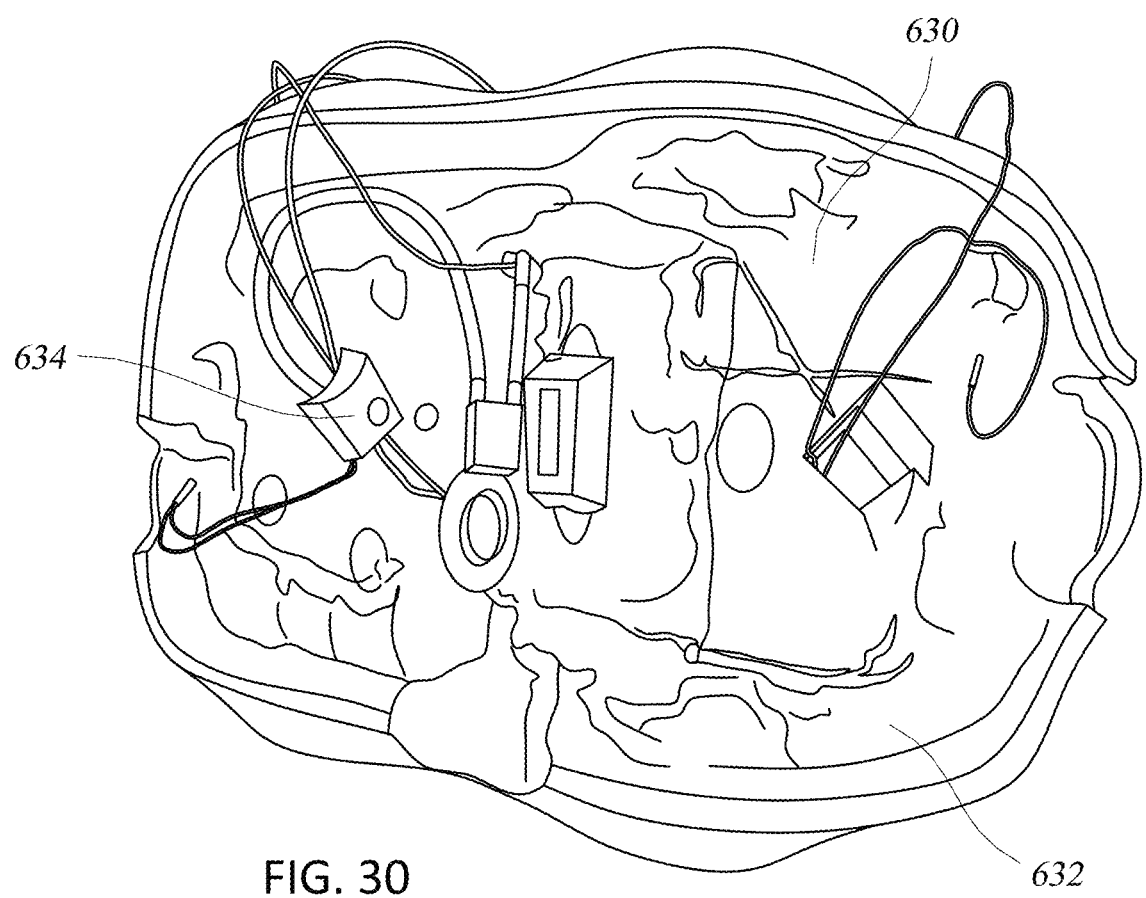
FIG. 30 is the underside of a motorcycle seat with installed unit.

FIG. 30 shows the underside of a motor cycle seat 630 with the heating and cooling system 634 installed. Many of the liquid fluid tubes are not visible because they are resident embedded and within seat foam 632. The graphene is on the human body contact side of the seat, on the other side of the seat.

Figure 31:
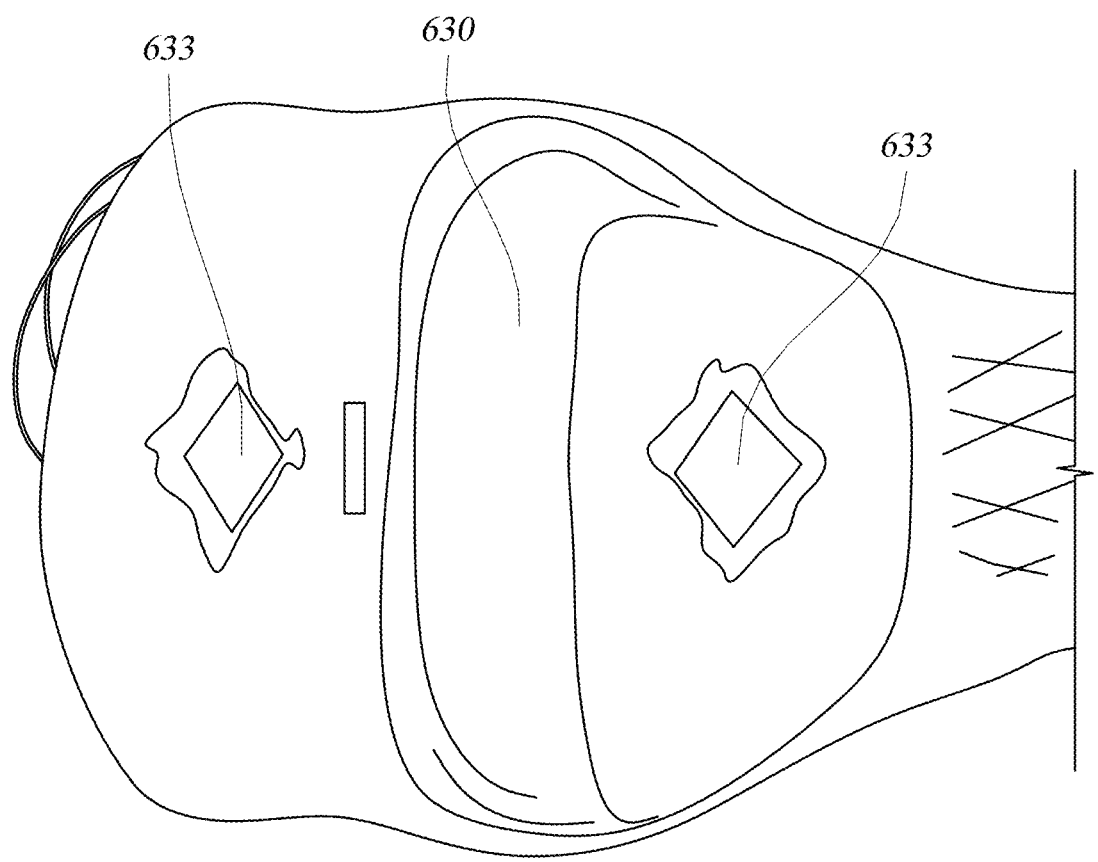
FIG. 31 is a top plan view of motorcycle seat without graphene on it yet.

FIG. 31 shows the top side of the motorcycle seat 630 just prior to attachment of the graphene onto at least one heat transfer plate 632 for thermal communication between the parts. In this particular case, the attachment is made with a thermally conductive contact adhesive, although other suitable attachment means can be used.

Figure 32:
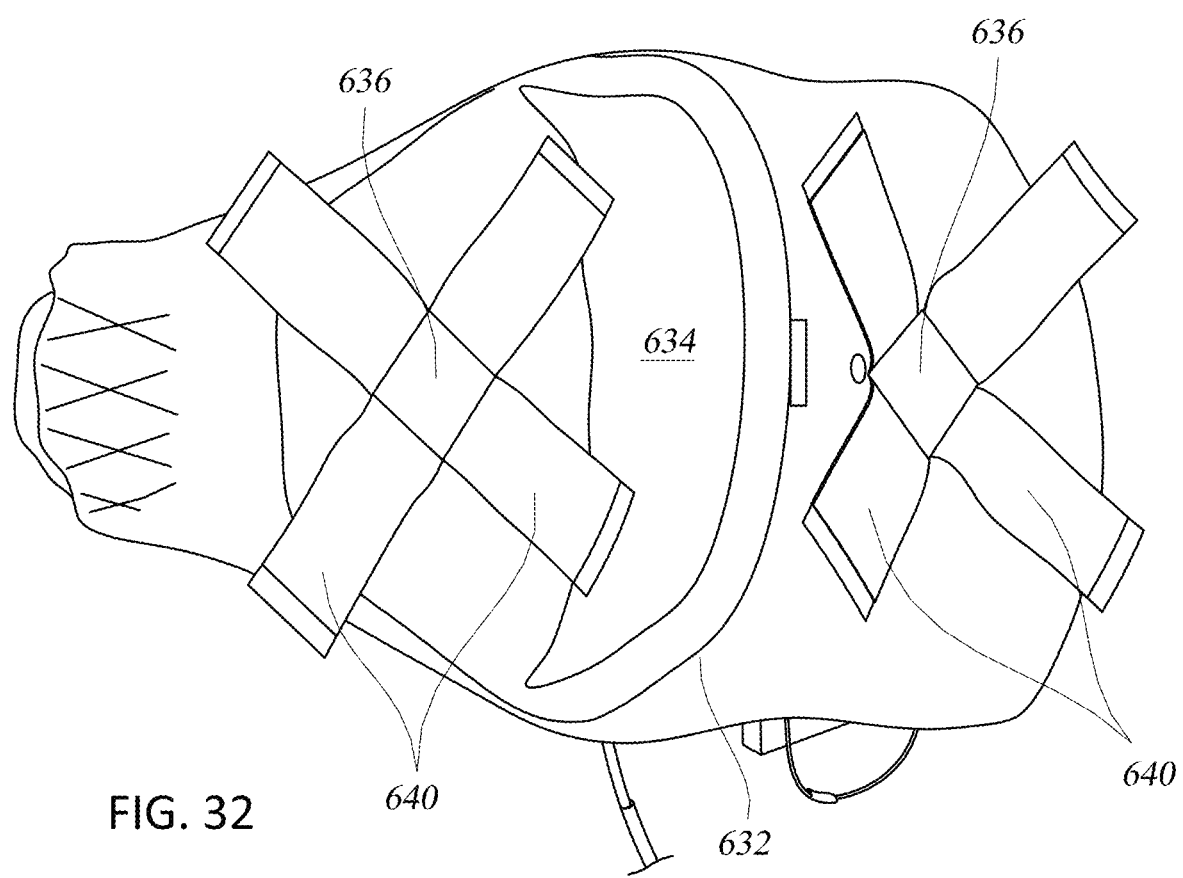
FIG. 32 is a top view of seat with graphene attached to heat transfer plate.

FIG. 32 again shows motorcycle seat 634 with graphene strips 640 attached to the heat transfer plates 636. A seat cover (not shown) will eventually cover this side of motorcycle seat 634. Between the seat cover and the graphene strips 640 and seat foam 638, there may be a thin layer of scrim, such as foam, non-woven polyester mat, or any other suitable material, providing lubricity between the seat cover and the graphene strips 640 and motorcycle seat foam 638, as well as helping to hide any features that could show through to the seat cover, such as leather, vinyl or any other type of seat cover.

In essence, the final heat sinking from the thermoelectric module was separated by using a liquid system to move heat from (or to) one side of the thermoelectric module and exiting (or entering) heat via a liquid heat transfer block that is attached to an air fan & heatsink unit. The use of graphene, either in sheet form, woven or reinforced is similar to what was taught in the parent seating and therapy pad/garment patent application.

FIG. 33A and FIG. 33B show yet another aspect of the disclosed invention with a similar use of graphene strips for thermal distribution with a thermoelectric module 650 and liquid system 652 that places the thermoelectric module in thermal contact with a fan/heat sink 654. In this aspect, the thermoelectric device 650 is no longer a part of the graphene/heat transfer plate assembly. The thermoelectric device 650 cools or heats a liquid through liquid tubes 652 through a liquid heat exchanger (not shown) that is in thermal contact with the thermoelectric module 650, that is then circulated by a pump to the liquid heat exchangers that are thermally connected to heat transfer plates and graphene strips shown in FIG. 32. The body of the wearer is cooled or heated by the graphene strips that are distributing the thermal energy either from or to the body depending on if the liquid in the system is being cooled or heated. Like the previously described system, this can be used in many applications such as cooled/heated garments, therapy pads, seating, etc.

Referring still to FIGS. 33A and 33B, this aspect of the present invention is shown in prototype form. The pre-assembly of FIG. 33A shows the thermoelectric module 650 being thermally attached, especially by using a thermally conductive contact adhesive, to the liquid heat sink 654. The post-assembly of FIG. 33B now shows the assembly of FIG. 33A with a fan and heat sink 654. Depending on the polarity of the DC power supplied to the thermoelectric module, the thermoelectric module 650 is either pumping heat from the liquid heat sink in cooling mode, or pumping heat into the liquid heat sink in a heating mode. Heat is either expelled from the system or brought into the system by use of the fan and heat sink 654 that is thermally in communication with the thermoelectric module 650. The cooled or heated fluid 652 is pumped to a liquid heat sink 654 that is connected to a graphene strip or sheet. The graphene transfers heat to or from the body and is in thermal communication with the liquid heat sink 654 that is being supplied either cooled or heated fluid by the thermoelectric assembly of FIG. 33B.

It should be noted that in this system, like the previously described systems, a thermoelectric module arrangement is used that can provide a higher coefficient of performance (COP) which allows for a smaller heat sink and fan assembly that facilitates packaging into small areas and also can reduce the cost of the system. If the system is operating more efficiently, the heat sink resistance can be higher, which is less thermally efficient. This means the heat sink and fan can be smaller and the fan may be able to run at a lower speed, positively impacting the noise the fan produces.

In the previously described system, as an example of this manipulation of the thermoelectric modules to attain higher coefficient of performance (COP), two nominal 12 VDC modules were used that can operate each at approximately 6 VDC. In this aspect, two modules could also be used, although using a single module with a high thermoelectric couple count has the same effect. In normal nominal 12 VDC modules, the couple count is preferably 127. This means that there are 127 couples of one p-type and one n-type element (pellets). Using a 254 couple single thermoelectric module achieves the same results as using two 127 couple TE devices.

Depending on the requirements of the system, for a nominal 12 VDC system, as is seen in most automobiles and other devices, any couple count that is higher than the normal 127 couple thermoelectric modules, is believed to improve the coefficient of performance (COP). Therefore, the couple count can vary from application to application. Another variation includes systems that are powered by lower or higher voltage DC systems. In a 6 VDC system, the number of couples to raise the coefficient of performance (COP) would be less than a 12 VDC system. In a 24 VDC system, the couple count would have to be higher than 254 couples.

In summary, numerous benefits have been described which result from employing any or all of the concepts and the features of the various specific aspects of the present invention, or those that are within the scope of the invention.

The foregoing description of a preferred aspect of the invention has been presented for purposes of illustration and description. It is not intended to be exhaustive or to limit the invention to the precise form disclosed. Obvious modifications or variations are possible in light of the above teachings with regards to the specific aspects. The aspect was chosen and described in order to best illustrate the principles of the invention and its practical applications to thereby enable one of ordinary skill in the art to best utilize the invention in various aspects and with various modifications as are suited to the particular use contemplated. It is intended that the scope of the invention be defined by the claims which are appended hereto.

What is claimed is:

1. A heating and cooling system having a sheeted thermally conductive material for distributing heat or coolness in a seat, the system comprising:
    a low voltage heating and cooling source for generating heat or coolness;
    a flexible sheeted thermally conductive material in thermal communication with the heating and cooling source, the flexible sheeted thermally conductive material configured to distribute heat or coolness generated by the low voltage heating and cooling source over a distribution area across a surface of the seat larger than a surface of the heating and cooling source itself; and
    a fan configured to move air through one or more perforations in the surface of the seat toward an occupant of the seat.

2. The system of claim 1, wherein the flexible sheeted thermally conductive material comprises graphene.

3. The system of claim 1, wherein the flexible sheeted thermally conductive material comprises strips of material.

4. The system of claim 1, wherein the flexible sheeted thermally conductive material comprises one or more perforations, and wherein the fan is configured to move air through the one or more perforations in the flexible sheeted thermally conductive material.

5. The system of claim 4, wherein the fan is configured to move air through one or more passages in the seat to move air through the one or more perforations in the surface of the seat and the one or more perforations in the flexible sheeted thermally conductive material.

6. The system of claim 1, wherein the low voltage heating and cooling source is in thermal communication with a heat sink, and wherein the fan is configured to move air through the heat sink.

7. The system of claim 6, wherein the fan is configured to move air through the heat sink and away from the surface of the seat via one or more air chambers in the seat.

8. The system of claim 7, wherein the one or more air chambers are formed in foam of the seat.

9. The system of claim 7, wherein the fan is configured to move air through a splitting chamber configured to direct air through the one or more perforations in the seat and through the one or more air chambers in the seat.

10. The system of claim 1, wherein the fan is configured to move air through the one or more perforations in the seat such that the moved air exchanges heat with a phase change material located in the seat, the phase change material configured to store or release heat.

11. The system of claim 1, wherein the low voltage heating and cooling source comprises a thermoelectric device.

12. The system of claim 1, wherein the low voltage heating and cooling source operates from 10 to 16 VDC.

13. The system of claim 1, wherein the low voltage heating and cooling source is in thermal communication with the flexible sheeted thermally conductive material via a heat transfer block configured to distribute heat or coolness generated by the low voltage heating and cooling source.

14. The system of claim 1, wherein the low voltage heating and cooling source is in thermal communication with the flexible sheeted thermally conductive material via a thermal interface.

15. A heating and cooling system having a sheeted thermally conductive material for distributing heat or coolness in a seat, the system comprising:
    a heating and cooling source for generating heat or coolness;
    a flexible sheeted thermally conductive material in thermal communication with the heating and cooling source, the flexible sheeted thermally conductive material configured to distribute heat or coolness generated by the heating and cooling source over a distribution area across a surface of the seat larger than a surface of the heating and cooling source itself; and
    a fan configured to move air through the surface of the seat toward an occupant of the seat.

16. The system of claim 15, wherein the flexible sheeted thermally conductive material comprises graphene.

17. The system of claim 15, wherein the flexible sheeted thermally conductive material comprises strips of material.

18. The system of claim 17, wherein the strips of material are woven and coated with silicone.

19. The system of claim 15, wherein the flexible sheeted thermally conductive material comprises one or more perforations, and wherein the fan is configured to move air through the one or more perforations in the flexible sheeted thermally conductive material.

20. The system of claim 15, wherein the heating and cooling source is in thermal communication with a heat sink.

21. The system of claim 20, wherein heat sink is configured to transfer liquid through the heat sink to move heat to or from the heating and cooling source.

22. The system of claim 15, wherein the heating and cooling source comprises a thermoelectric device.

23. The system of claim 22, wherein the thermoelectric device is configured to produce electrical energy via the Seebeck effect with a temperature difference between two planar sides of the thermoelectric device, wherein a temperature sensor is configured to be powered by utilizing electrical energy produced via the Seebeck effect, wherein temperature information from the temperature sensor is used for controlling the temperature of the surface of the seat and for turning on or off or modulating the heat supplied to or the heat removed from the surface of the seat.

24. The system of claim 15, wherein the heating and cooling source comprises a plurality of thermoelectric modules, the plurality of thermoelectric modules wired in parallel or series.

25. The system of claim 15, wherein the heating and cooling source is in thermal communication with the flexible sheeted thermally conductive material via a heat transfer block configured to distribute heat or coolness generated by the heating and cooling source.

* * * * *

UNITED STATES PATENT AND TRADEMARK OFFICE
CERTIFICATE OF CORRECTION

| | |
|---|---|
| PATENT NO. | : 11,639,816 B2 |
| APPLICATION NO. | : 16/495792 |
| DATED | : May 2, 2023 |
| INVENTOR(S) | : Charles J. Cauchy |

It is certified that error appears in the above-identified patent and that said Letters Patent is hereby corrected as shown below:

On the Title Page

On Page 2, Column 1, Line 2, under Related U.S. Application Data, after "62/473,966," insert --filed on Mar. 20, 2017,--.

On Page 3, Column 2, Line 19, under item [56] U.S. Patent Documents, delete "Markus" and insert --Markus et al.--.

On Page 6, Column 2, Line 18, under item [56] U.S. Patent Documents, delete "Geisei et al." and insert --Geisel et al.--.

In the Specification

In Column 1, Lines 12-13, delete "and claims priority with the benefit under 35 U.S.C. 119(e) of" and insert --, which claims priority to--.

In Column 1, Lines 14-18, delete "International PCT Application No.: PCT/US2015/060955, filed Nov. 16, 2015, U.S. Provisional Patent Application Ser. No.: 62/080,072, filed Nov. 14, 2014, U.S. Provisional Patent Application Ser. No.: 62/353,987, filed Jun. 23, 2016 and" and insert --and claims priority to--.

In Column 19, Line 37, delete "multi-layer ." and insert --multi-layer.--.

In Column 20, Line 31, delete "It" and insert --it--.

In Column 20, Line 49, delete "and or" and insert --and/or--.

In Column 22, Line 61, delete "FIG. 17 A" and insert --FIG. 17A--.

Figure 17C:
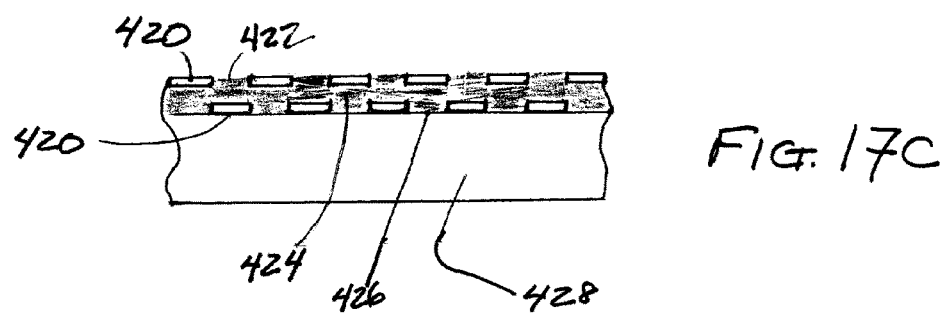

In Column 23, Line 11, delete "FIG. 17 C" and insert --FIG. 17C--.

Signed and Sealed this
Seventeenth Day of October, 2023

Katherine Kelly Vidal
*Director of the United States Patent and Trademark Office*

CERTIFICATE OF CORRECTION (continued)
U.S. Pat. No. 11,639,816 B2

Figure 17D:
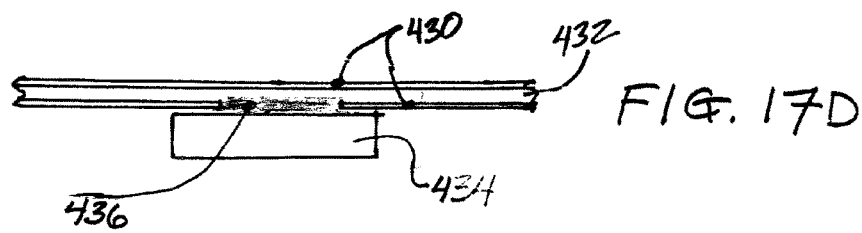

In Column 23, Line 24, delete "FIG. 17 D" and insert --FIG. 17D--.

Figure 17E:
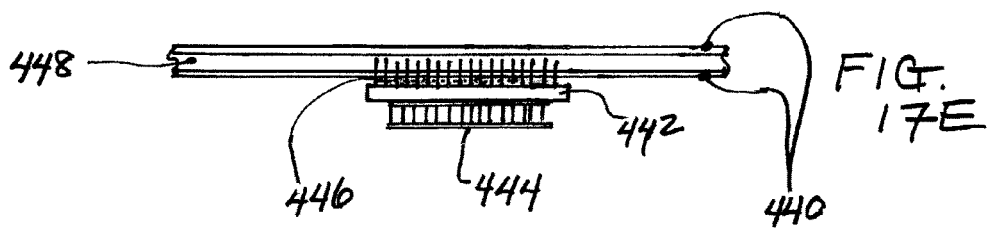

In Column 23, Line 30, delete "FIG. 17 E" and insert --FIG. 17E--.

In Column 23, Lines 32-33, delete "FIG. 17 E," and insert --FIG. 17E,--.

Figure 33:
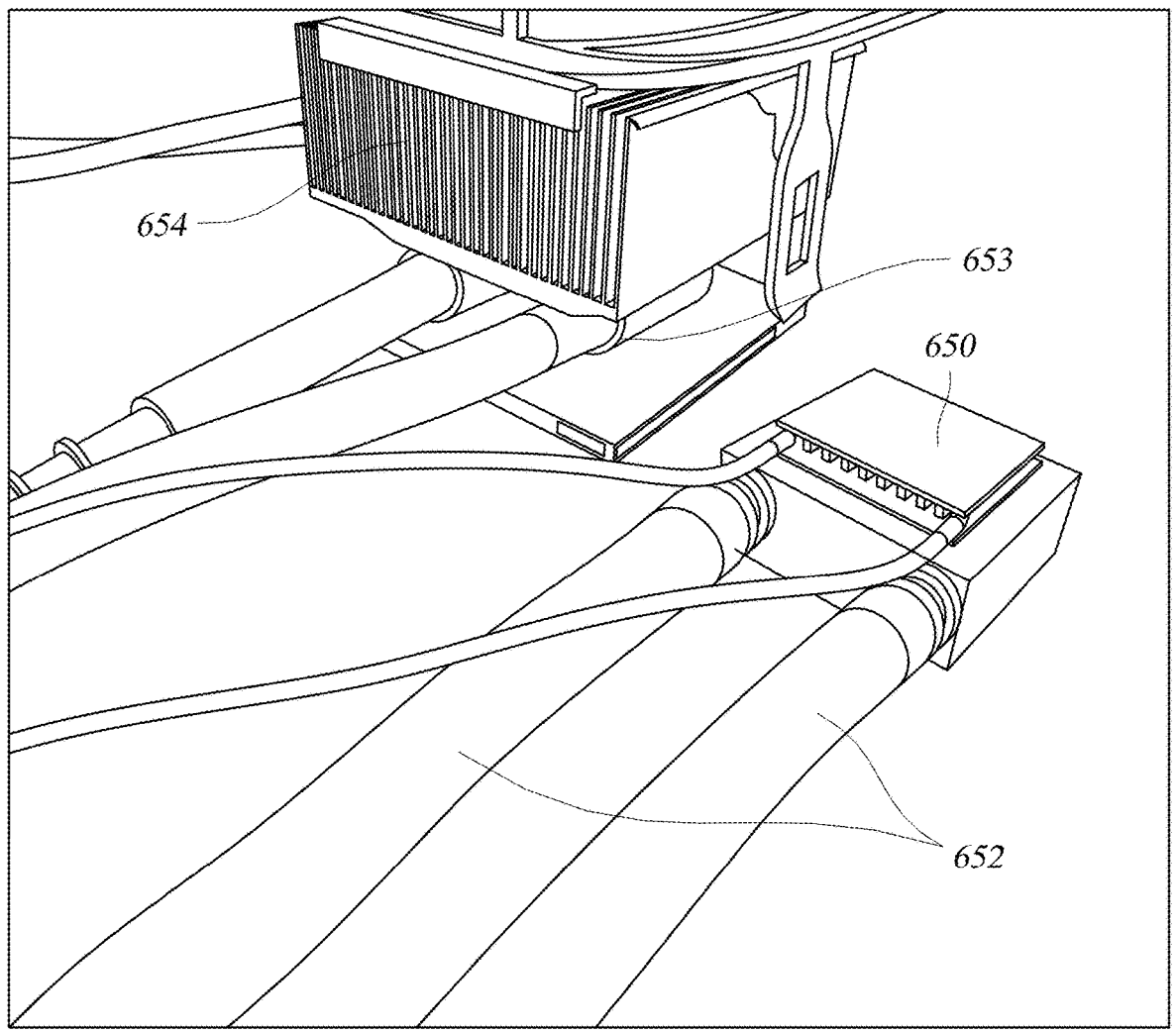
FIG. 33 shows another aspect of the present invention with a heat sink and a fan and a liquid system in contact with the thermoelectric device.

In Column 28, Line 22, delete "FIG. 33A and FIG. 33B" and insert --FIG. 33--.

In Column 28, Line 41, delete "FIGS. 33A and 33B," and insert --FIG. 33,--.

In Column 28, Line 43, delete "FIG. 33A" and insert --FIG. 33--.

In Column 28, Line 46, delete "FIG. 33B" and insert --FIG. 33--.

In Column 28, Lines 46-47, delete "FIG. 33A" and insert --FIG. 33--.

In Column 28, Line 59, delete "FIG. 33B." and insert --FIG. 33.--.